United States Patent
Tomishima et al.

[11] Patent Number: 5,838,627
[45] Date of Patent: *Nov. 17, 1998

[54] ARRANGEMENT OF POWER SUPPLY AND DATA INPUT/OUTPUT PADS IN SEMICONDUCTOR MEMORY DEVICE

[75] Inventors: Shigeki Tomishima; Mikio Asakura; Masaki Tsukude; Kazutami Arimoto, all of Hyogo, Japan

[73] Assignee: Mitsubishi Denki Kabushiki Kaisha, Tokyo, Japan

[*] Notice: The term of this patent shall not extend beyond the expiration date of Pat. No. 5,604,710.

[21] Appl. No.: 768,090

[22] Filed: Dec. 16, 1996

Related U.S. Application Data

[63] Continuation of Ser. No. 616,734, Mar. 15, 1996, Pat. No. 5,604,710, which is a continuation-in-part of Ser. No. 445,819, May 22, 1995, abandoned.

[30] Foreign Application Priority Data

| May 20, 1994 | [JP] | Japan | 6-106879 |
| Nov. 29, 1994 | [JP] | Japan | 6-294205 |
| May 10, 1995 | [JP] | Japan | 7-111866 |

[51] Int. Cl.$^6$ .............. G11C 8/00; G11C 7/00; G11C 5/02
[52] U.S. Cl. ............... 365/230.03; 365/230.08; 365/201; 365/226; 365/51
[58] Field of Search .......... 365/51, 63, 230.03, 365/230.08, 201, 226

[56] References Cited

U.S. PATENT DOCUMENTS

| 5,208,782 | 5/1993 | Sakuta et al. | 365/230.03 |
| 5,321,646 | 6/1994 | Tomishima et al. | 365/51 |
| 5,390,140 | 2/1995 | Tomishima et al. | 365/51 |
| 5,412,613 | 5/1995 | Galbi et al. | 365/63 |

*Primary Examiner*—David C. Nelms
*Assistant Examiner*—Trong Phan
*Attorney, Agent, or Firm*—Lowe, Price, LeBlanc & Becker

[57] ABSTRACT

Data input/output pad portions are arranged corresponding to memory blocks and adjacent to a corresponding memory block in the center region between memory blocks, and memory blocks. Power supply pads are arranged at both ends of the center region. Power supply pad transmits a power supply voltage to data input/output pad portions, and power supply pad transmits the power supply voltage to data input/output pad portions. Power supply pad for peripheral circuitry is arranged in the center portion of the center region. A multibit test circuit is provided for each memory block. A data input/output buffer operating stably at high speed is implemented in a large storage capacity memory device which in turn accommodates a multibit test mode.

32 Claims, 30 Drawing Sheets

ARRANGEMENT OF POWER SUPPLY AND DATA INPUT/OUTPUT PADS IN SEMICONDUCTOR MEMORY DEVICE

This application is a continuation of application Ser. No. 08/616,734 filed Mar. 15, 1996, U.S. Pat. No. 5,604,710 being disclaimed by a Terminal Disclaimer which is a continuation-in-part of application Ser. No. 08/445,819, filed May 22, 1995, abandoned.

BACKGROUND OF THE INVENTION

1. Field of the Invention

The present invention generally relates to semiconductor memory devices, and in particular, to an arrangement of power supply pads and data input/output pads in a semiconductor memory device. More particularly, the present invention relates to a layout of power supply pads, and data input/output buffers and peripheral circuits, and a multibit test circuit in a general-purpose DRAM (Dynamic Random Access Memory).

2. Description of the Background Art

FIG. 33 schematically shows a chip layout of a conventional semiconductor memory device. In FIG. 33, the semiconductor memory device is formed on a semiconductor chip 1100, and includes four memory blocks MB1, MB2, MB3, and MB4. Each of memory blocks MB1–MB4 includes a plurality of memory cells. During the normal operation (during an external accessing), a one-bit memory cell is selected in each of memory blocks MB1–MB4, and data is written thereto or read therefrom (in the case of x4 bit configuration).

In the center region (a region between memory blocks MB1 and MB3 and memory blocks MB2 and MB4) of semiconductor chip 1100, arranged are pads for receiving external power supply voltage and ground voltage and for input/output of signals. Such a structure in which pads are arranged in the center region of a chip is known as a lead on chip (LOC) arrangement, in which the tips of lead frame are arranged on the chip, and the lead frame is connected at the respective tips to the pads arranged in the center region of the chip by wire bonding. Alignment of the pads in the chip center region allows an area occupied by the pads to be reduced as compared to a structure in which pads are arranged at a peripheral portion along both sides of semiconductor chip 1100, thereby improving the efficiency of use of the semiconductor chip.

In this pad arrangement, power supply pads VC1 and VC2 are usually arranged at opposite ends in the center region of semiconductor chip 1100 in order to maintain compatibility of pins with a semiconductor memory device of the previous generation for example. Data input/output pads DQ1–DQ4 are collectively arranged adjacent to one power supply pad VC1. The other power supply pad VC2 supplies power supply voltage to circuits other than the data input/output circuits. In the figure, power supply pads VC1 and VC2 are shown supplying power supply voltage Vcc. Similarly, ground pads for supplying ground voltage Vss are arranged adjacent to power supply pads VC1 and VC2, respectively. However, for simplicity of illustration, the ground pads are not shown.

Data input/output pads DQ1–DQ4 carry out transmission and reception of data to and from memory blocks MB1–MB4 through internal data buses 1102a–1102d, respectively. Although not clearly shown in FIG. 33, data input/output buffers are provided adjacent to respective data input/output pads DQ1–DQ4. These data input/output buffers are made operative in response to supply of operation power supply voltage from power supply pad VC1 and ground voltage. By providing an operation power source for the data input/output buffers separately from that for the other circuits, power supply voltage and ground voltage used upon input/output of data are stabilized, and data input/output operation (data output operation in particular) is stabilized (data is input/output stably without the influence of power supply noise), and is increased in speed (charge/discharge operation is carried out at a high speed due to alleviation of the load of a power supply circuit).

The data input/output buffers are arranged adjacent to data input/output pads DQ1–DQ4. These data input/output buffers operate with power supply voltage Vcc supplied from the power supply pad VCI in common. Since a plurality of (four in FIG. 33) data input/output buffers are coupled to one power supply pad, the load of the power supply pad (power supply line) increases. The current supplying capability of power supply pad VC1 is determined according to the external specification. Therefore, when the number of data input/output buffers (data output buffers in particular) connected to the power supply pad VC1 increases, each data input/output buffer cannot be supplied with current of a sufficient magnitude from power supply pad VC1 stably. As a result, power supply voltage and ground voltage vary, the data input/output buffers cannot charge/discharge respective output nodes at a high speed, and these buffers cannot operate at a high speed. During the data output operation in particular, when variation of power supply voltage causes the operation speed of the output buffers to decrease, a timing at which valid output data appear at external pin terminals through the pads is delayed, and data cannot be read out at a high speed.

Power supply pad VC2 provided at a periphery of the center region of semiconductor chip 1100 is used for supplying power supply voltage to peripheral circuits. Although not clearly shown in FIG. 33, the peripheral circuits are distributedly arranged on semiconductor chip 1100. Therefore, the length of a power supply line from power supply pad VC2 to each peripheral circuit becomes longer, causing reduction of power supply voltage by interconnection line resistance, instability of power supply voltage or the like. As a result, the peripheral circuits cannot operate stably.

In order to shorten the power supply lines from power supply pad VC1 to the data input/output buffers, and to decrease the load of the power supply lines as much as possible, the data input/output buffers and data input/output pads DQ1–DQ4 are collectively arranged in the vicinity of power supply pad VC1. Therefore, internal data line 1102a between memory block MB1 and data input/output pad DQ1 and internal data line 1102b between memory block MB2 and data input/output pad DQ2 are larger in length than internal data line 1102c between memory block MB3 and data input/output pad DQ3 and internal data line 1102d between memory block MB4 and data input/output pad DQ4. In this case, the interconnection line resistances and the parasitic capacitances of internal data lines 1102a and 1102b become larger than those of internal data lines 1102c and 1102d, and the signal propagation delay in internal data lines 1102a and 1102b becomes larger than that in internal data lines 1102c and 1102d, hampering high speed accessing. In particular, at the time of data reading, a timing at which data read out from memory blocks MB1 and MB2 appear and are determined at pads DQ1 and DQ2 is delayed from a timing at which memory cell data read out from memory blocks MB3 and MB4 appear and are determined at pads DQ3 and DQ4. It is necessary to decide an output data determination timing by the delayed timing, resulting in longer access time at the time of data reading.

Similarly, at the time of data writing, internal write data is generated from write data which appear on pads DQ1–DQ4 in response to a write pulse (generated in response to a write enable signal), and transmitted to respective memory blocks MB1–MB4 through internal data lines 1102a–1102d. In this case, a timing at which write data is written in memory blocks MB1 and MB2 is delayed from a timing at which write data is written in memory blocks MB3 and MB4, resulting in a longer data writing time.

As shown in FIG. 34, in the case of a conventional arrangement of data input/output pads, peripheral pads PD1–PDn receiving address signals and clock signals (external control signals such as a row address strobe signal $\overline{RAS}$ and a write enable signal $\overline{WE}$), and a master control circuit 1110 receiving internal signals from peripheral pads PD1–PDn and generating signals controlling accessing operations to memory blocks MB1–MB4 are provided in a region other than a region for forming data input/output pads DQ1–DQ4 in the center region of semiconductor chip 1100. Buffers provided corresponding to pads PD1–PDn operate in reception of power supply voltage from power supply pad VC2. Usually, peripheral pads PD1–PDn are arranged alignedly. An internal signal from peripheral pad PD1 is applied to master control circuit 1110 through a signal line 1112, and an internal signal from peripheral pad PDn is applied to master control circuit 1110 through a signal line 1113.

Master control circuit 1110 provides necessary control signals for memory blocks MB1–MB4, respectively, and generates signals defining data input/output timings of the data input/output buffers provided corresponding to data input/output pads DQ1–DQ4. Generally, the DRAM strobes an address signal applied to an address input pad in response to the falling of row address strobe signal $\overline{RAS}$, and generates an internal row address signal. Usually, for the address signal, a set-up time and a hold time are determined with respect to the falling edge of the signal $\overline{RAS}$. When signal lines 1112 and 1113 are different in length from each other as shown in FIG. 34, these signal lines 1112 and 1113 have different signal propagation delays from each other, and therefore, it is necessary to set the set-up time and the hold time for the worst case. This prevents an implementation of earlier internal operation start timing and high speed operation. Further, the difference in distances from master control circuit 1110 to memory blocks MB1–MB4 prevents operation timings of memory blocks MB1–MB4 from being common, and accessing time becomes longer for the worst case.

SUMMARY OF THE INVENTION

One object of the present invention is to provide a semiconductor memory device operating stably at a high speed.

Another object of the present invention is to provide a semiconductor memory device including a pad layout for implementing high speed and stable operation.

A semiconductor memory device according to one aspect of the present invention includes a plurality of memory blocks arranged in alignment with a first direction on both sides of the center region along the first direction, a plurality of data input/output buffers arranged corresponding to the plurality of memory blocks and adjacent to the corresponding memory block in the center region, each data input/output buffer transmitting and receiving data to and from the corresponding memory block, and a plurality of buffers arranged in the vicinity of the center portion in the center region along the first direction for receiving an external signal for accessing the plurality of memory blocks. The plurality of data input/output buffers are arranged in a region other than the vicinity of the center portion.

Preferably, further provided are a plurality of power supply pads arranged adjacent to a data input/output buffer group in each of one side region and the other side region of the center region for supplying power supply voltage only to a corresponding data input/output buffer group.

Preferably, a respective power supply pad connects only a power supply interconnection line for supplying power supply voltage to a corresponding data input/output buffer group.

Preferably, the plurality of data input/output buffers are aligned in each of one side region and the other side region of the center region, and the plurality of power supply pads are arranged in the center region so as to sandwich a corresponding data input/output buffer therebetween in the first direction in each of one side region and the other side region.

Preferably, further provided are peripheral circuitry arranged in the center portion between one side region and the other side region of the center region for receiving an external signal controlling accessing to the plurality of memory blocks and for controlling accessing to the plurality of memory blocks in response to the received external signal, and a peripheral power supply pad provided exclusively for the peripheral circuitry in the center portion of the center region for receiving externally applied power supply voltage and supplying the received power supply voltage to the peripheral circuitry.

Preferably, a compressor for compressing data of multibits of memory cells is provided for each memory block.

In one aspect of the present invention, the data input/output buffers are arranged in the vicinity of each corresponding memory block, and the peripheral circuitry is arranged in the vicinity of the center portion, so that the length of internal data buses to all the data input/output buffers can be made identical, and that data input/output can be carried out at a high speed. Further, arranging an external signal input buffer in the center portion allows the master control circuit serving as the peripheral circuitry to be arranged in the chip center portion so that an external signal can be transmitted to the peripheral circuitry with a shortest signal line, resulting in high speed access.

Preferably, the plurality of data input/output buffers are arranged corresponding to the respective of memory blocks. The plurality of data input/output buffers are arranged in groups on one side region and the other side region opposite to each other with respect to the center portion of the center region. Preferably, the pads are arranged corresponding to each data input/output buffer group. Each pad supplies power supply voltage only to a corresponding data input/output buffer group. Therefore, it is not necessary to apply power supply voltage from one pad to all the data input/output buffers, resulting in stable supply of power supply voltage to the data input/output buffers. As a result, variation of power supply voltage during operation of the data input/output buffers can be suppressed. It is not necessary to set an access time taking the power supply voltage into consideration in accessing of data input/output, enabling high speed access. Further, since the data input/output buffers are arranged corresponding to respective memory blocks, the distances between respective memory blocks and corresponding data input/output buffers can be made approximately identical with each other, and that a different data input/output buffer provides a different timing at which a valid data signal is determined can be prevented, and a margin for determination timing of a valid data signal can be made small. Accordingly, high speed access is enabled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Arrangement of Power Supply Pads and Input/Output Buffers]

Figure 1:
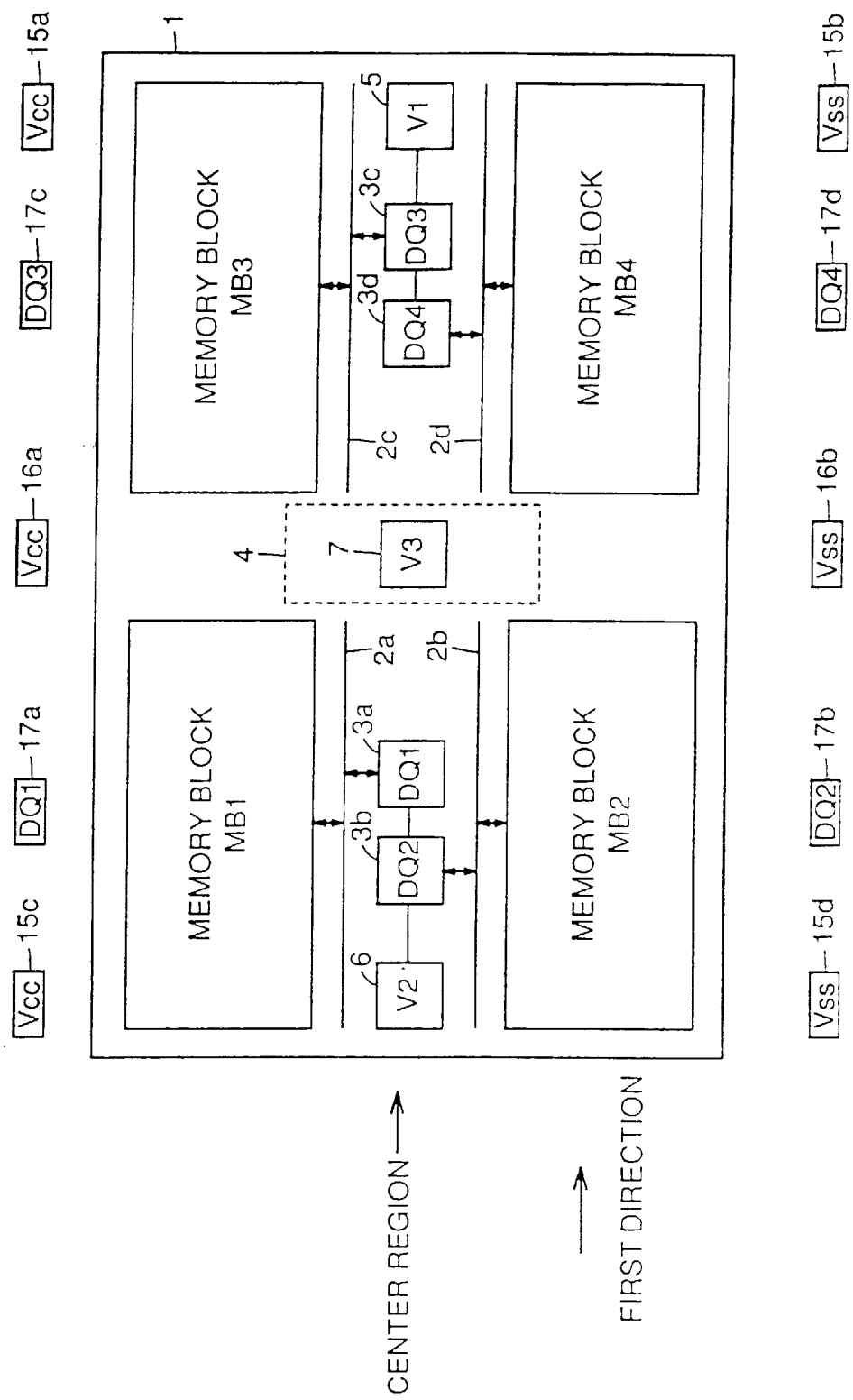
FIG. 1 is a diagram schematically showing a chip layout and an arrangement of external pin terminals of a semiconductor memory device according to one embodiment of the present invention.

FIG. 1 is a diagram schematically showing a layout of a semiconductor memory device according to one embodiment of the present invention. Referring to FIG. 1, the semiconductor memory device is formed on a semiconductor chip 1, and includes four memory blocks MB1–MB4. Each of these memory blocks MB1–MB4 includes a plurality of memory cells. A one-bit memory cell is selected at the time of operation in each of memory blocks MB1–MB4 (the structure of a memory block will be described in detail later). Memory blocks MB1 and MB3 are arranged on one side of the center region in a first direction (the horizontal direction in FIG. 1) and memory blocks MB2 and MB4 are arranged on the other side thereof. Data input/output pads 3a, 3b, 3c, and 3d are arranged corresponding to memory blocks MB1–MB4 and adjacent to the corresponding memory block in the center region. Note that a "pad portion" is used to indicate a pad connected to a lead frame and a buffer provided adjacent thereto in the following description.

Data input/output pad portion 3a transmits and receives data to and from memory block MB1 through an internal data bus 2a. Data input/output pad portion 3b transmits and receives data to and from memory block MB2 through an internal data bus 2b. Data input/output pad portion 3c transmits and receives data to and from memory block MB3 through an internal data bus 2c. Data input/output pad portion 3d transmits and receives data to and from memory block MB4 through an internal data bus 2d. Because of the reason to be described in detail later, data input/output pad portions 3a–3d are arranged in the vicinity of the center portion (in the horizontal direction of the figure) of corresponding memory blocks MB1–MB4.

Power source pads 5 and 6 are arranged at opposite ends of the center region with a power source pad 7 arranged in the center portion of the center region. Power source pad 5 transmits a power source voltage V1 (Vcc and Vss) to data input/output pad portions 3c and 3d, and power source pad 6 transmits a power source voltage V2 (Vcc and Vss) to data input/output pad portions 3a and 3b. Power source pad 7 transmits a power source voltage V3 (Vcc and Vss) to a control circuit and a buffer for input of external signals such as an address signal and a block select signal included in peripheral circuitry 4 indicated by a broken line block. A schematic detail of the peripheral circuitry will be described later.

The semiconductor memory device has a "lead on chip" structure as its package structure. The semiconductor memory device has a plurality of leads respective tips of which extend onto the center region of semiconductor chip 1. The tip of each lead and each pad are connected by a bonding wire. In FIG. 1, corresponding external pin terminals are also shown. More specifically, power source pad 5 is connected to a pin terminal 15a receiving power supply voltage Vcc and a pin terminal 15b receiving ground voltage Vss. Data input/output terminals 17c and 17d are connected to pad portions 3c and 3d, respectively. Power source pad 7 is connected to a pin terminal 16a receiving power supply voltage Vcc and a pin terminal 16b receiving ground voltage Vss. Pad portion 3a is connected to a data input/output pin terminal 17a, and pad portion 3b is connected to a data input/output pin terminal 17b. Power source pad 6 is connected to a pin terminal 15c receiving power supply voltage Vcc and a pin terminal 15d receiving ground voltage Vss. The pin terminals are arranged substantially corresponding to the related pads. Internal data buses 2a–2d extend along an overall of the respective memory blocks MB1–MB4, and are identical in length.

Figure 2:
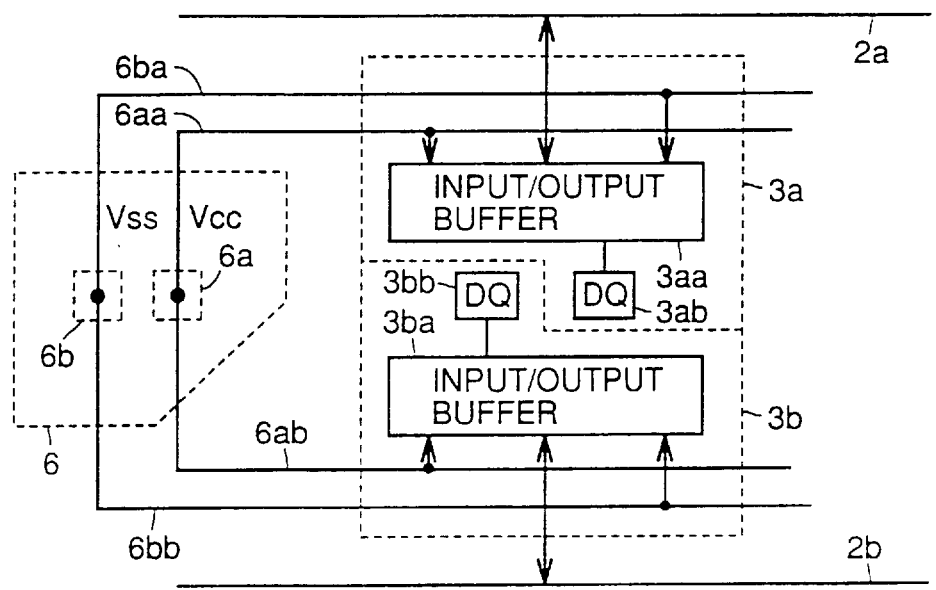
FIG. 2 is a diagram schematically showing a structure of a power supply pad and data input/output pad portions.

FIG. 2 is a diagram schematically showing the structure of the pad portion and the power source pad shown in FIG. 1. In FIG. 2, the structures of a portion corresponding to pad portions 3a and 3b and power supply pad 6 are shown. Referring to FIG. 2, pad portion 3a includes an input/output buffer 3aa transmitting and receiving data through internal data bus 2a, and a pad 3ab transmitting and receiving a data signal to and from input/output buffer 3aa. Pad portion 3b includes an input/output buffer 3ba transmitting and receiving data through internal data bus 2b, and a pad 3bb transmitting and receiving a data signal to and from input/output buffer 3ba. Power source pad 6 includes a pad 6a receiving power supply voltage Vcc through external pin terminal 15c and transmitting the same to internal power supply lines 6aa and 6ab, and a ground pad 6b receiving ground voltage Vss through pin terminal 15d and transmitting the same through ground lines 6ba and 6bb. Power supply lines 6aa and 6ab includes interconnection lines formed on the same level layer, and ground lines 6ba and 6bb includes ground lines formed on the same level interconnection layer. Input/output buffer 3aa operates with power supply voltage Vcc on power supply line 6aa and ground voltage Vss on ground line 6ba as its operation power supply voltages. Input/output buffer 3ba operates with power supply voltage Vcc on power supply line 6ab and ground voltage Vss on ground line 6bb as its operation power supply voltages. In the following description, the power source voltage is described to include both the voltages Vcc and Vss, unless mentioned otherwise.

As shown in FIGS. 1 and 2, voltage V2 (Vcc and Vss) applied to power source pad 6 is used by input/output buffers 3aa and 3ba included in pad portions 3a and 3b. On the other hand, voltage V1 (Vcc and Vss) on power source pad 5 is used only by the input/output buffers included in pad portions 3c and 3d. Since respective loads of power source pads 5 and 6 are alleviated, these pads can supply the power source voltage stably, and accordingly, the input/output buffers included in corresponding pad portions can be driven at a high speed. More specifically, when the amounts of current flowing through power supply lines 6aa and 6ab and ground lines 6ba and 6bb are predetermined in FIG. 2 arrangement, input/output buffers 3aa and 3ba operating with the voltages on the power supply lines and the ground lines as the operation power supply voltages are supplied with sufficient current, and the respective pads 3ab and 3bb can be charged/discharged stably at a high speed at the time of data reading.

Consider the case where the current supplying capability of power source pad 6 is in such a degree that power source pad 6 can supply sufficient current to input/output buffers 3aa and 3ba. When the number of input/output buffers increases, more current is consumed according to operation of these input/output buffers, the voltages on power supply lines 6aa and 6ab and ground lines 6ba and 6bb vary, and the voltage levels of data signals provided from the input/output buffers vary, causing an unstable operation. However, by reducing the number of input/output buffers connected to one power source pad as described above, power supply voltage Vcc and ground voltage Vss at a constant voltage level can be transmitted stably even at the time of an operation of the buffers. Further, by arranging the power source pads, respectively, for corresponding memory block groups, as shown in FIG. 1, the power supply lines and ground lines between the power source pads and the data input/output pad portions can be decreased in length, change of the voltages caused by interconnection line resistance on the power supply lines and the ground lines can be prevented, and constant power supply voltage Vcc and ground voltage Vss can be supplied stably.

By arranging power source pad 7 used only by the peripheral circuitry in the center portion of the chip, power supply voltage Vcc and ground voltage Vss (indicated as voltage V3) can be supplied stably to the peripheral circuitry because of the similar reason as described above, and peripheral circuitry 4 can operate stably at a high speed.

By arranging data input/output pad portions DQ1–DQ4 in the vicinity of the center portions of corresponding memory blocks MB1–MB4, respectively, the following advantages can be obtained.

Figure 3:
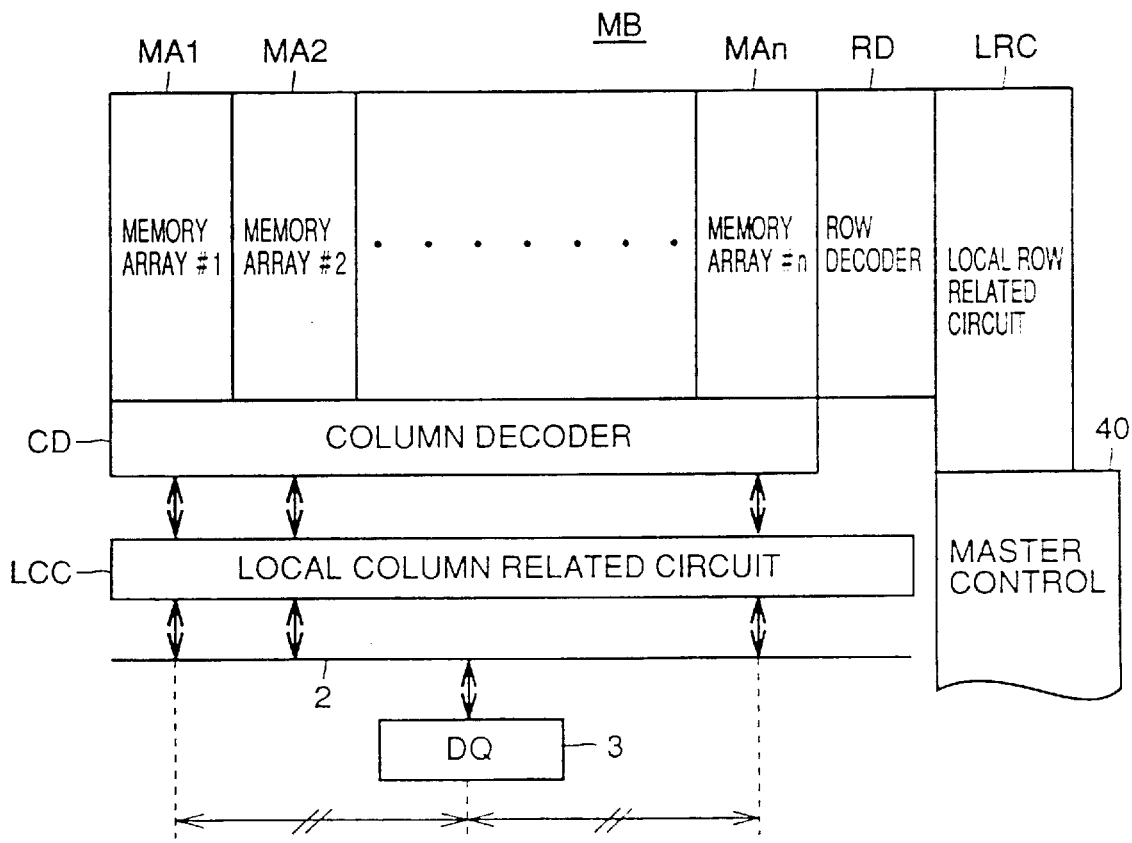
FIG. 3 is a diagram schematically showing a structure of a memory block of the semiconductor memory device shown in FIG. 1.

FIG. 3 schematically shows the structure of one memory block. Referring to FIG. 3, memory block MB is divided into n (for example, 32) memory arrays MA1–MAn. A row decoder RD is provided for these memory arrays MA1–MAn, and a column decoder CD is provided adjacent to memory arrays MA1–MAn and in a direction parallel with the direction in which internal data bus 2 extends. A local column related circuit LCC is provided adjacent to column decoder CD, and a local row related circuit LRC is provided adjacent to row decoder RD. A control signal and an address signal are applied to these local column related circuit LCC and local row related circuit LRC from a master control circuit 4a. Row decoder RD may be arranged corresponding to each of memory arrays MA1–MAn.

In operation, row decoder RD selects one word line only in each of a predetermined number of (for example, one) memory arrays among memory arrays MA1–MAn. The memory arrays other than the memory array including the selected word lines all maintain the stand-by state (this operation is implemented by local row related circuit LRC). A column select signal from column decoder CD is applied to the selected ones of memory arrays MA1–MAn. Therefore, only the selected memory array is connected to internal data bus 2.

Internal data bus 2 extends along all the memory arrays MA1–MAn. Therefore, when memory array MA1 is selected, for example, data read out from the selected memory array MA1 is transmitted to one end of internal data bus 2 through local column related circuit LCC. On the other hand, when memory array MAn is selected, data from memory array MAn is transmitted to the other end of internal data bus 2 through local column related circuit LCC. By arranging data input/output pad portion 3 in the vicinity of the center portion of internal data bus 2, the time required for transmitting to pad portion 3 data read out when memory array MA1 is selected can be made equal to the time required for transmitting to pad portion 3 memory cell data when memory array MAn is selected, and the time difference in transmission of memory cell data to pad portion 3 caused depending on the position of the selected memory array can be made small. In case pad portion 3 is provided at the other end of internal data bus 2 proximate to master control circuit 4a, for example, the longest time is required for transmitting data read out from memory array MA1 to pad portion 3. Since the access time is determined taking the worst case into consideration, high speed reading operation cannot be carried out in such an arrangement.

Therefore, by arranging data input/output pad portion 3 in the vicinity of the center portion of data bus 2 (the center portion of memory block MB) as shown in FIG. 3, the difference among the times required for data reading caused depending on the position of the selected memory array can be made small, and high speed reading operation can be implemented. This also applies to data writing operation. Even when the number of bits of data read out from one memory block increases to two bits, four bits . . . , the data input/output pad portion is arranged in the center portion of memory block MB as far as possible. As a result, variation of the difference among the times required for data reading caused depending on the position of the selected memory array is minimized.

As described above, by distributing the data input/output pad portions correspondingly to respective memory blocks, the power source pads can be arranged corresponding to the groups of distributed data input/output pad portions, the number of data input/output buffers connected to one power source pad can be reduced, the power supply voltage and ground voltage of each data input/output buffer can be stabilized, and a semiconductor memory device operating stably at a high speed can be implemented.

By arranging the data input/output pad portions in the vicinity of the center portion of corresponding memory blocks, the following meritorious advantage is provided. Even in a memory block including a divided array (partial activation) structure in which selected memory cell data is transmitted at different positions on the internal data bus, the difference in memory cell data propagation time caused depending on the position of the selected array can be made very small, and input/output of data can be carried out at a high speed. Further, by arranging the input/output pad portions in the vicinity of corresponding memory blocks, the internal data bus has only to be arranged along the entire of a corresponding memory block. The internal data bus does not have to be extended from one end to the other end of the chip. The length of the internal data bus can be shortened, propagation delay of a data signal on the internal data bus can be reduced, and input/output of data can be carried out at a high speed.

By arranging a power source pad exclusively for the peripheral circuitry in the center portion of the chip, the power supply voltage and ground voltage can be supplied to the peripheral circuitry stably, and the peripheral circuitry can operate stably at a high speed. When peripheral circuitry 4 includes a voltage down converting circuit down-converting the external power supply voltage Vcc to generate the internal operation power supply voltage, a substrate bias generating circuit generating a negative voltage Vbb as a substrate bias voltage, and a circuit generating an intermediate potential to be applied to a bit line precharge circuit or a cell plate of a memory cell capacitor, these voltages can be transmitted to each of memory blocks MB1–MB4 with a short interconnection line. These interconnection lines can be symmetrically arranged to simplify the layout thereof. As a result, necessary voltages can be reliably transmitted through short interconnection lines to respective circuits stably.

[Layout of Pads for External Signals]

Figure 4:
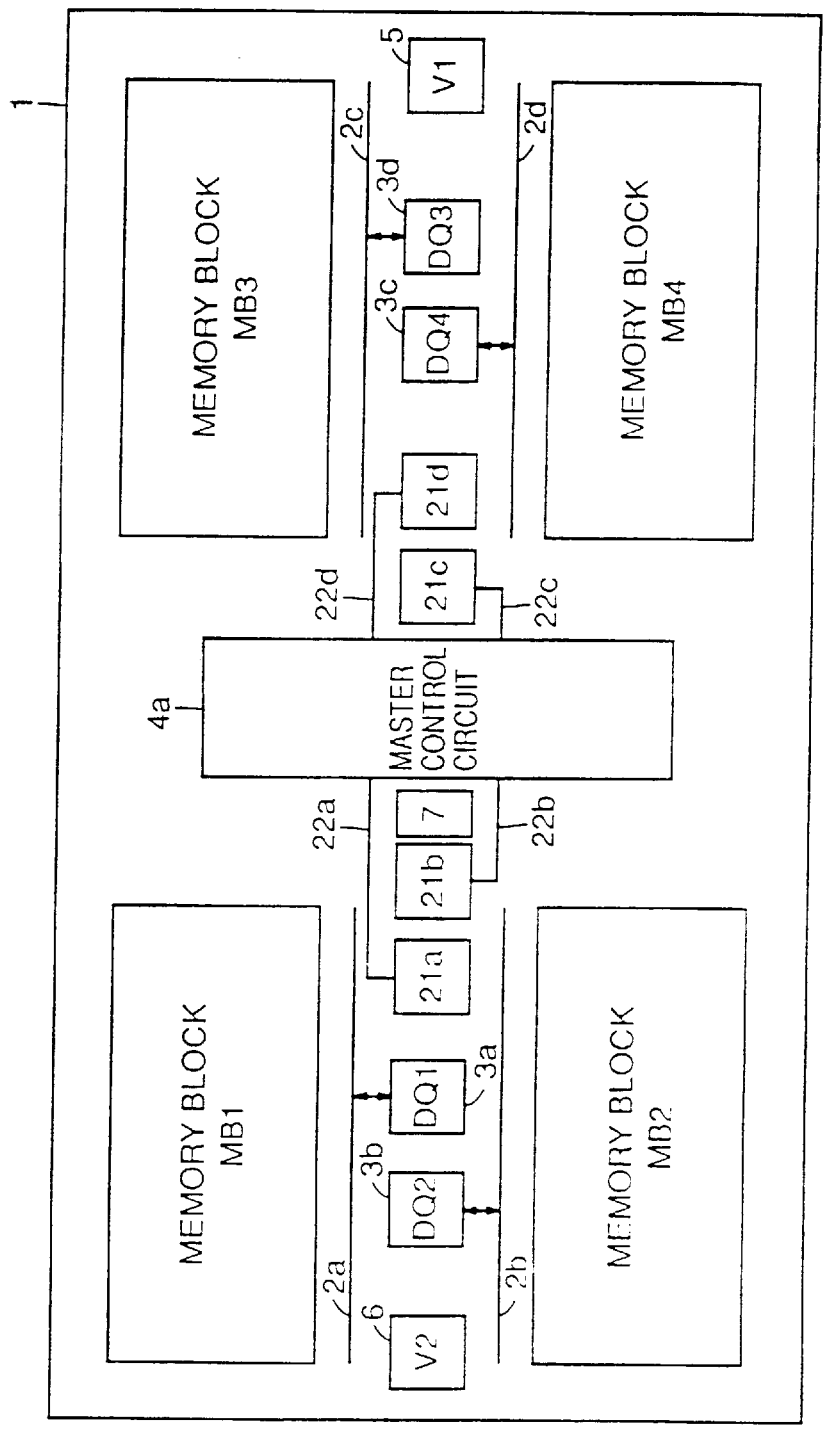
FIG. 4 is a diagram schematically showing a layout of a peripheral circuit portion in the semiconductor memory device according to the present invention.

FIG. 4 is a diagram schematically showing a layout of pads for external signals of the semiconductor memory device according to the present invention. In the structure shown in FIG. 4, portions corresponding to those of the structure shown in FIG. 1 are labeled with the same reference characters, and a detailed description thereof will not be repeated.

Referring to FIG. 4, peripheral circuitry is arranged in the center portion between data input/output pad portions 3a and 3b on one side region and data input/output pad portions 3c and 3d on the other side region. The peripheral circuitry includes master control circuit 4a for controlling an access operation to memory blocks MB1–MB4, and peripheral pad portions 21a, 21b, 21c, and 21d receiving an address signal and a clock signal (an access control signal such as the row address strobe signal and the write enable signal). Power source pad 7 for the peripheral circuitry is arranged in the vicinity of master control circuit 4a. Peripheral pad portions 21a–21d each transmit an input signal to master control circuit 4a through signal lines 22a–22d. By arranging peripheral pad portions 21a–21d in the center portion of the center region symmetrically for master control circuit 4a, the length of signal lines 22a–22d can be shortened, and propagation delay of the address signal and the clock signal can be made small (this is because the resistance and the parasitic capacitance of each signal line can be made small by shortening the signal line, thereby reducing the RC delay).

The reduced propagation delay on the signal lines allows a set-up time and a hold time of the external signal (address signal and clock signal) to be shortened, resulting in high speed access (this is because an internal operation start timing can be set earlier). The shortening of a set-up time and a hold time will now be described with reference to FIGS. 5A and 5B.

Figure 5A:
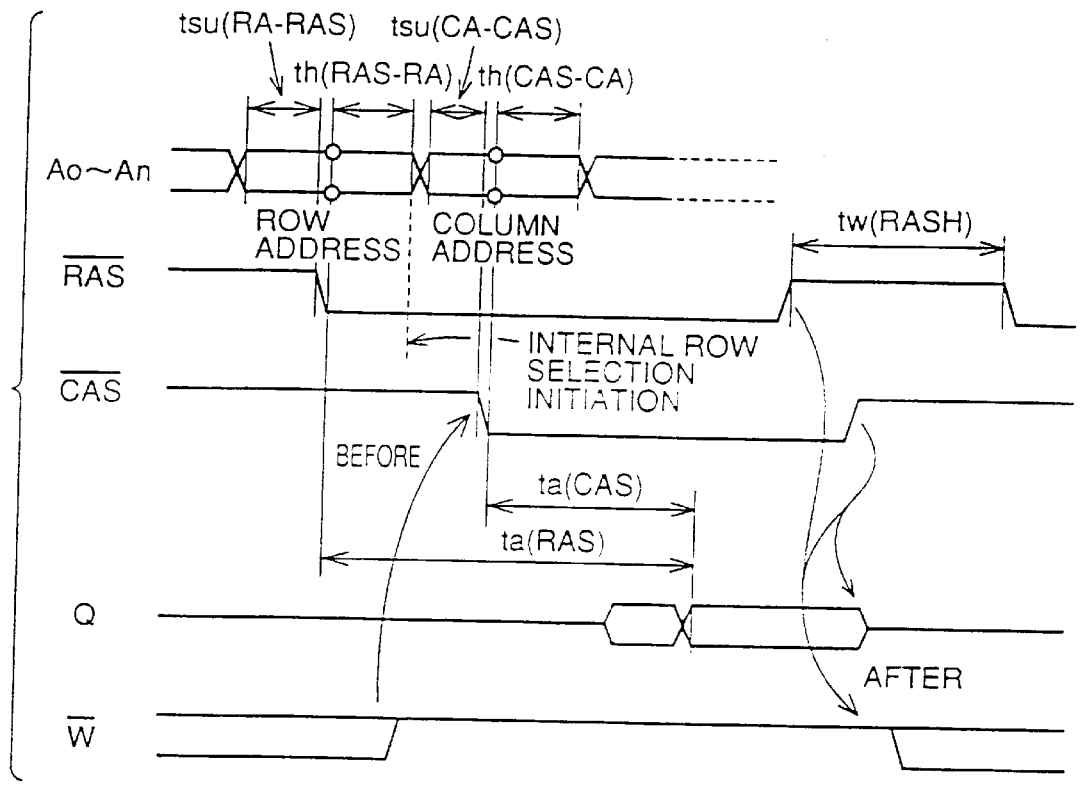
FIGS. 5A and 5B are signal waveform diagrams used for showing set-up times and hold times defined for the semiconductor memory device, and for explaining the meritorious effect of the semiconductor memory device shown in FIG. 4.
Figure 5B:
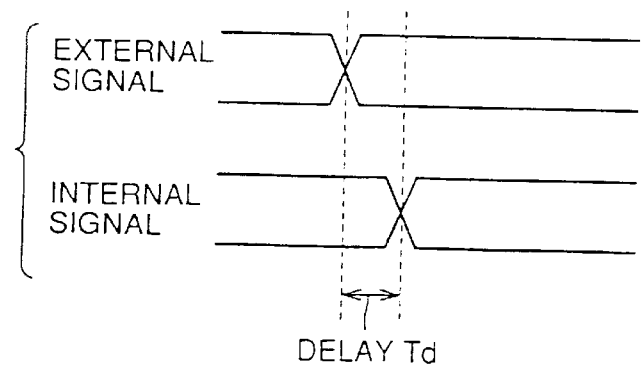

FIGS. 5A and 5B show illustratively set-up times and hold times of an address signal. FIG. 5A shows set-up times and hold times required with respect to external control signals during the data reading operation. In the DRAM, a row address signal and a column address signal are provided in a time division multiplexing manner. For the row address signal, a before RAS row address·set-up time tsu (RA-RAS) is defined for bringing the row address signal to a determined state before the falling of row address strobe signal $\overline{RAS}$, and an after RAS row address·hold time th (RAS-RA) is defined for maintaining the row address signal after the falling of external row address strobe signal $\overline{RAS}$. After completion of the after RAS row address·hold time th (RAS-RA), a row select operation is internally started in the DRAM.

Similarly, for the column address signal, a before CAS column address·set-up time tsu (CA-CAS) and after CAS column address·hold time th (CAS-CA) are defined with respect to column address strobe signal $\overline{CAS}$. Valid output data Q is provided in an RAS access time ta (RAS) after the falling of row address strobe signal $\overline{RAS}$. The access time is also defined by a CAS access time ta (CAS), in which the valid data is externally read out since column address strobe signal $\overline{CAS}$ falls and is brought to an active state. In the DRAM, an RAS "H" pulse width tw (RASH) is defined for precharging internal signal lines and internal nodes to an initial state. Once signal $\overline{RAS}$ is pulled up to a high level, signal $\overline{RAS}$ can be pulled down only after a lapse of the RAS "H" pulse width tw (RASH).

These set-up times and hold times, and access times are all determined according to the external specification. Therefore, when an internal signal has a delay time Td with respect to an external signal as shown in FIG. 5B, the set-up time and the hold time become longer by the delay time Td, respectively. Therefore, as shown in FIG. 5A, an internal row select start operation timing is delayed by the delay time Td. The RAS access time and the CAS access time are lengthened, impeding reading of data at a high speed. Therefore, from the standpoint of high speed access, it is preferred to make the delay time Td as short as possible, and to make the set-up time and the hold time as short as possible.

By arranging external signal input pad portions 21a–21d on both sides of master control circuit 4a as shown in FIG. 4, the length of signal lines 22a–22d can be shortened, the internal signal propagation delay time can be shortened, and accordingly the delay time Td can be shortened. As a result, the set-up time and the hold time can be shortened, enabling high speed accessing.

[Distributed Arrangement of Power Source]

Figure 6:
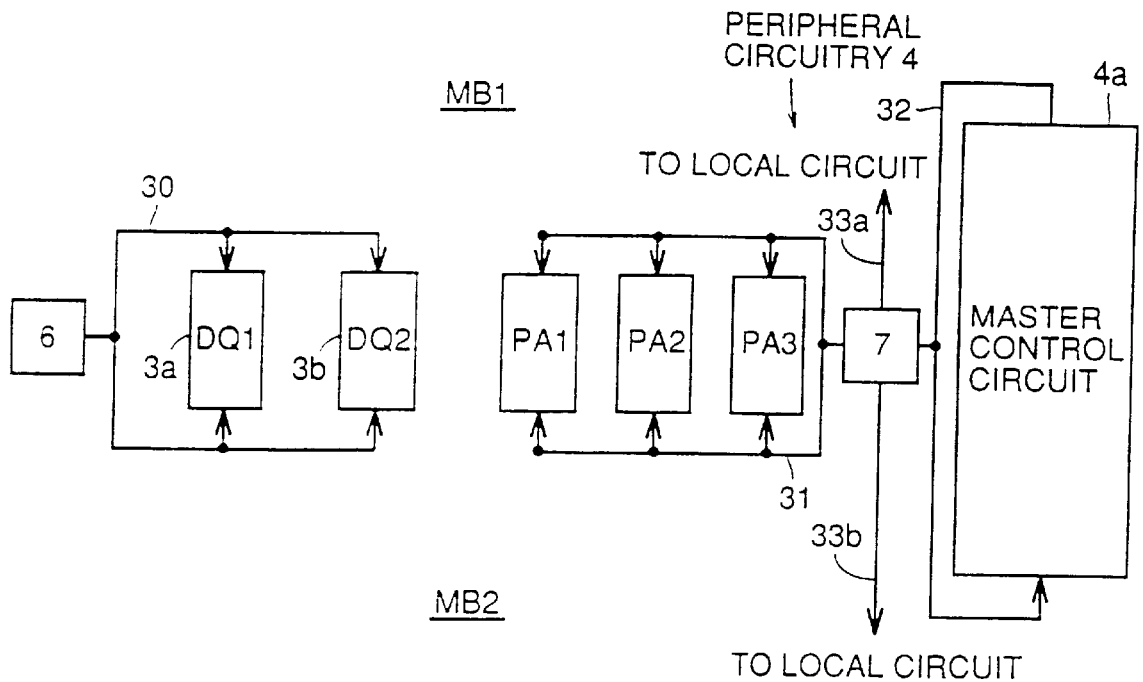
FIG. 6 is a diagram showing one example of a manner of distribution of power supply voltage from the power supply pads in the semiconductor memory device according to the present invention.

FIG. 6 is a diagram showing one example of a distributed arrangement of the power source voltage in a power source pad layout of the present invention. In FIG. 6, an arrangement of a region between power source pad 6 and memory blocks MB1 and MB2 of the semiconductor memory device of FIG. 4 is shown. Referring to FIG. 6, data input/output pad portions 3a and 3b, peripheral pad portions PA1–PA3 receiving an external signal (address signal and clock signal), power source pad 7 for peripheral circuitry, and master control circuit 4a operating in reception of power source voltage from power source pad 7 are shown.

Referring to FIG. 6, data input/output pad portions 3a and 3b operate in reception of the power source voltage (including Vcc and Vss) from power source pad 6 through a power supply line (including a ground line) 30. Peripheral pad portions PA1–PA3 receive power source voltage (including Vcc and Vss) in common from power source pad 7 through a power source line 31. Master control circuit 4a operates in reception of power source voltage (including Vcc and Vss) from power source pad 7 through a power source line 32. Power source pad 7 is also provided with power source lines 33a and 33b, through which power source pad 7 transmits the power source voltage (including Vcc and Vss) to local circuits of memory blocks MB1 and MB2, respectively. Power source lines 31, 32 and 33a and 33b are formed by different interconnection lines (on the same level interconnection line layer). Formation of power source lines 31, 32, 33a and 33b by different interconnection lines prevents a voltage variation on each interconnection line from affecting the other interconnection lines, and the peripheral circuitry (including peripheral pad portions PA1–PA3, and master control circuit 4a) can be operated stably. At the time, since data input/output pad portions 3a and 3b are supplied with the power source voltage through power source line 30 from power source pad 6 provided in the vicinity thereof, the power source voltage is stable, enabling a high speed operation.

As shown in FIG. 6, power source line 30 (including both a power supply line supplying power supply voltage Vcc and a ground line supplying ground voltage Vss) connected to power source pad 6 and power source line 31 connected to pad 7 for the peripheral circuitry are arranged separately from each other, and only a power source line supplying power source voltage only to the data input/output buffers included in pad portions DQ1 and DQ2 is connected to power source pad 6, and only a power source line supplying power source voltage to buffer circuits for a control signal and address signal included in peripheral pad portions PA1–PA3 is connected to pad 7 for the peripheral circuitry. Such connection arrangement provides the following advantages. Even if voltage Vcc and/or Vss on power source line 30 varies during the operation of the data input/output buffers included in pad portions 3a and 3b, this affects only the data input/output buffers included in pad portions 3a and 3b. The voltage variation on power source line 30 does not have any influence on the buffers for input of a control signal and an address signal included in peripheral pad portions PA1–PA3. Therefore, the peripheral circuits included in peripheral pad portions PA1–PA3 and master control circuit 4a operate receiving the stable power source voltage from pad 7 for the peripheral circuitry. More specifically, the peripheral circuitry can operate stably even at the time of input/output of a data signal.

Further, the power source voltage can be applied separately to the data input/output buffers and to the peripheral circuitry, and a high speed interface at which a power supply voltage level for input/output of a signal such as HSTL (High Speed Transistor Logic in which high level is 1.2 V, and the low level is 0.8 V) is different from an internal operation power supply voltage level can be easily implemented. More specifically, a power supply voltage at an external interface level is applied to power supply pad 6 for data input/output, to operate the data input/output buffers with voltage at a level of the high speed interface, and a voltage at a level higher than the high speed interface is applied to pad 7 for the peripheral circuitry, and the voltage is down-converted by a voltage down converting circuit included in the peripheral circuit portion for application to the peripheral circuits included in the pad portions for the peripheral circuitry. As a result, the buffers for input of a control signal and an address signal operate with the power supply voltage corresponding to the external interface, and the internal circuits can operate with a voltage at a higher voltage level. Alternatively, a power supply voltage at a high speed interface level may be applied to pad 7 for the peripheral circuitry, and a power supply voltage for operation of the internal circuits may be generated from a boosting circuit provided in the peripheral circuitry. In either case, an interface at which an internal operation power supply voltage level is different from a power supply voltage level for input/output of a signal can be easily implemented.

Meanwhile, if an external power supply voltage is higher than an internal operating power supply voltage, the external power supply voltage may be applied to pad 6, and the internal operating power supply voltage may be applied to pad 7.

Figure 7:
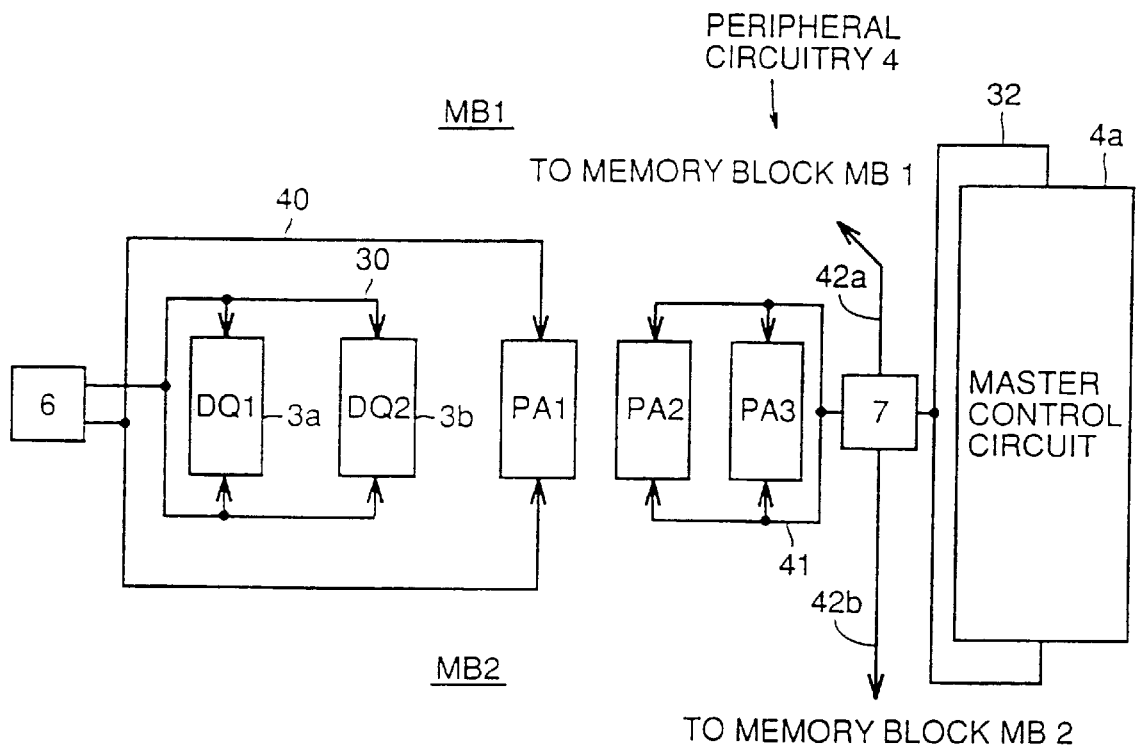
FIG. 7 is a diagram showing another manner of distribution of power supply voltage from the power supply pads in the semiconductor memory device according to the present invention.

FIG. 7 is a diagram showing another structure of the power supply distribution. Unlike the structure shown in FIG. 6, the power source voltage (Vss and Vcc) is applied to peripheral pad portion PA1 from power source pad 6 through a power source line 40 in the structure shown in FIG. 7. Power source voltage (Vcc and Vss) is transmitted to peripheral pad portions PA2 and PA3 from power source pad 7 through a power source line 41. The power source voltage is transmitted from power source pad 7 to memory blocks MB1 and MB2 (peripheral circuitry) through power source lines 42a and 42b, respectively. Also in this case, data input/output pad portions 3a and 3b, and peripheral pad portion PA receive their power source voltages through different power source lines. Data input/output pad portions 3a and 3b are supplied with the power source voltage stably through power source line 30, and operate stably at a high speed.

In the structures shown in FIGS. 6 and 7, an additional power source pad may be provided between peripheral pad portion PA1 and data input/output pad portion 3b, and the peripheral pad portion PA1 may be supplied with its power source voltage from the additional power source pad. In this case, the power supply voltages may be separately applied to an address signal input pad portion and to a clock signal input pad portion, for example.

In either case, by providing a power source pad 7 close to the peripheral circuitry (the peripheral pad portion and master control circuit portion), and transmitting the power source voltage to the peripheral circuitry from power source pad 7, the length of the power source lines can be shortened, enabling stable operation of the peripheral circuitry.

[Pin Arrangement]

Figure 8:
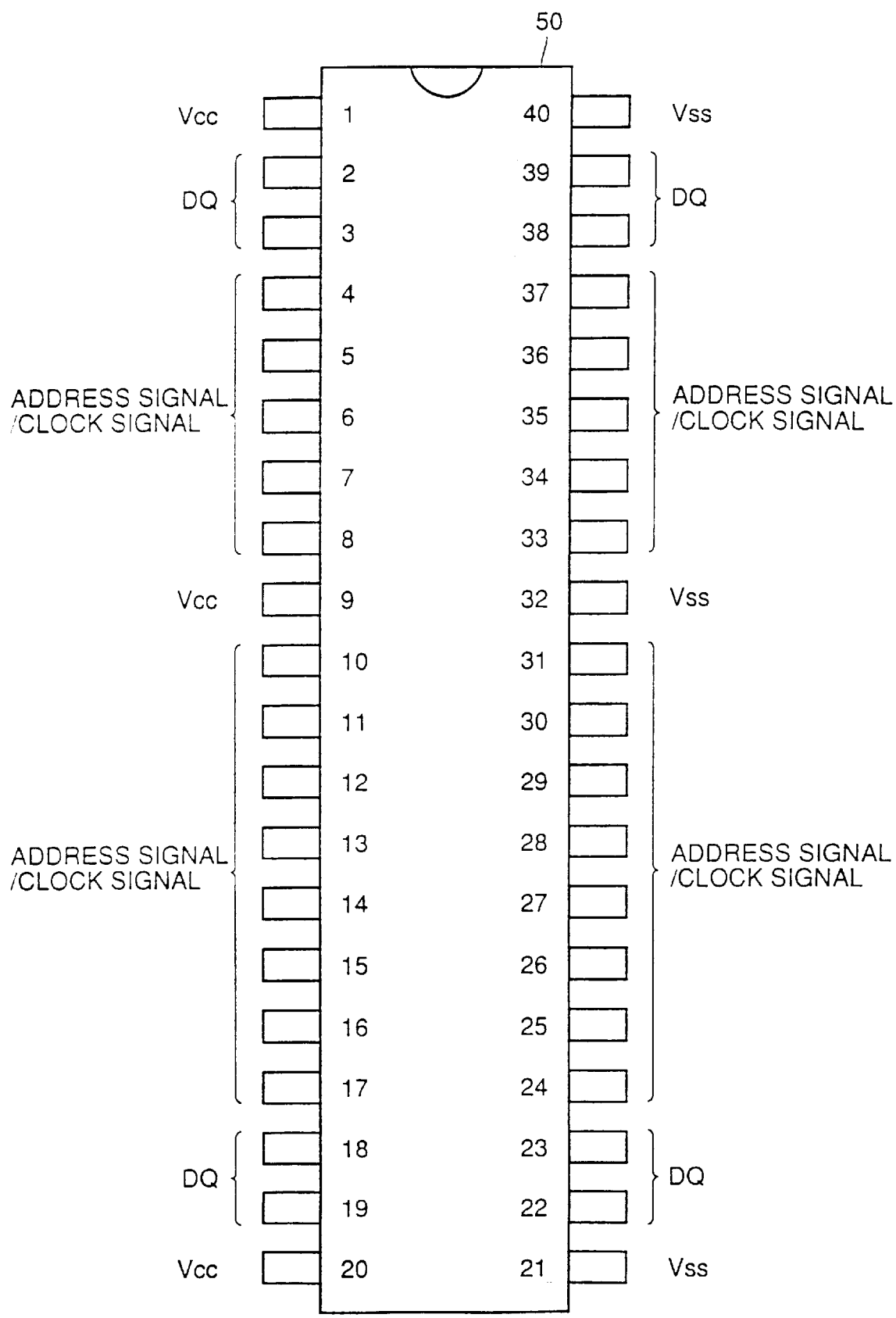
FIG. 8 is a diagram showing an arrangement of external pin terminals of the semiconductor memory device according to the present invention.

FIG. 8 is a diagram showing a package housing the semiconductor memory device of the present invention and a pin arrangement thereof. Referring to FIG. 8, a semiconductor integrated circuit device (semiconductor memory device) 50 includes 40 external pin terminals as an example. Power supply voltage Vcc and ground voltage Vss are applied to terminals of pin numbers 1 and 40, respectively. Terminals of pin numbers 2, 3, 38, and 39 adjacent to terminals of pin numbers 1 and 40 are used as data input/output pin terminals. On the other side (the bottom side) of the device, power supply voltage Vcc and ground voltage Vss are applied to pin terminals of the numbers 20 and 21. Pin terminals having pin numbers 18, 19, 22, and 23 for data input/output are arranged adjacent to the pin terminals of pin numbers 20 and 21. Voltage Vcc and voltage Vss applied to the pin terminals of pin numbers 20 and 21 are used in data input/output buffers for input/output of data at the pin terminals of pin numbers 18, 19, 22, and 23.

Power supply voltages Vcc and Vss are applied to pin terminals having pin numbers 9 and 32 in the chip (package) center portion. Voltages Vcc and Vss applied to these pin terminals of pin numbers 9 and 32 are used in the peripheral circuitry (external address signal and external clock signal input buffers). Pin terminals of pin numbers 4 to 8, and pin terminals of pin numbers 10 to 17, 24 to 31 and 33 to 37 are used as address signal or clock signal input pin terminals, respectively. The semiconductor memory device has a lead on chip structure. Lead frame extends from these pin terminals to the vicinity of the pads shown in FIG. 8 or the like, and the lead frame and the pads are connected by bonding wires. Therefore, the arranged positions of the pin terminals and the arranged positions of the pad portions described above have an approximate correspondence (however, they do not have a complete one-to-one correspondence, since the pad portions are arranged in a line, and the pin terminals are arranged in two lines).

By using Vcc and Vss input pin terminals (pads) on both ends as pin terminals for applying the power supply voltage and the ground voltage to the data input/output pad portions, and distributing data input/output pin terminals on both upper and lower sides of semiconductor memory device 50 of FIG. 8, as well as by arranging the address signal and clock signal input pin terminals in the center region between the data input/output pin terminals and providing, in the center portion, the power supply pin terminals for the peripheral circuitry, a pad layout of a chip described above can be implemented.

[Pin Arrangement 2]

Figure 9:
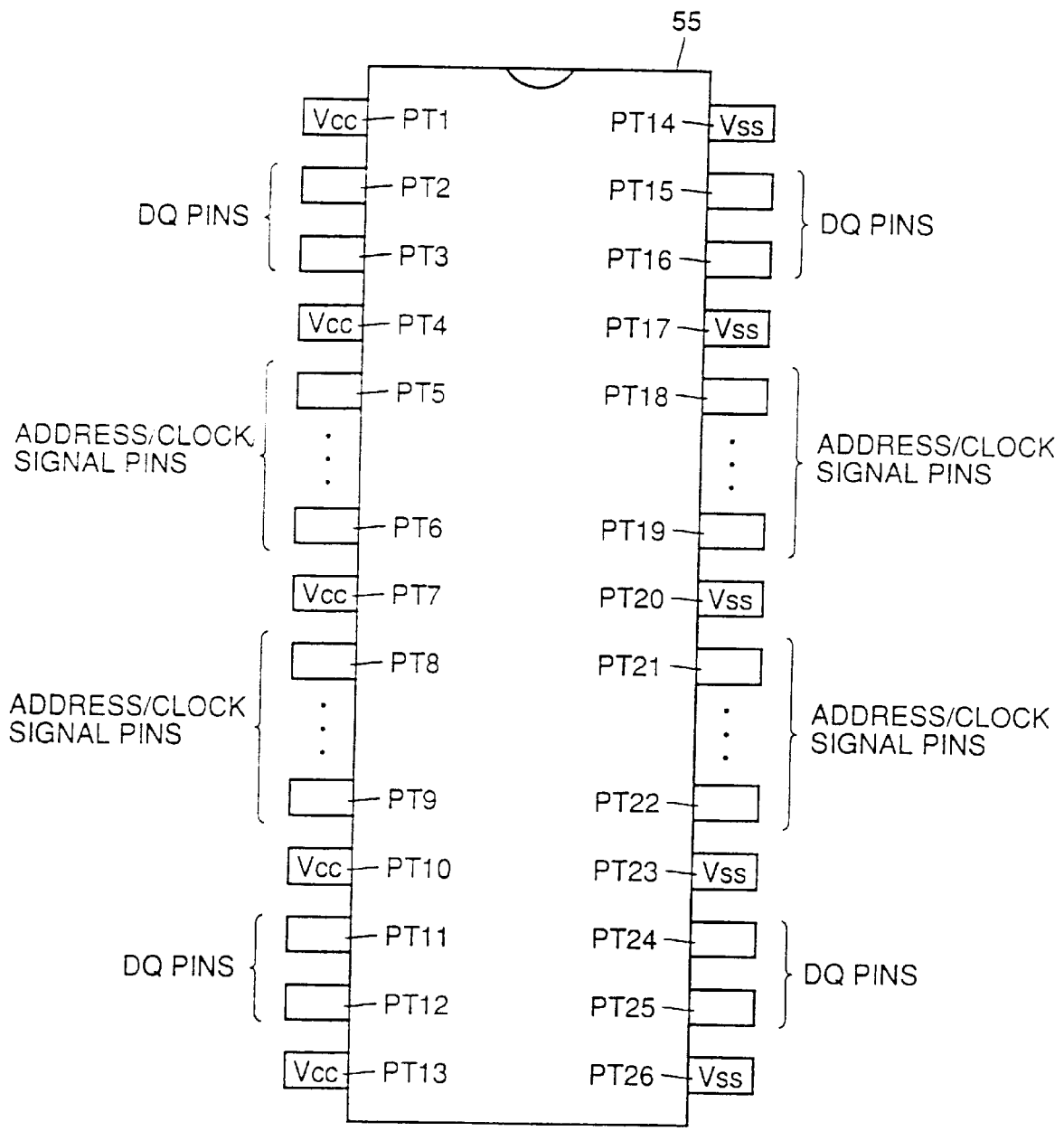
FIG. 9 is a diagram showing another arrangement of external pin terminals of the semiconductor memory device according to the present invention.

FIG. 9 is a diagram showing another arrangement of external pin terminals of the semiconductor memory device according to the present invention. In FIG. 9, external pin terminals provided outside the package are generally shown. Referring to FIG. 9, power supply pin terminals PT1 and PT13 for applying power supply voltage Vcc are arranged at both end portions on one side extending in the long side direction of a package 55, and pin terminals PT14 and PT26 for applying ground voltage Vss are arranged at both end portions on the other side extending in the long side direction of package 55. Data pin terminals PT2 and PT3 for input/output a data signals are arranged adjacent to power supply pin terminal PT1, and external data pin terminals PT11 and PT12 for input/output of data signals are arranged adjacent to power supply pin terminal PT13 on the other side. Similarly, pin terminals PT15 and PT16 for input/output of a data signal are arranged adjacent to ground pin terminal PT14, and pin terminals PT24 and PT25 for input/output of data signals are arranged adjacent to a ground pin terminal PT26.

In the structure shown in FIG. 9, a pin terminal PT4 for supplying power supply voltage Vcc is further arranged adjacent to data pin terminal PT3, and a pin terminal PT17 for applying ground voltage Vss is arranged adjacent to data input/output pin terminal PT16. Similarly, a power supply pin terminal PT10 for supplying power supply voltage Vcc is arranged adjacent to pin terminal PT11, and a ground pin terminal PT23 for supplying ground voltage Vss is arranged adjacent to data input/output pin terminal PT24. Power supply voltage Vcc applied to pin terminals PT1 and PT4 and ground voltage Vss applied to pin terminals PT14 and PT17 serve as the power supply voltage for the data input/ output buffers carrying out input/output of data to and from pin terminals PT15 and PT16. Similarly, power supply voltage Vcc applied to pin terminals PT10 and PT13 and ground voltage Vss applied to pin terminals PT23 and PT26 are used only by the data input/output buffers for carrying out input/output of data to and from pin terminals PT11, PT12, PT24, and PT25.

A pin terminal PT7 for supplying power supply voltage Vcc is arranged at the center portion of package 55. Similarly, a ground pin terminal PT20 for supplying ground voltage Vss is arranged corresponding to pin terminal PT7. Pin terminals PT5–PT6 for input of an address signal and a clock signal (external control signal) are arranged between pin terminals PT4 and PT7. Similarly, pin terminals PT8–PT9 for input of an address signal and a clock signal are arranged between pin terminals PT7 and PT10. Further, pin terminals PT18–PT19 for input of an address signal and a clock signal are arranged between pin terminals PT20 and PT17, and pin terminals PT21–PT22 for input of an address signal and a clock signal are arranged between pin terminals PT20 and PT23. Power supply voltages Vcc and Vss applied to pin terminals PT7 and PT20 arranged in the center portion of package 55 are used only by the peripheral circuitry receiving the address signal and the clock signal and generating an internal control signal.

As shown in FIG. 9, by arranging the power source pins so as to sandwich the data input/output pins therebetween, the power source voltage (Vcc and Vss) can be supplied to the data input/output buffers from the pin terminals on both sides thereof, and the variation of power supply voltage depending on the distances of the data input/output buffers from the pads (variation of voltage caused by interconnection line resistance) can be prevented. Further, by supplying the power source voltage (Vcc and Vss) from two pin terminals, the current supplying capability for the input/output buffers becomes larger, and the power supply or source voltage can be supplied to the respective data input/output buffers stably.

Figure 10:
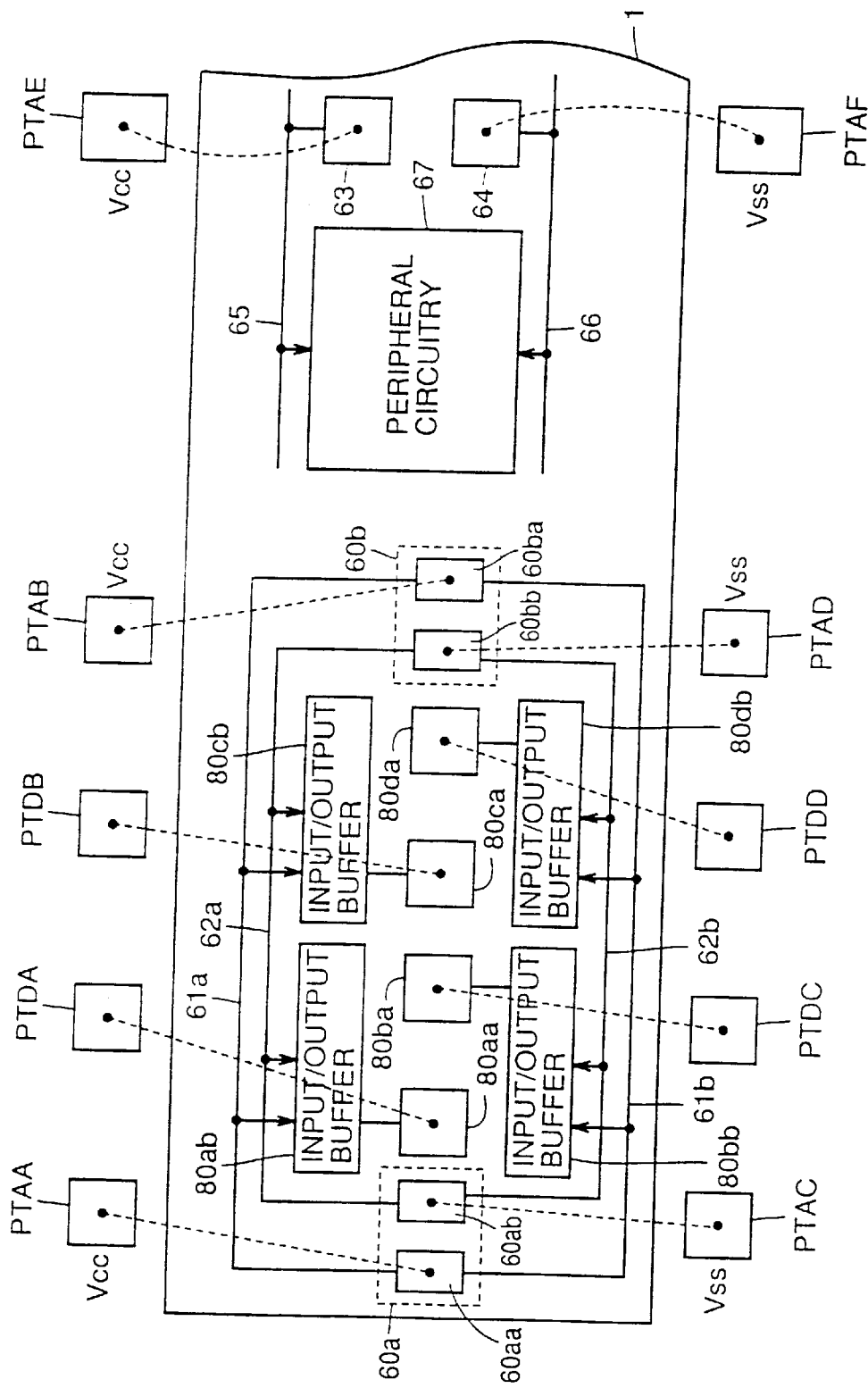
FIG. 10 is a diagram schematically showing an internal layout of a semiconductor memory device having the arrangement of external pin terminals shown in FIG. 9.

FIG. 10 is a diagram showing a layout of pads and circuits of a semiconductor memory device having the pin arrangement shown in FIG. 9. FIG. 10 shows only a half of the package shown in FIG. 9. A layout in symmetry with the structure shown in FIG. 10 is also arranged on a chip housed in the package. In FIG. 10, data input/output buffers and peripheral circuitry are emphasized, and memory blocks are not shown.

In FIG. 10, pin terminals arranged outside semiconductor chip 1 are also illustratively shown. The pin terminals include a power supply pin terminal PTAA arranged at one end on one side of semiconductor chip 1 for supplying power supply voltage Vcc, data input/output pin terminals PTDA and PTDB arranged adjacent to pin terminal PTAA, and a pin terminal PTAB arranged adjacent to data input/output pin terminal PTDB for supplying power supply voltage Vcc. A power supply pin terminal PTAE for supplying power supply voltage Vcc for the peripheral circuitry is arranged facing to the center portion of semiconductor chip 1.

Similarly, on the other side of semiconductor chip 1, ground pin terminals PTAC and PTAD for supplying ground voltage Vcc are arranged corresponding to power supply pin terminals PTAA and PTAB, and data input/output pin terminals PTDC and PTDD are arranged between these pin terminals PTAC and PTAD. In the center portion of semiconductor chip 1, a pin terminal PTAF for supplying ground voltage Vss is arranged opposing to power supply pin terminal PTAE.

Power supply pin terminals PTAA and PTAC are connected to a power source pad 60a, and pin terminals PTAB and PTAD are connected to a power source pad 60b. Power source pad 60a includes a pad 60aa receiving power supply voltage Vcc from pin terminal PTAA, and a pad 60ab receiving ground voltage Vss from ground pin terminal PTAC. Power source pad 60b includes a pad 60ba receiving power supply voltage Vcc from pin terminal PTAB, and a pad 60bb receiving ground voltage Vss from pin terminal PTAD. Between power source pads 60a and 60b, arranged are data input/output pad portions for transmitting and receiving a data signal to and from pin terminals PTDA–PTDD. In FIG. 10, a pad 80aa transmitting and receiving a data signal to and from an input/output buffer 80ab, a pad 80ba transmitting and receiving a data signal to and from an input/output buffer 80bb, a pad 80ca transmitting and receiving a data signal to and from an input/output buffer 80ca, and a pad 80da transmitting and receiving a data signal to and from an input/output buffer 80dd are shown. These pads 80aa–80da are shown being arranged in alignment. Data input/output pads 80aa, 80ba, 80ca, and 80da are connected to pin terminals PTDA, PTDC, PTDB, and PTDD, respectively, as shown by broken lines in FIG. 10.

Power supply voltage supply lines 61a and 61b are arranged extending from power supply pads 60aa and 60ba so as to surround input/output buffers 80ab, 80bb, 80cb and 80db, and ground voltage supply lines 62a and 62b are arranged extending from ground pads 60ab and 60bb so as to surround input/output buffers 80ab, 80bb, 80cb and 80db. Power supply voltage supply line 61a and ground voltage supply line 62a (collectively referred to as a power supply interconnection line) supply power source voltage Vcc and Vss to input/output buffers 80ab and 80cb, and power supply interconnection lines 61b and 62b supply power source voltage Vcc and Vss to input/output buffers 80bb and 80db. Since input/output buffers 80ab–80db are supplied with power source voltage Vcc and Vss from two power source pads 60a and 60b, respectively, variation of power source voltage on power supply interconnection lines 61a, 61b, 62a, and 62b at the time of operation of these input/output buffers 80ab–80db can be sufficiently suppressed, and input/output buffers 80ab–80db can operate stably with the stable power source voltage supplied.

On the other hand, pads 63 and 64 are arranged opposing to pin terminals PTAE and PTAF for the peripheral circuitry. Pads 63 and 64 are connected to corresponding lead terminals PTAE and PTAF by bonding wires shown by broken lines in the figure, and supplied with power supply voltage Vcc and ground voltage Vss therefrom. Pad 63 supplies power supply voltage Vcc onto a power supply voltage supply line 65, and pad 64 supplies ground voltage Vss onto a ground voltage supply line 66. Peripheral circuitry 67 arranged adjacent to pads 63 and 64 operates with the voltages Vcc and Vss on power supply interconnection lines 65 and 66 as the operation power supply voltage. Power supply interconnection lines 65 and 66 connected to pads 63 and 64 supply the power source voltage only to peripheral circuitry 67. Similarly, only power supply interconnection lines supplying the power source voltage to the input/output buffers for transmission and reception of data signals are connected to power source pads 60a and 60b. No power supply interconnection lines for supplying the power source voltage to the other peripheral circuits are connected to power supply pads 60a and 60b. Therefore, even if power supply and ground voltages on power supply interconnection lines 61a, 61b, 62a, and 62b vary at the time of input/output of a data signal, power supply interconnection lines 65 and 66 for peripheral circuitry 67 are not affected by the power source voltage variation, and can maintain a stable power source voltage. Accordingly, peripheral circuitry 67 can operate stably without the influence of variation of the power source voltage at the time of input/output of a data signal.

Figure 11:
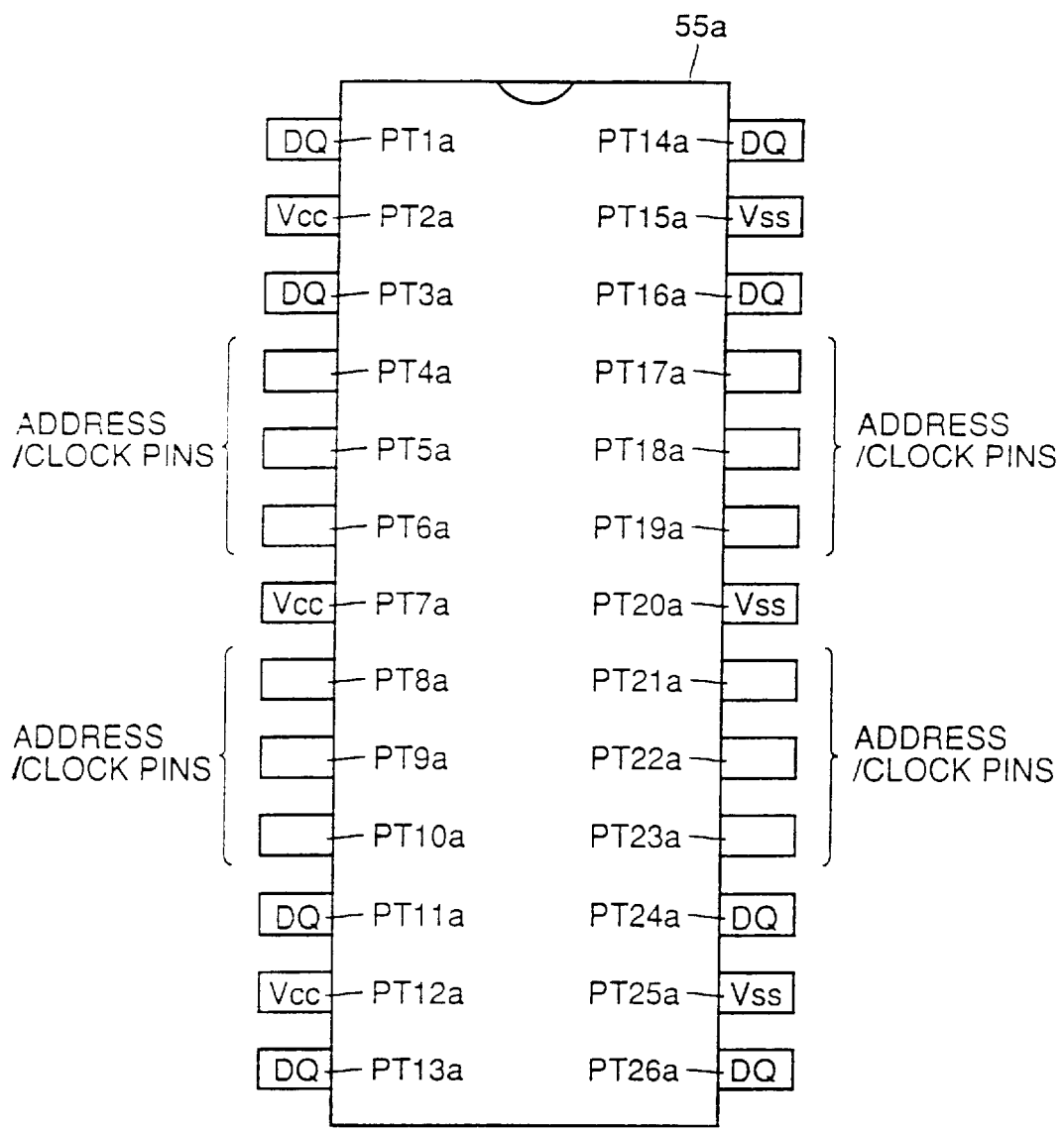
FIG. 11 is a diagram showing a further external pin arrangement of the semiconductor memory device according to the present invention.

FIG. 11 shows a pin arrangement of a package housing a semiconductor memory device according to a further embodiment of the present invention. In the arrangement according to the further embodiment, a power source pin is sandwiched between data input/output pin terminals. More specifically, at one end on one side of a package 55a, a power supply pin terminal PT2a receiving one power supply voltage Vcc is placed between data input/output pin terminals PT1a and PT3a, and at the other end of the one side of the package, a power supply pin terminal PT12a is placed between data input/output pin terminals PT11a and PT13a.

On the other side of the package 55a, a ground pin terminal PT15a receiving another power supply voltage (ground potential) Vss is located between data input/output pin terminals PT14a and PT16a at one end, and a ground pin terminal PT25a is located between data input/output pin terminals PT24a and PT26a at the other end. Power supply pin terminal PT2a are arranged opposing to ground pin terminal PT15a, and power supply pin terminal PT12a and ground pin terminal PT25a are arranged opposing to each other.

A power supply pin terminal PT7a receiving the power supply voltage Vcc for peripheral circuitry is arranged at a center portion on one side of the package 55a, and a ground pin terminal PT20a is at a center portion on the other side of package 55a.

Pin terminals PT4a–PT6a, PT8a–PT10a, PT17a–PT19a and PT21a–PT23a are peripheral circuitry relating pin terminals receiving address signals or clock (control) signals.

Figure 12:
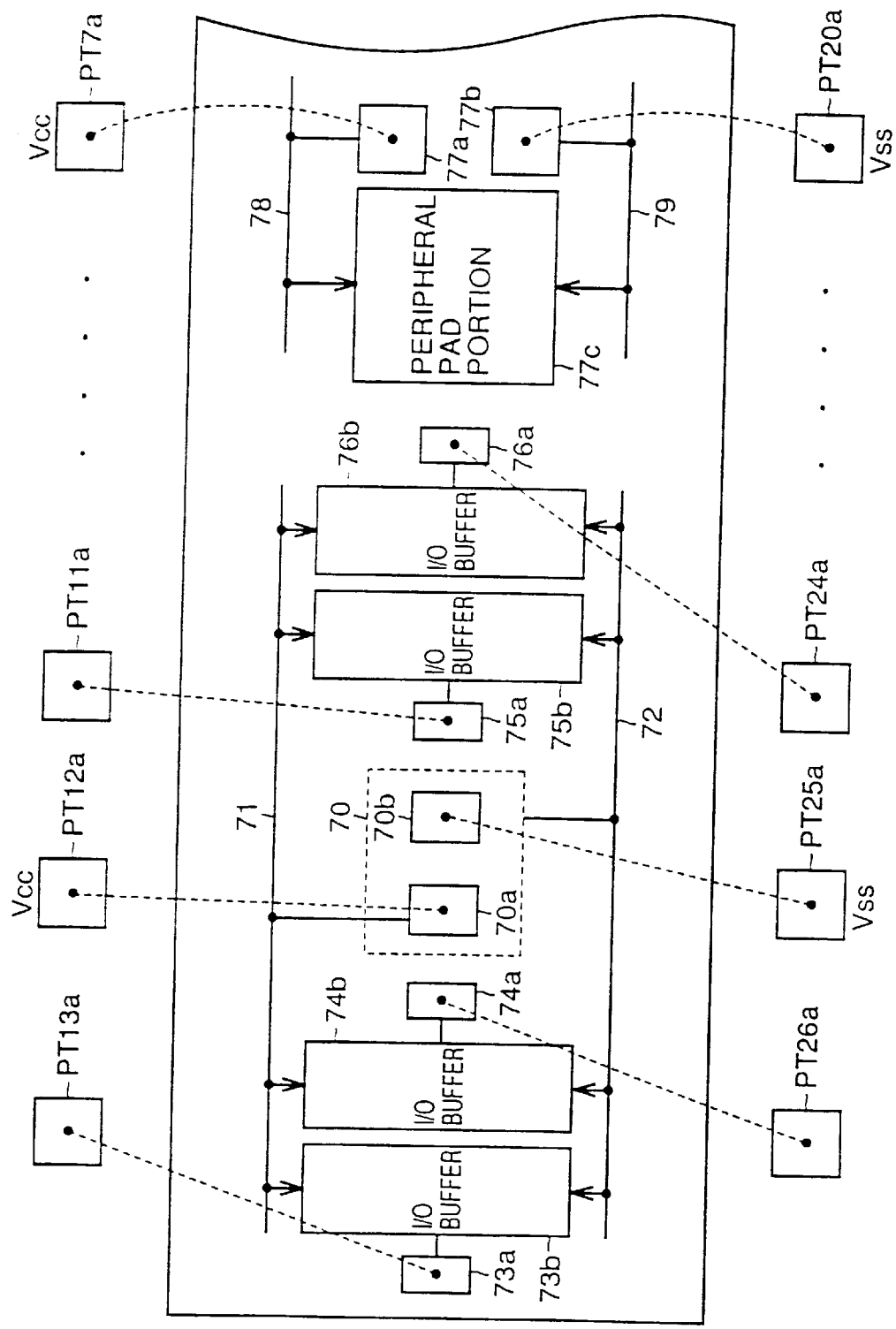
FIG. 12 is a diagram showing an inner pad layout of the semiconductor memory device in the package of FIG. 11.

FIG. 12 shows an inner layout of the semiconductor memory device housed in package 55a shown in FIG. 11. In FIG. 12, memory blocks are not shown for simplicity of illustration, and in addition only one end portion of the semiconductor memory device is shown.

Referring to FIG. 12, a power pad (power source pad) 70 is arranged between data input/output pads 74a and 75a. Power pad 70 includes a power supply pad 70a connected to a frame lead (pin terminal) PT25a.

Pad 74a is connected to a frame lead PT26a and is also connected to an data input/output buffer (I/O buffer) 74b arranged adjacent thereto. Adjacent to I/O buffer 74b, an I/O buffer 73b is arranged which is connected to a data input/output pad 73a connected to a frame lead PT13a.

Adjacent to ground pad 70b, a data input/output pad (DQ pad) 75b is arranged which is connected to an I/O buffer 75b and also to a frame lead PT11a. Adjacent to I/O buffer 75b, an I/O buffer 76b is arranged which is connected to a DQ pad 76a connected to a frame lead PT24a.

A set of a DQ pad and an I/O buffer constitutes a DQ pad portion. Thus, DQ pad portions 73 (73a, 73b), 74 (74a, 74b), 75 (75a, 75b) and 76 (76a, 76b) and power pad 70 are arranged in alignment in the first direction.

I/O buffers 73b, 74b, 75b and 76b are supplied with power supply voltage Vcc through a power supply line 71 from pad 70a, and with ground potential Vss through a ground line 72.

I/O buffers 73b and 74b and I/O buffers 76b and 75b are symmetrically arranged with respect to the power pad 70, and therefore each length of power supply line 71 and ground line 72 from the pad 70 is made equal for I/O buffers 73b and 74b and for I/O buffers 75b and 76b. The influence of a line capacitance and a line resistance of the power supply line 71 and ground line 72 on I/O buffer 73b and 74b can be made equal to that on I/O buffers 75b and 76bb. Thus, the influence of power supply voltage Vcc and ground potential Vss on output data determination timing can be made substantially equal for all I/O buffers 73b–76b, and an access time can be reduced, resulting in a fast access. In addition, the line resistance of power supply line 71 (ground potential line 72) for I/O buffers 73b and 74b can be made equal to that for I/O buffers 76b and 75b due to substantially equal line length, and substantially the same level power supply voltage is supplied to all the I/O buffers 73b, 74b, 75b and 76b, and the signal level provided by I/O buffers 73b–76b can be made the same with each other, and a reliable operation is ensured.

As for peripheral circuitry, a peripheral pad portion 77c is representatively shown which is supplied with the power supply voltage Vcc through a power supply line 78 from a power supply pad 77a which is provided at the center portion of the chip and is connected to a frame lead PT7a opposing thereto, and also is supplied with a ground potential Vss through a ground line 79 from a ground pad 77b. Ground pad 77b is provided at the center portion of the chip and is connected to an opposing frame lead PT20a.

The peripheral pad portion 77c includes a pad receiving an address signal or a clock signal from not shown frame lead, and a buffer for buffering a signal received from the included pad, as in the previously discussed embodiment. Meanwhile, the broken lines in FIG. 12 indicate bonding wires connecting frame leads to respective pads.

Figure 13:
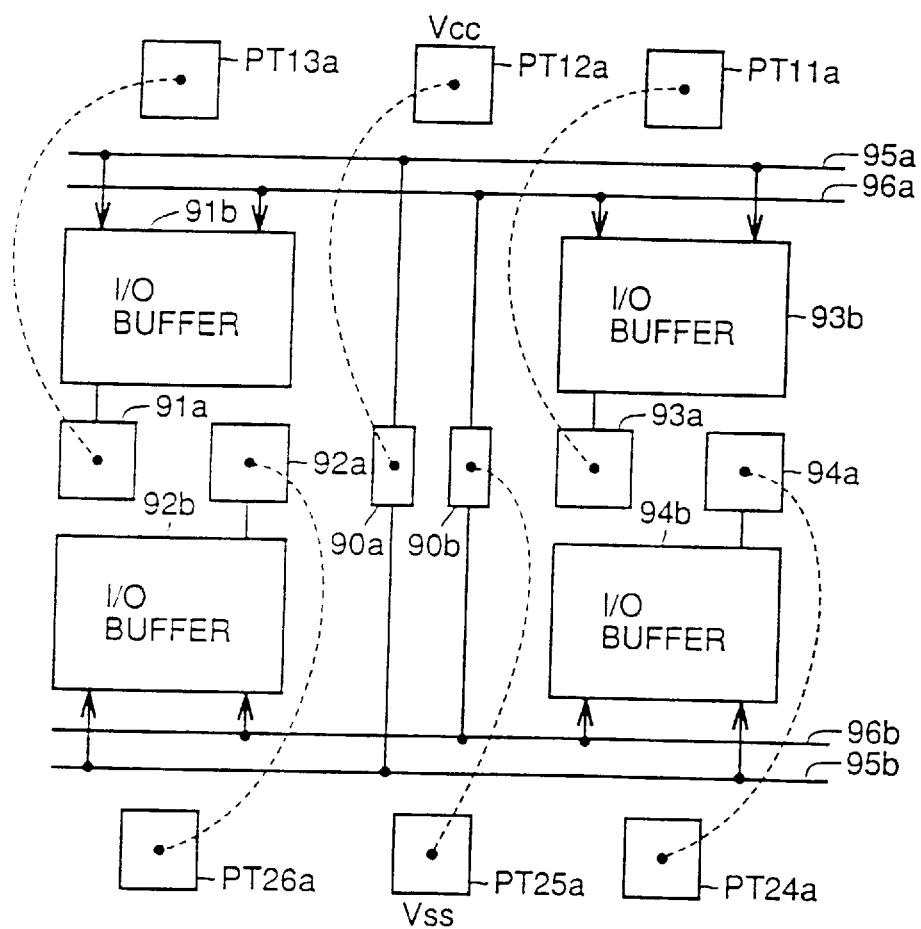
FIG. 13 is a diagram showing another inner pad layout of the semiconductor memory device in the package of FIG. 11.

FIG. 13 shows another inner layout of the semiconductor memory device housed in package 55a shown in FIG. 11. In FIG. 13, only a part relating to data input/output is shown.

Referring to FIG. 13, a power supply pad 90a is connected to a frame lead PT12a through a bonding wire shown by a broken line, to receive power supply voltage Vcc. A ground pad 90b is arranged adjacent to power supply pad 90a and is connected to frame lead PT25a through a bonding wire shown by the broken line, to receive ground potential Vss therefrom. I/O buffers 91b and 92b and I/O buffers 93b and 94b are symmetrically arranged with respect to the pads 90a and 90b. DQ pads 91a and 92a are arranged adjacent to I/O buffers 91b and 92b. Pad 91a is connected to I/O buffer 91b, and to frame lead PT13a through a bonding wire shown by a broken line. Pad 92a is connected to frame lead PT26a through a bonding wire shown by a broken line and to I/O buffer 92b.

DQ pads 93a and 94a are arranged adjacent to I/O buffers 93b and 94b. The pad 93a is connected to the opposing frame lead PT11a through a bonding wire shown by a broken line and to I/O buffer 93b. The pad 94a is connected to the opposing frame lead PT24a through a bonding wire shown by a broken line and to I/O buffer 94b.

Pads 90a, 90b, 91a, 92a, 93a and 94a are arranged in alignment with each other in the first direction in a region between I/O buffer 91b and 93b and I/O buffers 92b and 94b.

A power supply line 95a and a ground line 96a connected respectively to the power pads 90a and 90b are arranged on an outer side of I/O buffers 91b and 93b, and supply the power supply voltage and the ground potential to I/O buffers 91b and 93b.

On and along an outer side of I/O buffers 92b and 94b, a power supply line 95b and a ground line 96b connected respectively to the power pads 90a and 90b are arranged to supply the power supply voltage and the ground potential to I/O buffers 92b and 94b.

Interconnection lines extending from the pad 90a to power supply lines 95a and 95b are shown crossing over ground lines 96a and 96b, respectively. An interconnection line on a layer different from a ground line layer may be used for the interconnection lines to provide the cross over.

In the arrangement of FIG. 13, one power supply line 95 (95a or 95b) and one ground line 96 (96a or 96b) are required to drive only two I/O buffers, and the load on these lines are mitigated so that I/O buffers operates reliably with stable feeding of the power supply voltage and the ground potential.

Figure 14:
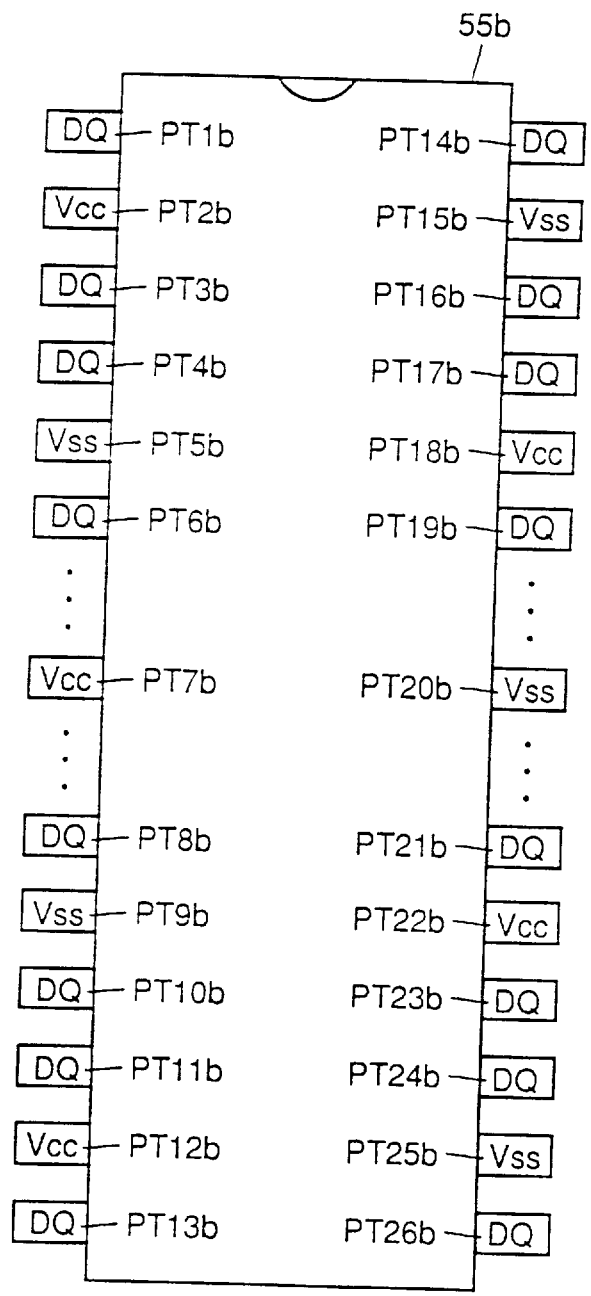
FIG. 14 is a diagram showing a further another external pin arrangement of the semiconductor memory device according to the present invention.

FIG. 14 shows a further another pin arrangement of a package housing a semiconductor memory device of the present invention.

A package 55b includes 16 DQ pin terminals, i.e., DQ pin terminals PT1b, PT3b, PT4b, PT6b, PT8b, PT10b, PT11b and PT13b on one side of the package 55b and DQ pin terminals PT14b, PT16b, PT17b, PT19b, PT21b, PT23b, PT24b, and PT26b on the other side of package 55b.

In the pin arrangement of FIG. 14, a power supply pin terminal and a ground pin terminal are provided on each side of package 55b. More specifically, a power supply pin PT2b is placed between DQ pin terminals PT1b and PT3b, and a ground pin terminal PT5b is placed between DQ pin terminals PT4b and PT6b. A ground pin terminal PT9b is placed between DQ pin terminals PT8b and PT10b, and a power supply pin terminal PT12b is placed between DQ pin terminals PT11b and PT13b.

A ground pin terminal PT15b opposing to the pin terminal PT2b is placed between EQ pin terminals PT14b and PT16b, and a power supply pin terminal PT18b is placed between EQ pin terminals PT17b and 19b, opposing to ground pin terminal PT5b. A power supply pin terminal PT22b is placed between DQ pin terminals PT21b and PT23b, opposing to ground pin terminal PT9b, while a ground pin terminal PT25b is placed opposing to power supply pin terminal PT12b, between DQ pin terminals PT24b and PT26b.

A power supply pin terminal PT7b and a ground pin terminal PT20b at the center portion of package 55b are used for supplying a power supply voltage and a ground potential to peripheral circuitry of the semiconductor memory device housed in package 55b.

In LOC structure, power pads are arranged in a center region of a memory chip, and an inner interconnection line layout is not influenced by which power pin is arranged on which side of package 55b. In addition, the pin arrangement of FIG. 14 provides meritorious advantages as described below.

Figure 15:
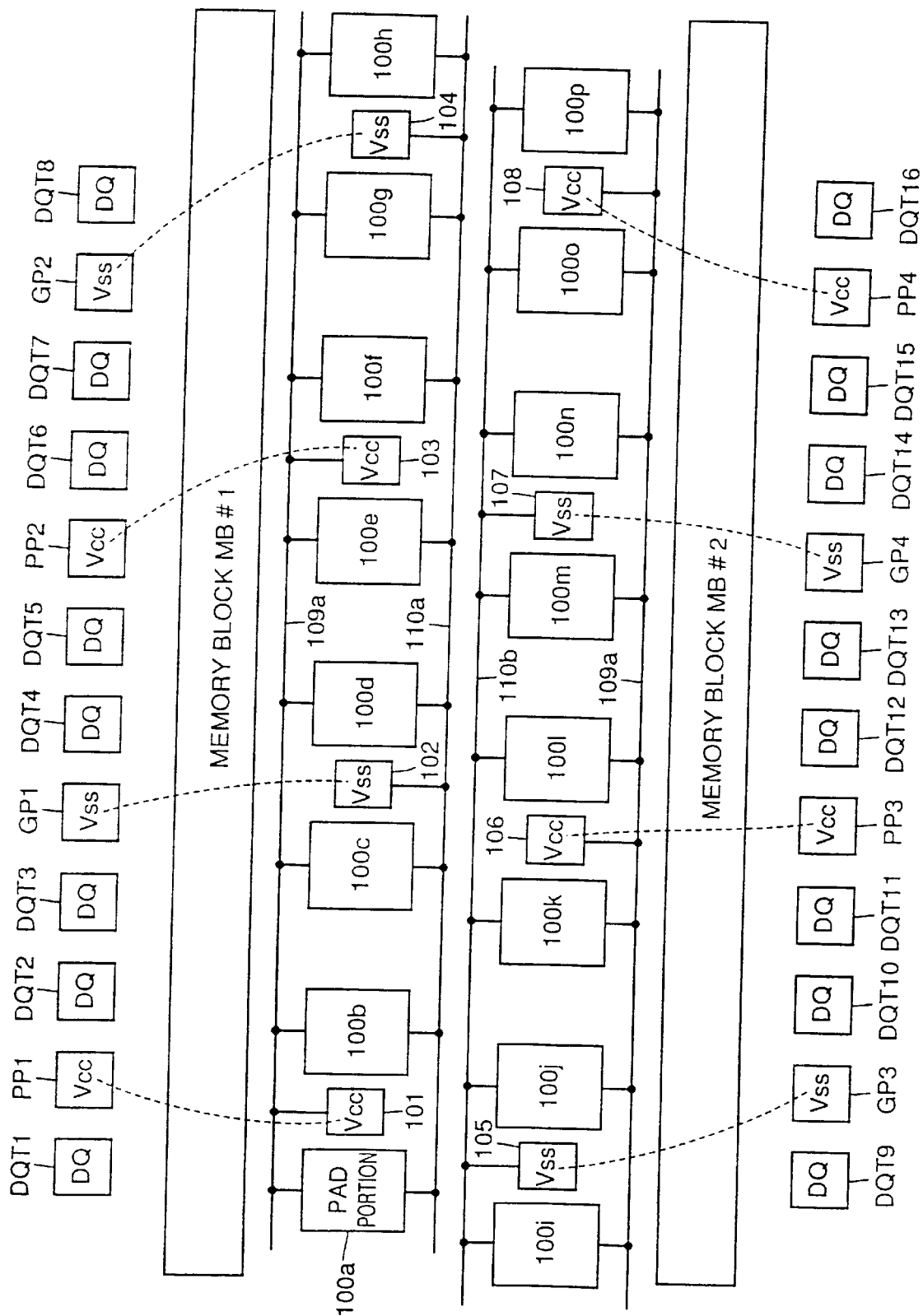
FIG. 15 is a diagram showing an inner pad layout of the semiconductor memory device in the package of FIG. 14.

FIG. 15 shows an inner layout of a semiconductor memory device housed in a package having a similar pin arrangement as that shown in FIG. 14. The memory device shown in FIG. 15 has a by-32 bit configuration in which 32 bit data is inputted or outputted, but only a portion relating to input/output of 16 bit data is representatively shown in FIG. 15.

Referring to FIG. 15, the memory device includes two memory blocks MB#1 and MB#2 each having 8 bit memory cells selected simultaneously. Between memory blocks MB#1 and MB#2, I/O (DQ) pad portions 100a–100h are arranged on a line for inputting/outputting data to/from memory block BM#1, and I/O pad portions 100p—100p are arranged in alignment with each other for inputting/outputting data to/from memory block MB#2.

A power supply pad 101 is arranged between pad portions 100a and 100b and is connected to an opposing power supply frame lead (pin terminal) PP1, and a ground pad 102 is placed between pad portions 100c and 100d and is connected to a corresponding ground frame lead GP1. A power supply pad 103 is placed between pad portions 100e and 100f and is connected to an opposing power supply frame lead PP2, and a ground pad 104 is placed between pad portions 100g and 100h and is connected to a corresponding ground lead GP2. Power supply pads 101 and 103 are connected to supply the voltage Vcc onto a power supply line 109a extending along one side of pad portions 100a–100h, and ground pads 102 and 104 are connected to supply the voltage Vss onto a ground line extending along the other side of the pad portions 100a–100h. DQ pad portions 100a–100h operate with the voltages Vcc and Vss on the lines 109a and 110a and 110a as the operation power supply voltages.

As for DQ pad portions 100i–100p, a ground pad 105 is placed between pad portions 100i and 100j and is connected to an opposing ground lead GP3, and a power supply pad 106 is placed between pad portions 100k and 100l and is connected to an opposing power supply lead PP3. A ground pad 107 is placed between pad portions 100m and 100n and is connected to an opposing ground lead GP3, and a power supply pad 108 is placed between pad portions 100o and 100p and is connected to an opposing or corresponding power supply lead PP3.

Ground pads 105 and 107 are connected to supply the ground potential onto a ground line 110b extending along one side of DQ pad portions 100i–100p in parallel with ground line 110a. Power supply pads 106 and 108 are connected to supply the power supply voltage onto a power supply line 109a extending along the other side of DQ pad portions 100i–100p.

DQ pad portions 100i–100p operate with the voltages Vcc and Vss on the lines 109b and 110b as the operation power supply voltages. DQ pad portions 100a–100h are connected to respective DQ frame leads DQT1–DQT16 provided correspondingly thereto.

Arrangement of DQ pad portions 100a–100p on two lines in a zigzag fashion allows the placement of a large number of DQ pad portions in a limited area with a sufficient area margin in the first direction, to mitigate the pitch condition on the DQ pad portions.

By arranging both the power supply pin and the ground pin on each side of the package, the power supply pad and the ground pad can be arranged in alignment with DQ pad portions on a line. A set of the power supply line and the ground line can be separately arranged for one group of DQ pad portions on one line and for the other group of DQ pad portions on the other line, facilitating the layout of the power supply line and the ground line for the staggeredly arranged DQ pad portions. One power supply line is supplied with the power supply voltage from a plurality of power supply pad and one ground line is supplied with the ground potential from a plurality of ground pads, and the voltages on these lines can be stabilized. These power lines are required to feed the power supply and ground voltages only to the corresponding DQ pad portions, leading to mitigation of the load on these lines to implement a stable and fast operation of DQ pad portions.

Figure 16:
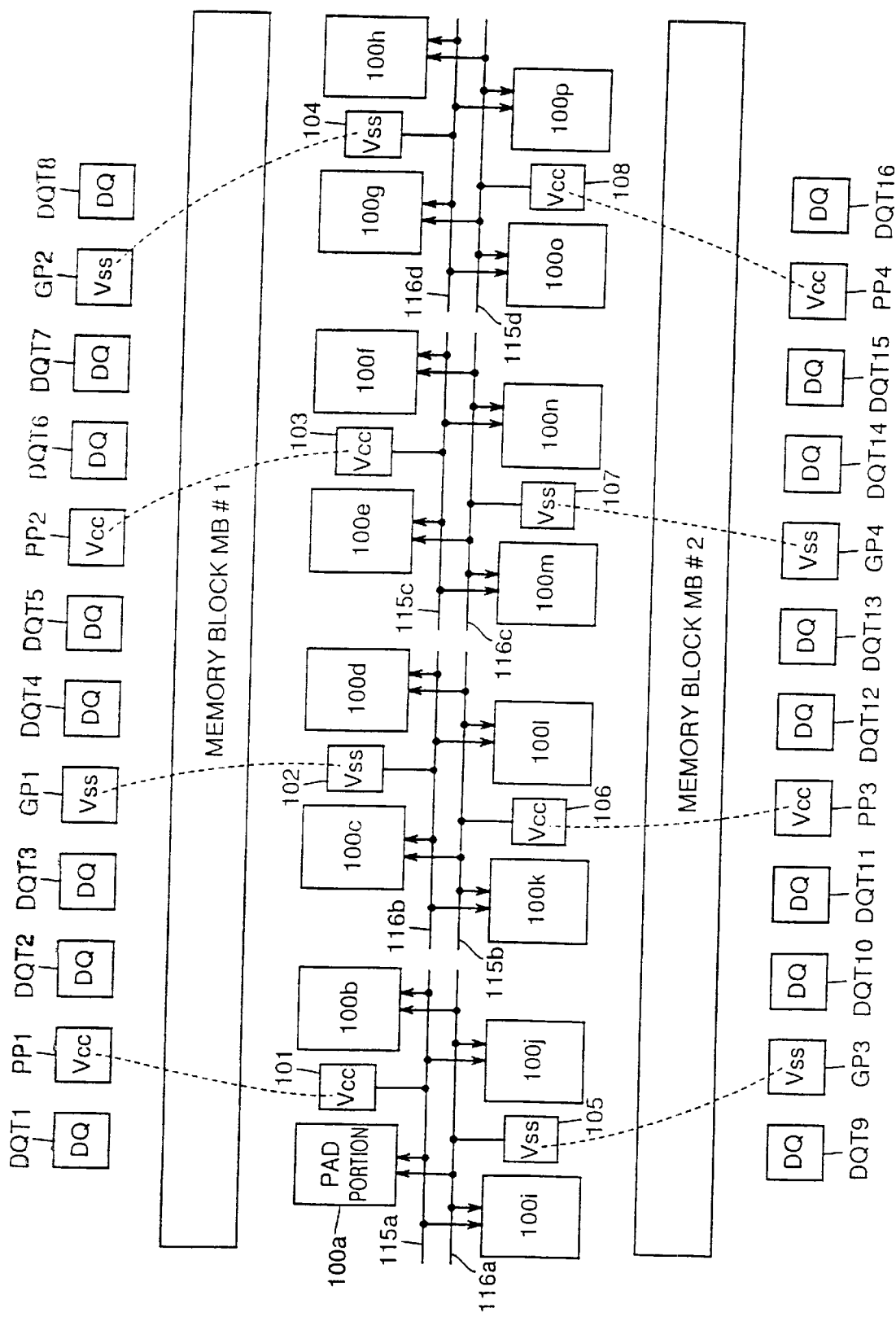
FIG. 16 is a diagram showing another inner pad layout of the semiconductor memory device in the package of FIG. 14 according to the present invention.

FIG. 16 shows a modification of the inner layout of the DQ pad portions, the power supply pads and the ground pads. The arrangement of FIG. 16 is the same as that of FIG. 15 except the arrangement of the power supply lines and the ground lines, and corresponding parts are denoted with the same reference characters or numerals as those in FIG. 15.

Referring to FIG. 16, power supply pad 101 is connected to a power supply line 115a, and ground pad 105 is connected to a ground line 116a. Power supply line 115a and ground line 116a are arranged in parallel between DQ pad portions 100a, 100b and DQ pad portion 100i, 100j to supply the voltages Vcc and Vss only to these DQ pad portions 100a, 100b, 100i and 100j.

Ground pad 102 is connected to a ground line 116b, and power supply pad 106 is connected to a power supply line 115b. The lines 115b and 116b are arranged in parallel between DQ pad portions 100c, 100d and DQ pad portions 100k, 100l to feed the voltages Vcc and Vss only to these DQ pad portions 100c, 100d, 100k and 100l.

Power supply pad 103 and ground pad 107 are connected respectively to a power supply line 115c and a ground line 116c which are arranged between DQ pad portions 100e, 100f and DQ pad portions 100m and 100n and supply the voltages Vcc and Vss only to DQ pad portions 100e, 100f, 100m and 100n.

Ground pad 104 and power supply pad 108 are connected respectively to a ground line 116d and a power supply line 115d which are arranged in parallel between DQ pad portions 100g and 100h and DQ pad portions 100o and 100p and feed the voltages Vss and Vcc only to the DQ pad portions 100g, 100h, 100o and 100p as the operation power supply voltages.

Power supply lines and ground lines are grouped and alternately arranged in a direction of the arrangement. Each set of one power supply line and one ground line is required to feed the operation power supply voltages Vcc and Vss only to a corresponding group of DQ pad portions. Thus, the power supply lines and the ground lines have reduced line capacitances and reduced line resistances as well as reduced load, so that the operation power supply voltages can be stably and reliably supplied to DQ pad portions. In addition, the power supply lines and the ground lines are arranged on two lines, resulting in a reduced interconnection line area and therefore an arrangement suitable for a high density and high integration memory device.

Figure 17:
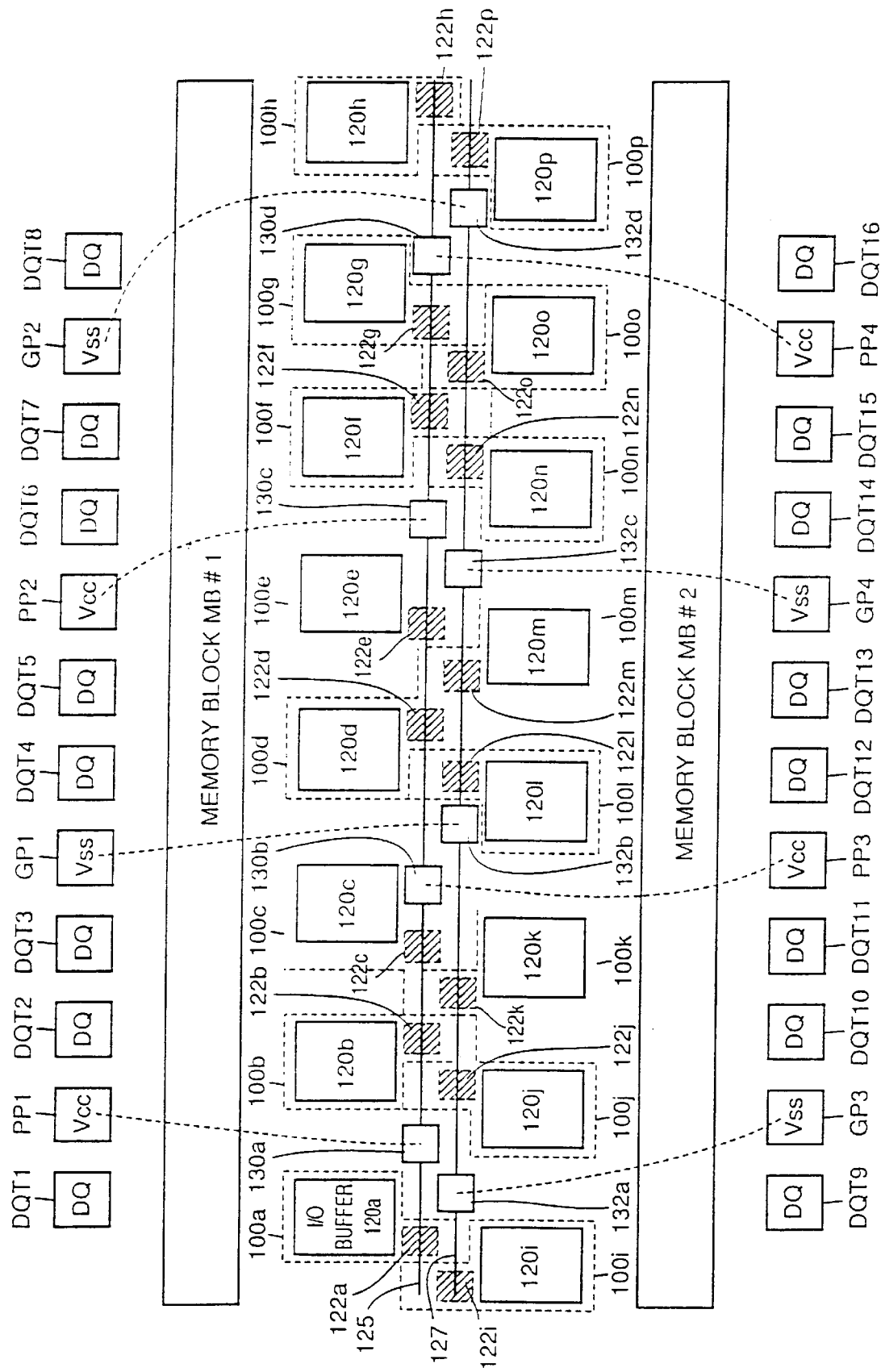
FIG. 17 is a diagram showing a further inner pad layout of the semiconductor memory device in the package of FIG. 14.

FIG. 17 is a further modification of an inner layout of the semiconductor memory device according to the present invention. In FIG. 17, an arrangement of the pin terminals (lead frame) is the same as that of FIGS. 15 and 16, and like reference characters indicate like components.

DQ pad portions 100a–100p are arranged staggeredly on two lines, like the arrangements of FIGS. 15 and 16. In FIG. 17, DQ pad portions 100a–100p each are shown including I/O buffers 120a–120p and DQ pads 122a–122p. DQ pads 122a–122p are connected to corresponding DQ frame leads DQT1–DQT16 through bonding wires which are not shown for simplicity of illustration.

Power supply pads 130a–130d are arranged on one line in alignment with DQ pads 122a–122h, and ground pads 132a–132d are arranged on another line in alignment with DQ pads 122i–122p. Power supply pads 130a–130d are connected to power supply frame leads PP1, PP3, PP2, and PP4 through bonding wires shown by broken lines, respectively, and ground pads 132a–132d are connected to ground frame leads GP3, GP1, GP4 and GP2 through bonding wires shown by broken lines, respectively.

A power supply line 125 is connected to power supply pads 130a–130d to supply the power supply voltage Vcc to DQ pad portions 100a–100p (I/O buffers 120a–120p) in common. A ground line 127 is connected to ground pads 132a–132d to supply the ground voltage Vss to DQ pad portions in common.

Power supply line 125 may include different interconnection lines on the same level interconnection layer for different sections between pads. For example, a power supply interconnection line between power supply pads 130a and 130b may be different or separated from a power supply interconnection line between power supply pads 130b and 130c. Such arrangement is also applied to ground line 127. Propagation of a power supply noise can be prevented.

In the arrangement of FIG. 17, operation power source voltage transmitting lines are arranged in two lines, and an interconnection line area can be reduced. In addition, this arrangement does not need alternate arrangement of the power supply lines and the ground lines, and the layout of the power supply lines and the ground lines can be facilitated.

Figure 18:
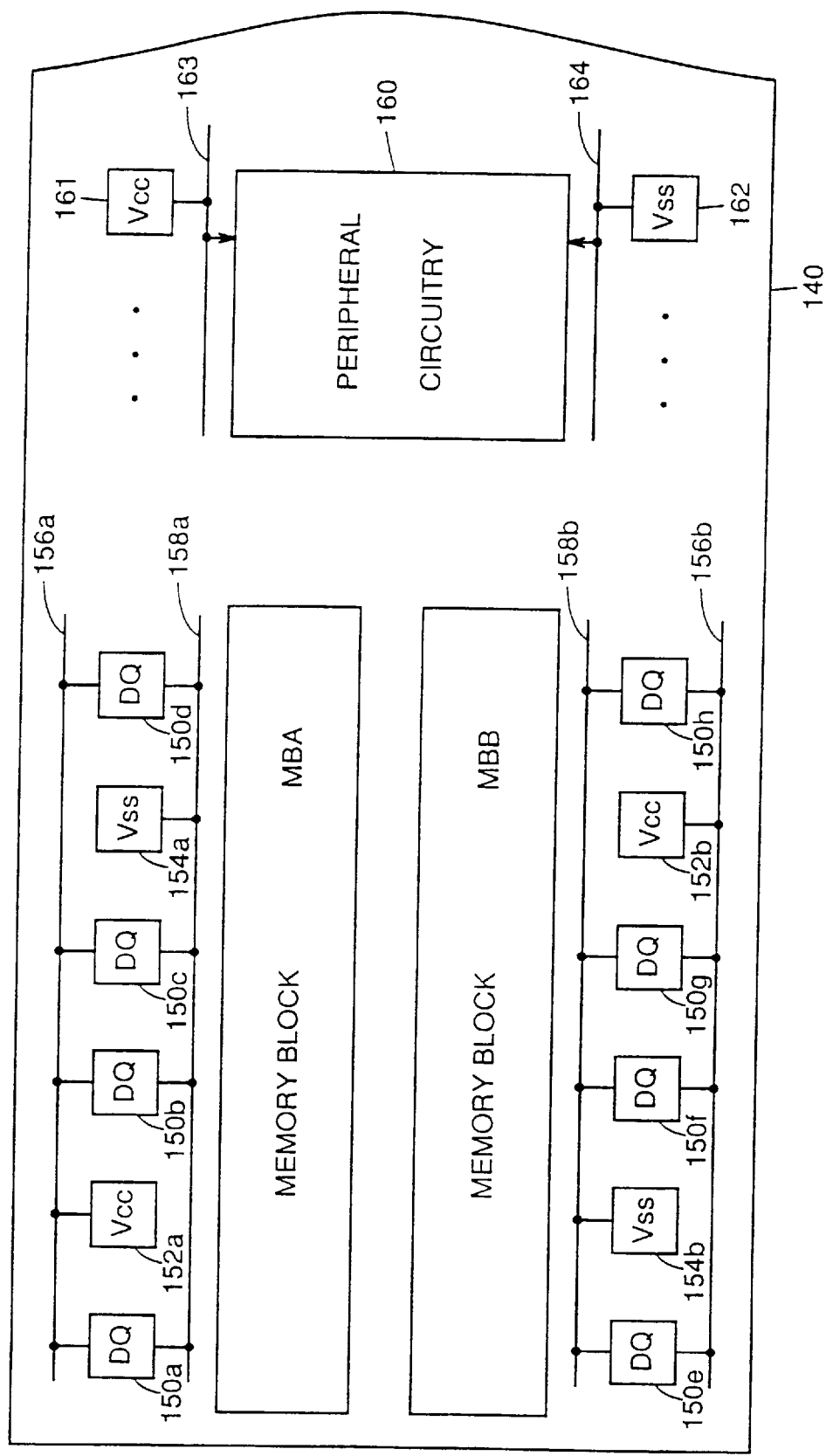
FIG. 18 is a diagram showing a further another inner pad layout of the semiconductor memory device in the package of FIG. 14.

FIG. 18 shows a still another inner layout of the semiconductor memory device housed in the package 55b shown in FIG. 14. A semiconductor memory device 140 shown in FIG. 18 does not have LOC structure, but has a peripheral arrangement of pads. More specifically, on an outer side of a memory block MBA, DQ pad portions 150a–150h, a power supply pad 152a and a ground pad 154 are arranged in alignment with each other. On an outer side of a memory block MBB, DQ pad portions 150e–150h, a ground pad 154b and a power supply pad 152b are arranged in alignment with each other.

Power supply pad 152a is placed between DQ pad portions and is connected to a power supply line 156a extending along and on one side of DQ pad portions 150a–150d, and ground pad 154a is placed between a ground line 158a extending on the other side of and along DQ pad portions 150a–150d.

Ground pad 154b is placed between DQ pad portions 150e and 150f, and power supply pad 152b is placed between DQ pad portions 150g and 150h. Ground line 158b and power supply line 156b extend along and on one and the other sides of DQ pad portions 150e–150h.

DQ pad portions 150a–150d and 150e–159h receive operation power supply voltages from corresponding power supply lines 156a and 156b and corresponding ground lines 158a and 158b for operation of data input/output to memory blocks MBA and MBB.

Due to alternate arrangement of the power supply pad and the ground pad on each respective side of the memory device of a peripheral arrangement of pads, the power supply line and the ground line can be arranged for each group of DQ pad portions with a minimum length, resulting in an enhanced layout ability and in stable feeding of operation power supply voltages.

Peripheral circuitry 160 at a center portion of memory device 140 receives the power supply voltage Vcc from a power supply pad 161 on one side through a power supply line 163 and the ground potential Vss from a ground pad 162 on the other side through a ground line 164 for access control operation.

Figure 19:
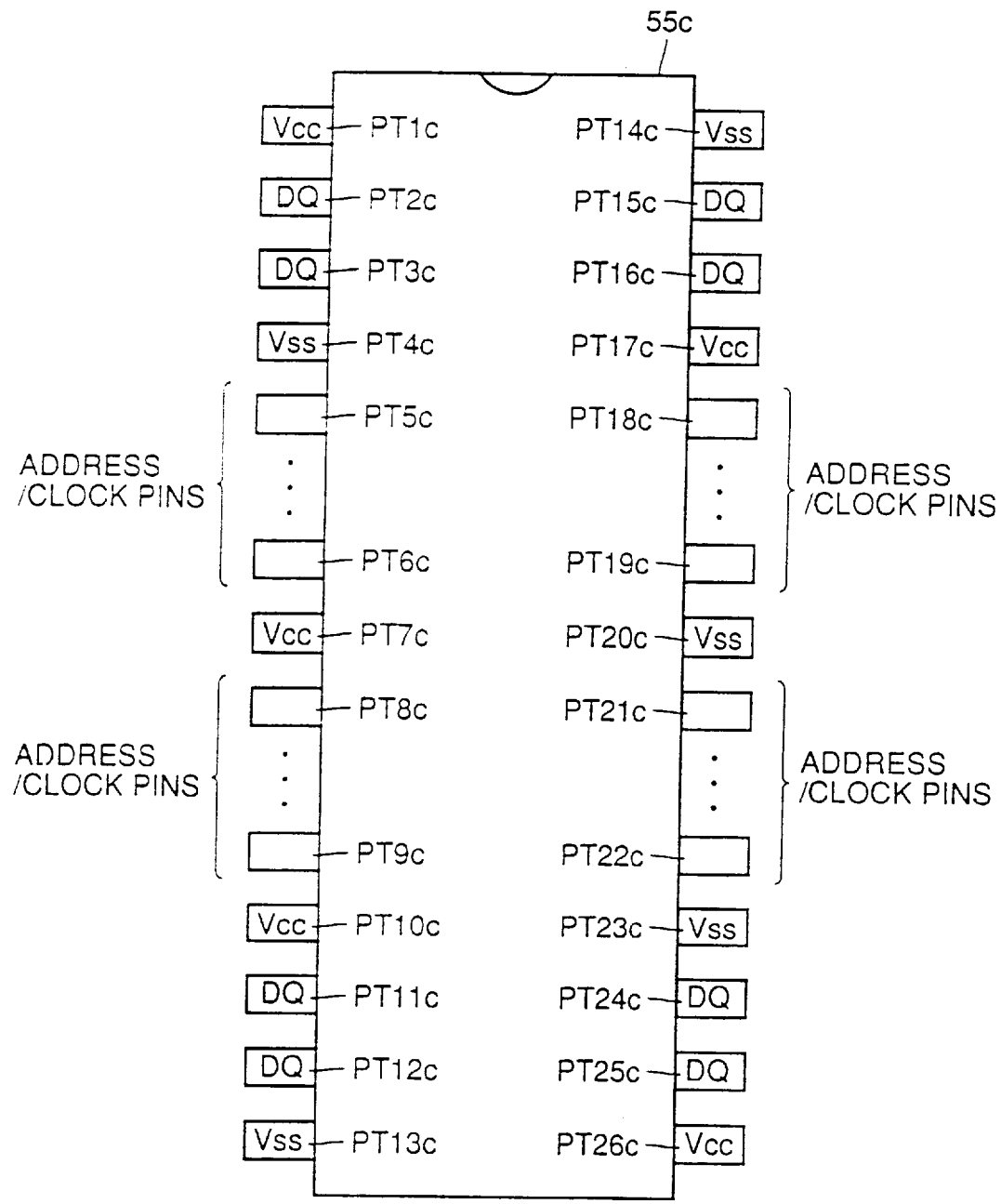
FIG. 19 is a diagram showing a still external pin arrangement of a semiconductor memory device according to the present invention.

FIG. 19 shows a further another pin arrangement of a memory package according to the present invention.

In the arrangement of FIG. 19, a power supply pin terminal receiving the power supply voltage and a ground pin terminal receiving the ground potential are provided sandwiching a set of data input/output pin terminals therebetween on each respective side of a memory package 55c. More specifically, on one side of memory package 55c, data input/output (DQ) pin terminals PT2c and PT3c are placed between a power supply pin terminal PT1c and a ground pin terminal PT4c at one end, and DQ pin terminals PT11c and PT12c are placed between a power supply pin terminal 10c and a ground pin terminal 13c at the other end.

On the other side of memory package 55c, DQ pin terminals PT15c and PT16c are sandwiched between a ground pin terminal PT14c and a power supply pin terminal PT17c at one end, and DQ pin terminals PT24c and PT25c are sandwiched between a ground pin terminal PT23c and a power supply pin terminal PT26c.

A power supply pin terminal PT7c and a ground pin terminal PT20c at a center portion on the respective sides of the package 55c are used for supplying the power supply voltage and the ground potential to peripheral circuitry receiving signals from address/clock pin terminals PT5c–PT6c, PT8c–PT9c, PT18c–PT19c, and PT21c–PT22c. The pin terminals PT1c–PT26c are provided corresponding to inner bonding pads of a memory device housed in the package 55c.

Figure 20:
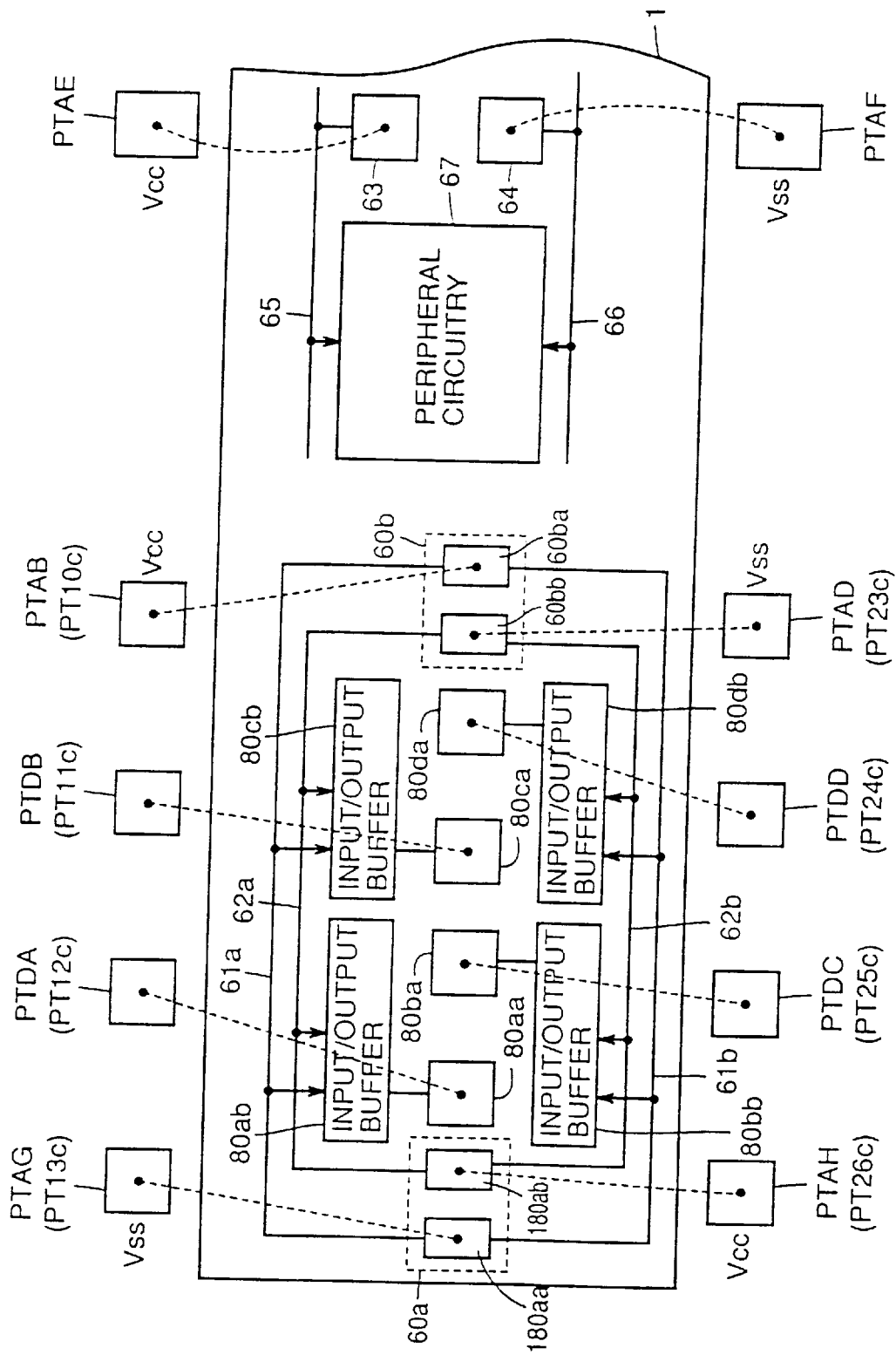
FIG. 20 is a diagram showing an inner pad layout of the semiconductor memory device in the package of FIG. 19.

FIG. 20 shows an inner layout of the memory device in package 55c of FIG. 19. In FIG. 20, a part related to input/output of 4 bit data is representatively shown, as in FIG. 10.

The arrangement of FIG. 20 is the same as that of FIG. 10 except the connection between the pad portion 60a and leads PTAE and PTAF. Corresponding components in FIG. 10 and FIG. 20 bear like reference characters or numerals.

Referring to FIG. 20, the pad portion (power pad) 60a includes a power supply pad 180aa connected to a power supply frame lead PTAH1 (pin terminal PT26c for example) through a bonding wire shown by a broken line, and a ground pad 180ab is connected to a ground frame lead PTAG (pin terminal PT13c for example) through a bonding wire shown by a broken line.

As clear from the comparison of the arrangements of FIGS. 10 and 20, the layout of the inner pads are the same with each other, and FIG. 20 arrangement provides the same meritorious advantage as FIG. 10 arrangement.

Meanwhile, the pin arrangement of FIG. 19 can also be applied to the peripheral arrangement of pads as shown in FIG. 18.

Figure 21:
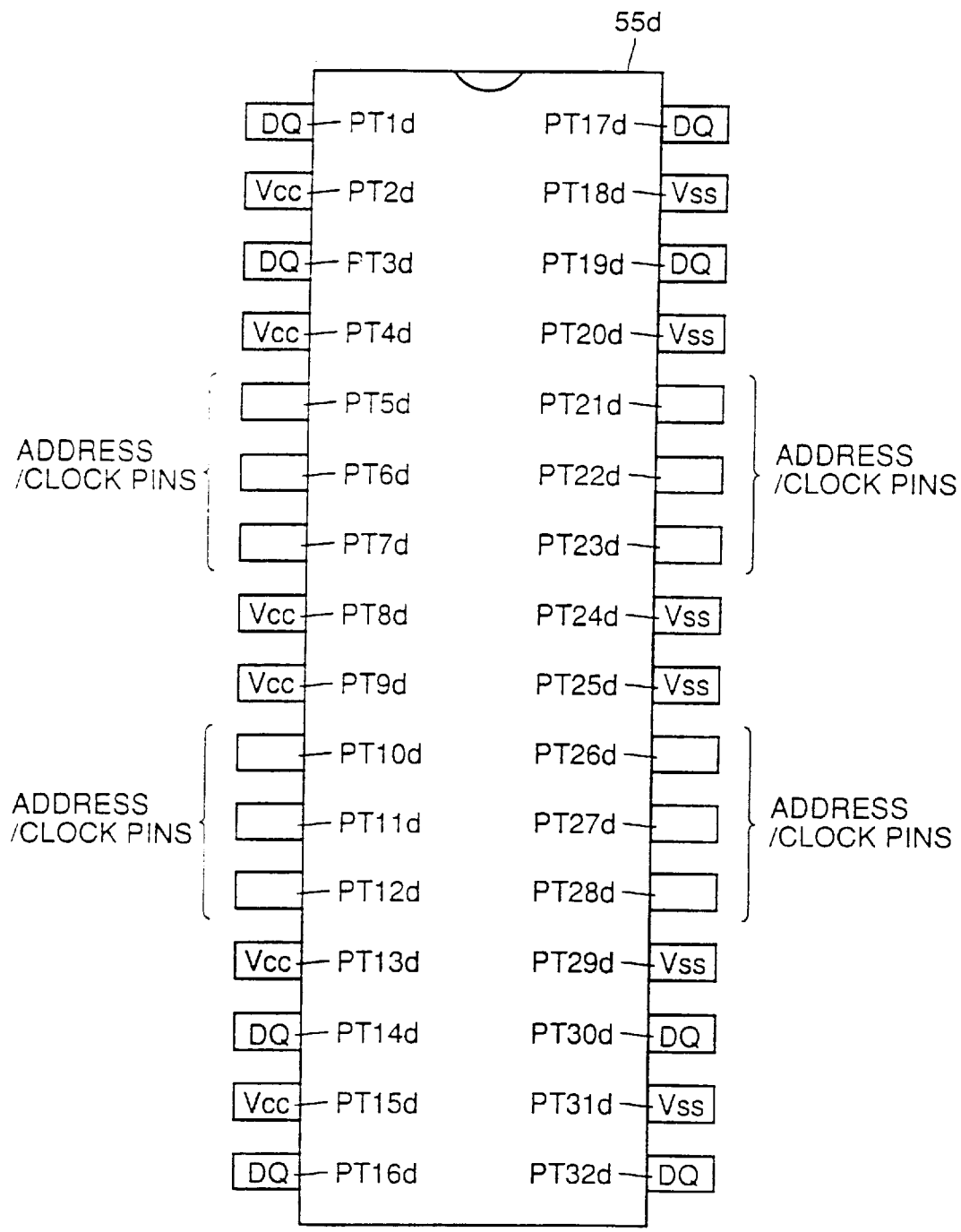
FIG. 21 is a diagram showing a still another external pin terminals of a semiconductor memory device according to the present invention.

FIG. 21 shows a still another pin arrangement of a memory package according to the present invention. In the pin arrangement of FIG. 21, address/clock pin terminals are sandwiched between power supply pin terminals or between ground pin terminals. More specifically, on one side of a memory package 55d, address/control pins PT5d–PT7d are placed between power supply pin terminals PT4d and PT8d, and address/clock pin terminals PT10d–PT12d are placed between power supply pin terminals PT9d and PT13d. On the other side of the package 55d, address/control pin terminals PT21d–PT23d are placed between ground pin terminals PT20d and PT24d, and address/control pin terminals PT26d–PT28d are placed between ground pin terminals PT25d and PT29d. Power supply pin terminals PT9d and PT10d are placed, at a center of memory package 55d, adjacent to each other and opposing to ground pin terminals PT24d and 25d.

As for DQ pin terminals, on one side of the package 55d, a power supply pin terminal PT2d is placed between DQ pin terminals PT1d and PT3d at one end, and a power supply pin terminal PT15d is placed between DQ pin terminals PT14d and PT16d at the other end. On the other side of memory package 55d, a ground pin terminal PT18d is placed between DQ pin terminals PT17d and PT19d at one end, and a ground pin terminal PT31d is placed between DQ pin terminals PT30d and PT32d.

Figure 22:
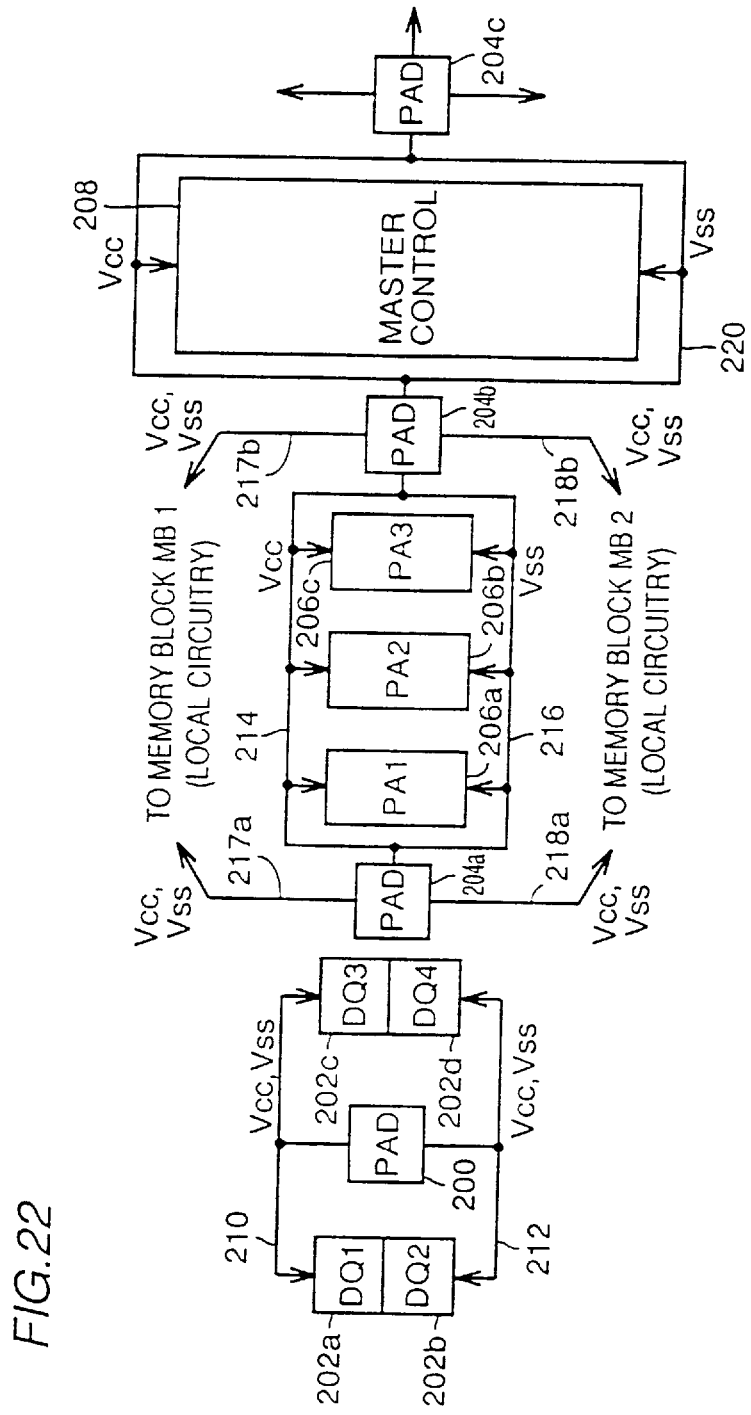
FIG. 22 is a diagram showing an inner pad layout of the semiconductor memory device in the package of FIG. 21.

According to the pin arrangement of FIG. 21, a powerful electric power source can be implemented for peripheral circuitry, as shown in FIG. 22.

FIG. 22 shows an inner layout of a semiconductor memory device housed in the package shown in FIG. 21. In FIG. 22, a layout of one of the one and the other ends of the memory device is representatively shown. In addition, memory blocks are not shown.

Referring to FIG. 22, a power pad portion 200 including a power supply pad and a ground pad is positioned between DQ pad portions (DQ1, DQ2) 202a, 202b and DQ pad portions (DQ3, DQ4) 202c, 202d. DQ pad portions 202a–202d each include an I/O buffer and a DQ pad. DQ pad portions (DQ1, DQ2) 202a, 202b receive the operation power supply voltage Vcc and Vss through a power line 210 including a power supply line and a ground line from pad portion 200, and DQ pad portions (DQ3, DQ4) receive the operation power supply voltages Vcc, Vss through a power line 212 from pad portion 200.

Peripheral pad portions (PA1–PA3) each including a peripheral pad and a buffer are arranged between power pads 204a and 204b. DQ pad portions 202a–202d, power pad portions 200, 204a, 204b and peripheral pad portions 206a–206c are arranged in alignment with each other. Peripheral pad portions 206a–206c are supplied with the power supply voltage Vcc through a power supply line 214 and with the ground potential Vss through a ground line 216 from power pad portions 204a and 204b. Power supply line 214 and ground line 216 each may be a power line depending on the structures of peripheral pad portions 206a–206c.

Pad portion 204a is also shown supplying the operation power supply voltages Vcc, Vss to a memory block MB1 (not shown) through a power line 217a and to another memory block MB2 (not shown) through a power line 218a. Power pad portion 204b is shown supplying the operation power supply voltages Vcc, Vss to memory block MB1 through a power line 217b and to memory block MB2 through a power line 218b.

A power pad 204c is arranged symmetrically with power pad 204b with respect to a master control circuit 208, which in turn receives the operation power supply voltages Vcc, Vss through a power line 220 from power pad portions 204b and 204c.

According to the arrangement of FIG. 22, peripheral pad portions 206a–106c and master control circuit 208 are supplied with the power supply voltage Vcc and ground potential Vss from two power pad portions, so that they can operate stably and reliably due to the strengthened power sources.

Meanwhile, in the pin arrangement of FIG. 21, Vcc and Vss pin terminals may be arranged on each side of the package 55d.

Figure 23:
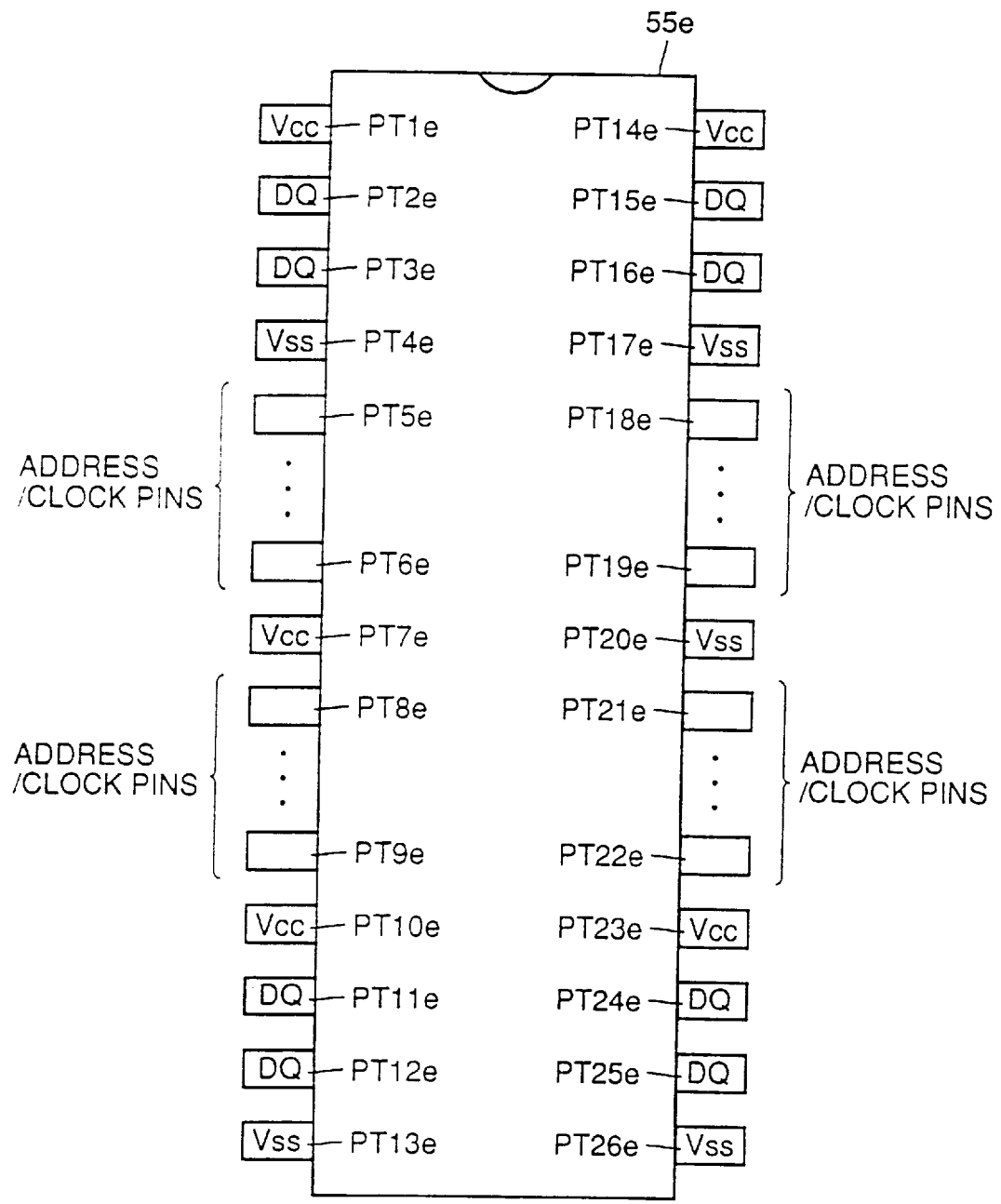
FIG. 23 is a diagram showing a still further another external pin arrangement of a semiconductor memory device according to the present invention.

FIG. 23 shows a still further another pin arrangement of a memory package housing a memory device according to the present invention. In the pin arrangement of FIG. 23, as for DQ power supply source, power supply pin terminals are arranged opposing to each other on opposite sides of a package 55e, and ground pin terminals are also arranged opposing to each other on opposite sides of package 55e, and power supply pin terminals and ground pin terminals are arranged on each respective side of package 55e. More specifically, a power supply pin terminal PT1e and a ground pin terminal PT4e sandwiching DQ pin terminals PT2e and PT3e therebetween at one end on one side of package 55e are arranged opposing respectively to a power supply pin terminal PT14e and a ground pin terminal PT17e sandwiching DQ pin terminals PT15e and PT16e on the other side of package 55e. On the other end of package 55e, a power supply pin terminal PT10e and a ground pin terminal PT13e sandwiching DQ pin terminals PT11e and PT12e on one side are arranged opposing respectively to a power supply pin terminal PT23e and a ground pin terminal PT26e on the other side of the package.

At a center portion of package 55e, a power supply pin terminal PT7e on the one side is arranged opposing to a ground pin terminal PT20e on the other side.

The voltages Vcc and Vss supplied to pin terminals PT7e and PT20e are used by peripheral circuitry operating on the signals received through address/clock pin terminals PT5e–PT6e, PT8e–PT9e, PT18e–PT19e and PT21e–PT22e.

Figure 24:
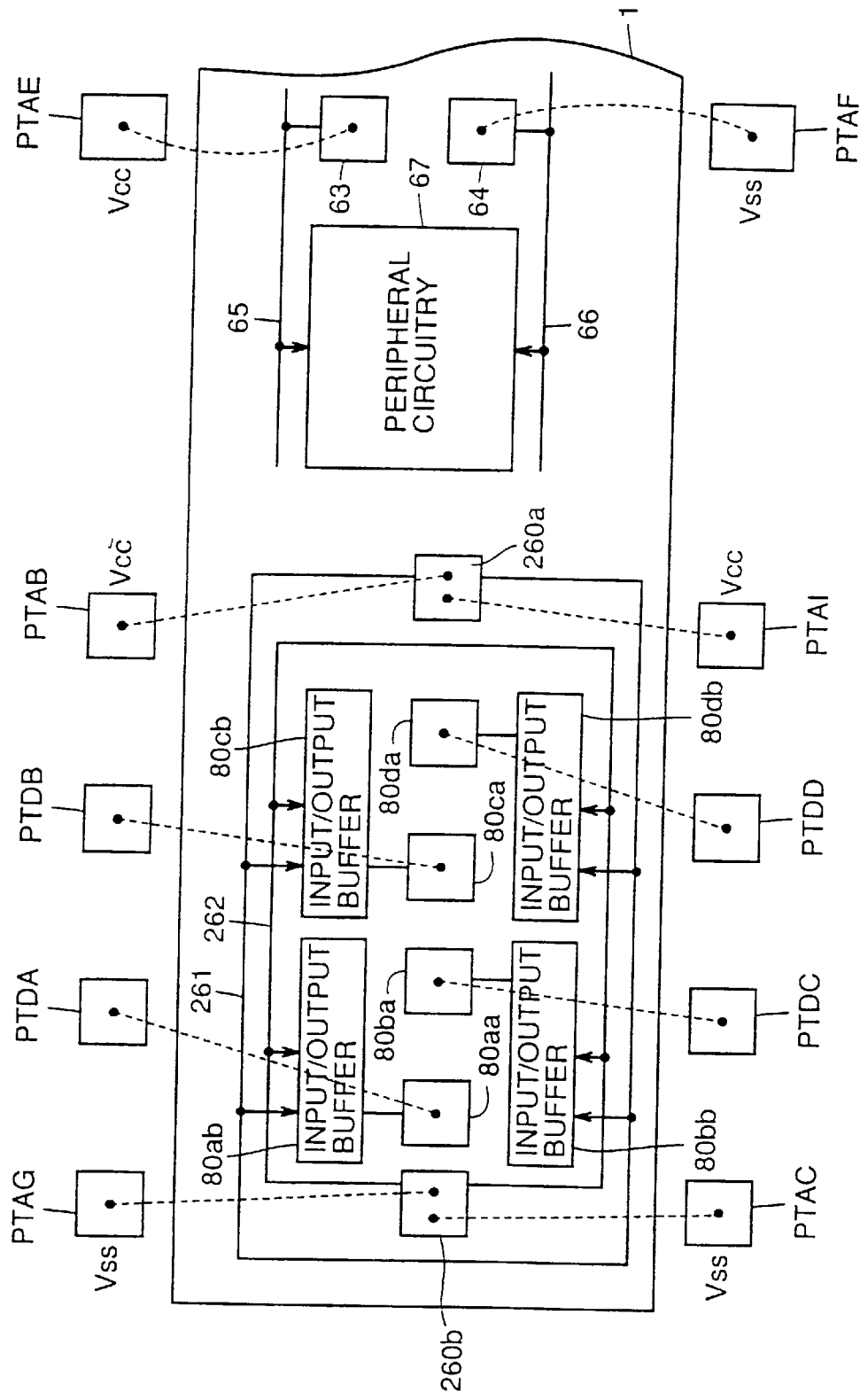
FIG. 24 is a diagram showing an inner pad layout of the semiconductor memory device in the package of FIG. 23.

FIG. 24 shows an inner layout of a memory device housed in the memory package shown in FIG. 23. The arrangement of FIG. 24 is the same as that of FIG. 20 except power pads, and like reference characters and numerals denote like components between FIGS. 20 and 24.

Referring to FIG. 24, a power supply pad 260a is connected to frame leads (pin terminals) PTAB and PTAI through bonding wires shown by broken lines on opposite sides of the memory device (chip), and a ground pad 260b is connected to ground frame leads (pin terminals) PTAG and PTAC on opposite sides through bonding wires shown by broken lines.

A power supply line 261 is connected to power supply pad 260a and is arranged to encompass DQ pad portions (I/O buffers and DQ pads), and a ground line 262 is connected to ground pad 260b and is arranged to encompass the DQ pad portions. Because power supply pad 260a is supplied with power supply voltage Vcc from two frame leads PTAB and PTAI, and ground pad 260b is supplied with ground potential Vss from two frame leads PTAG and PTAC, the voltages on the lines 261 and 262 are stabilized, resulting in stable and reliable operations of DQ pad portions.

Figure 25:
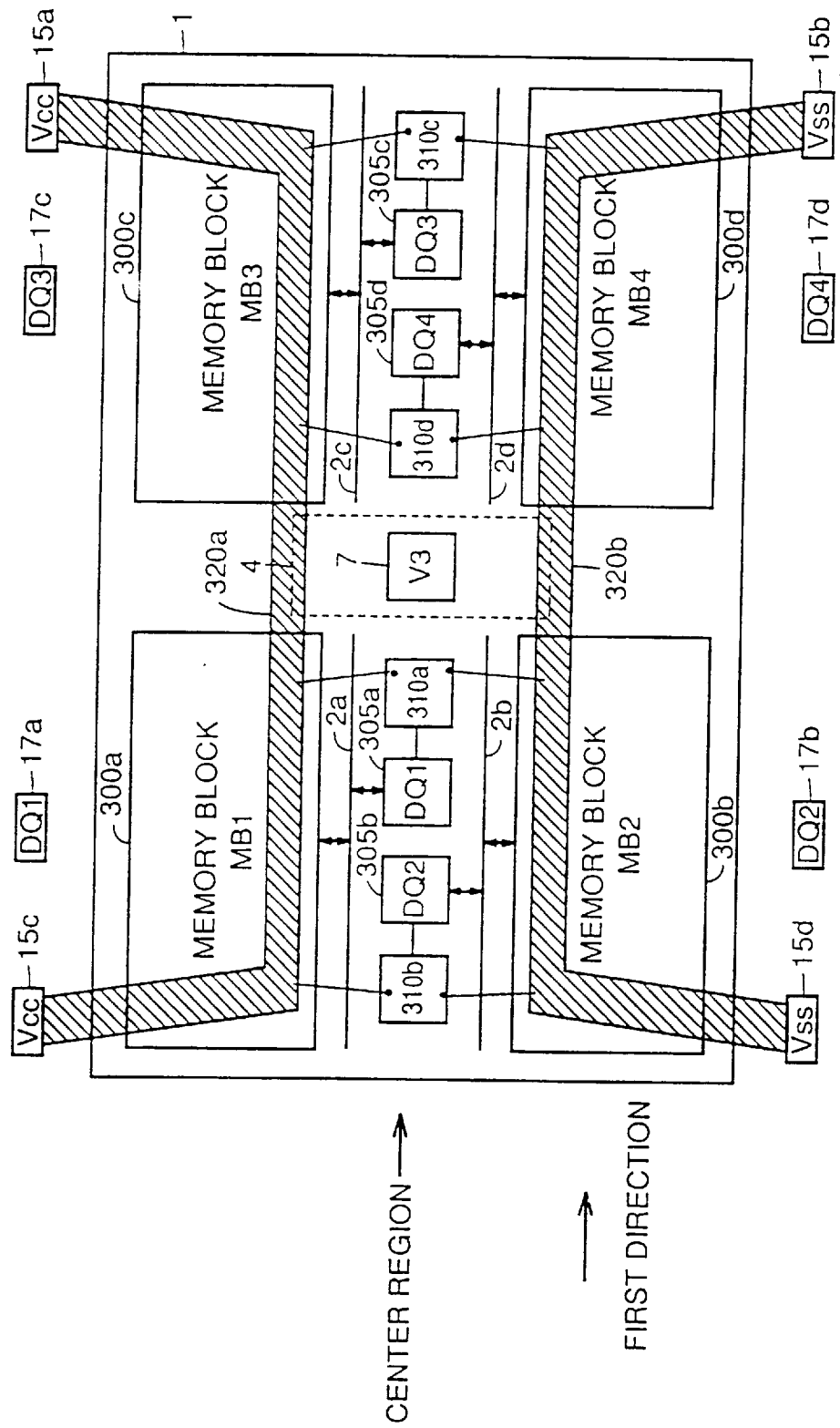
FIG. 25 is a diagram showing a further still another inner pad layout of a semiconductor memory device according to the present invention.

FIG. 25 shows a further inner pad layout of the semiconductor memory device according to the present invention. In the arrangement of FIG. 25, four memory blocks MB1–MB4 (300a–300d) are shown as an example. DQ pad portions DQ1–DQ4 (305a–305d) are provided corresponding to respective memory blocks 300a–300d as in the arrangement of FIG. 1. DQ pad portions 305a–305d transmit data to and from memory blocks 2a–2d, respectively.

In the arrangement of FIG. 25, a power supply bus bar is coupled to power supply pin terminals 15a and 15c on one side of the chip 1 and extends over the chip 1 to transmit the power supply voltage. Power supply bus bar 320a is shown extending over memory blocks 300a and 300c and having a portion extending in parallel with the center region.

A ground bus bar 320b is coupled to ground pin terminals 15b and 15d on the other side of the chip 1 to extend over the chip 1 to transmit ground voltage Vss. Ground bus bar 320b is shown extending over memory blocks 300b and 300d and having a portion in parallel with the center region and facing to the portion of the power supply bus bar 320a.

Power supply bus bar 320a and ground bus bar 320a and ground bus bar 320b each are formed of a sufficiently wide low resistive interconnection line, and implement stable feeding of the power supply voltage Vcc and the ground voltage Vss.

Power pads 310a–310d are provided corresponding to and in alignment with DQ pad portions 305a–305d.

Power pads 310a–310d each include a power supply pad and a ground pad as in the previous embodiments and coupled to power supply bus bar 320a and ground bus bar 320b.

Power pad 310a–310d each supply the power source voltage (Vcc and Vss) only to a corresponding DQ pad portion (I/O buffer) 305a–305d. For example, power pad 310a supplies the power source voltage only to DQ pad portion 310a.

No power source line (power supply interconnection line) extends over a plurality of DQ pad portions. A power source line is laid out only with a least minimum length, and an area having no power source line laid out can be used for laying out a peripheral circuit, and chip area can be efficiently utilized.

In addition, power supply bus bar 320a and ground bus bar 320b have a sufficiently large line width as compared with a bonding wire, and DQ pad portions 305a–305d can be supplied with stable power source voltage and operate stably.

Further, DQ pad portions 305a–305d each receive the power source voltage from an associated power pad 310a–310d, and a power source noise (ground noise such as bouncing and power supply noise such as ringing) on a DQ pad portion is reliably absorbed in power supply bus bar 320a and ground bus bar 320b, and no adverse influence due to power source noise can be reliably prevented from exerting on other circuit portion.

Since a power source line does not extend beyond a corresponding DQ pad portion and DQ pad portions 305a–305d are provided for corresponding memory blocks 300a–300d, respectively, a region between memory blocks 300a, 300b and memory blocks 300c, 300d can be employed for the layout of peripheral circuitry. In FIG. 25, a peripheral circuit region 4 is provided at the center portion. In the region 4, no power source line for a DQ pad portion is provided, and the region 4 can be used dedicatedly for peripheral circuitry without complicate interconnection layout. The peripheral circuit region 4 include a power pad 7 as in the arrangement of FIG. 1. The power pad 7 may be coupled to power supply bus bar 320a and ground bus bar 320b, or may be coupled to another power source pin terminal (not shown in FIG. 25).

Meanwhile, a power pad may include a power supply pad and ground pad sandwiching a corresponding DQ pad portion in the first direction.

In addition, the arrangement of the power supply bus bar and the ground bus bar may be combined with any preceding embodiment as described, so that a power source pad is coupled to the power supply bus bar and to the ground bus bar.

In the above description of the embodiments of the present invention, the peripheral circuitry is provided with a function related to operation of controlling an internal accessing in response to an address signal, a clock signal or the like. However, the peripheral circuit arranged in the chip center portion may include a circuitry generating a constant voltage such as a high voltage generating circuit for boosting a word line potential, a negative voltage generating circuit for generating a negative voltage Vbb to be applied to a substrate region of a memory array, and an intermediate voltage generating circuit generating an intermediate voltage for bit line precharge ordinarily used in a semiconductor memory circuit. In this case, by arranging such a circuit generating a constant voltage in the center portion, all the interconnection lines for transmitting the constant voltage to respective memory cell arrays can be made equal in length. A desired constant voltage at the same voltage level can be supplied to the respective memory array blocks without the influence of interconnection line resistance or the like, thereby guaranteeing stable operation characteristics.

In the above embodiment, a structure in which data input/output is carried out on a four bit basis, and all memory blocks operate simultaneously to carry out input/output of one-bit memory cell data is shown as an example. However, data input/output may be carried out on an x8 bit basis, an x16 bit basis, or more. Further, a structure in which only two memory blocks are activated through modification of an internal circuit structure may be used.

Further, in the above embodiment, a pad layout of a semiconductor memory device in a lead on chip structure has been described. However, the similar effects can be brought about in the case where the semiconductor memory device is not have such a lead on chip structure. If the semiconductor memory device is so structured that data input/output pads are distributedly arranged corresponding to memory blocks, the data input/output pads are grouped and power supply pads are provided to respective groups, external signal (address signal and clock signal) input pads are arranged in a region between memory data input/output pad portions, and that pads for supplying the power supply voltage to the peripheral circuits (which may be only input buffers) are provided in the chip center portion, the similar effects can be brought about, implementing a semiconductor memory device which operates stably at a high speed.

[Arrangement of Multibit Test Circuit]

Figure 26:
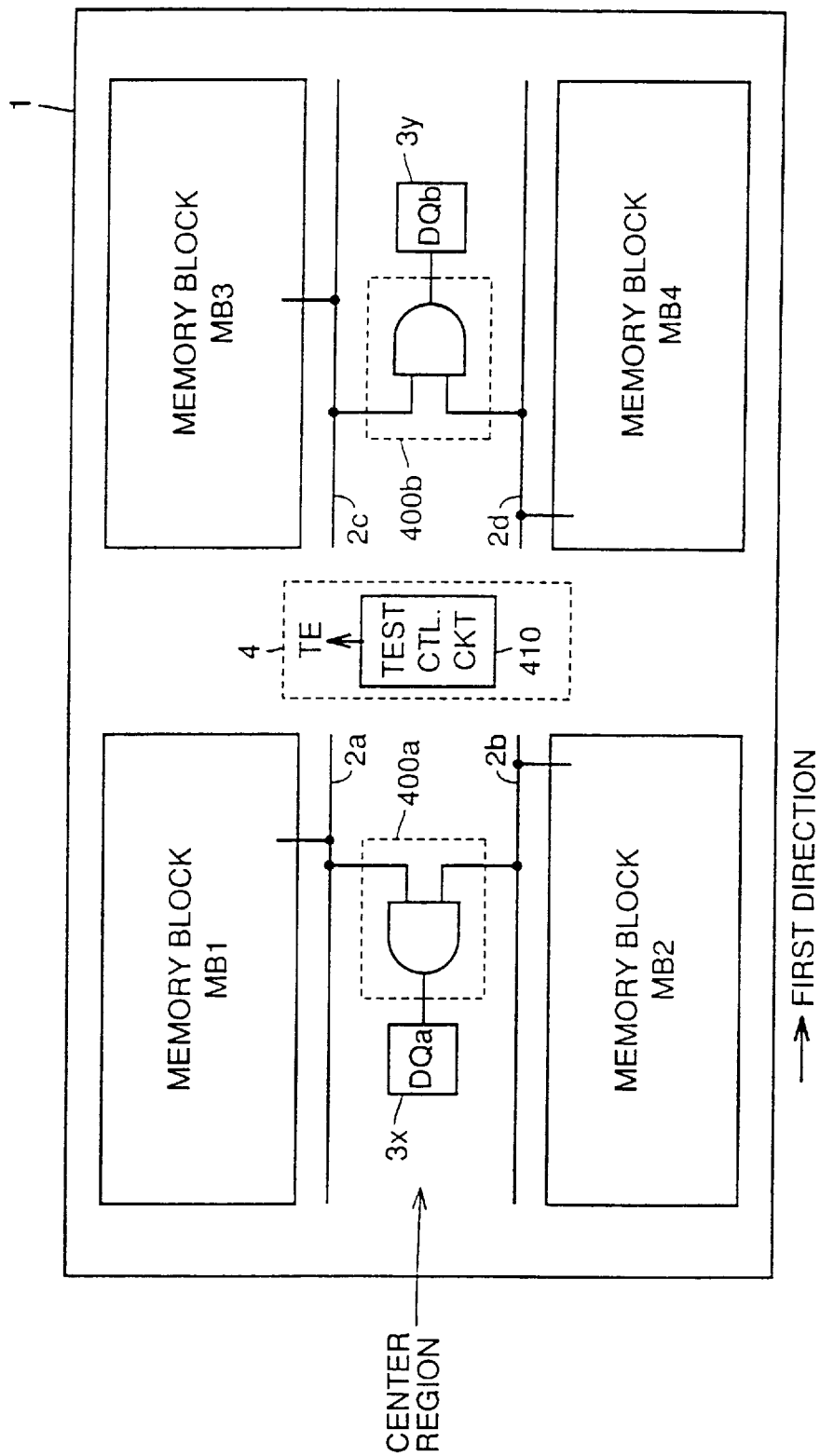
FIG. 26 is a diagram schematically showing an arrangement for implementing a multibit test.

FIG. 26 shows an arrangement for implementing a multibit test in a semiconductor memory device having pads arranged alignedly in the center region. In a semiconductor memory, a plurality of memory cells are selected at a time by a row decoder and a column decoder as shown in FIG. 3. Then a predetermined number of memory cells are selected for output or input of data. As the storage capacity of the memory device increases, the number of memory cells (bits) is increased accordingly. If determination whether a memory cell is defective is made on a bit by bit basis, a very long time is required for making determination on all the memory cells. Thus, a multibit test is generally performed.

In the multibit test, data of a same logic is written into all the memory cells. Then, a predetermined number of memory cells is selected at a time, and data of the selected memory cells are transferred to a multibit test circuit (compressor) which in turn determines whether received data are identical in logic with each other. If all the data is identical in logic with each other, it is determined that all the selected memory cells are non-defective. If the received data are non-coincident in logic with each other, or data "0" and "1" are mixedly present, it is determined that at least one bit memory cell among the selected memory cells is defective. These selected memory cells are replaced by redundant memory cells after the test. Since a plurality of memory cells are subject to the pass/fail determination test at a time, the required test time is reduced as compared with the bit-by-bit basis test.

Now, referring to FIG. 26, a semiconductor memory device formed on chip 1 includes four memory blocks MB1–MB4 arranged on both sides of the center region. Data buses 2a–2d are provided corresponding to memory blocks MB1–MB4 and extending along only corresponding memory blocks MB1–MB4. These data buses 2a–2d do not extend beyond the peripheral circuit region 4 at a center of the center region with respect to the first direction.

Although a plurality of pad portions are arranged in the center region as described previously with reference to FIGS. 1–25, data input/output pad portions 3x and 3y are representatively shown. The pad portion 3x is arranged between memory blocks MB1 and MB2, while the pad portions 3y is arranged between memory blocks MB2 and MB3.

Test circuit 400a is provided between memory blocks MB1 and MB2, to receive and compress data on data buses 2a and 2b in the multibit test mode of operation. The term "compress" indicates that a plural bit data is converted into a one-bit data. The test circuit 400a supplies data of one bit to the pad portion 3x.

Between memory blocks MB3 and MB4, another test circuit 400b is provided to receive and compress data on data buses 2c and 2d for output to the pad portion 3y in the multibit test mode of operation.

Although test circuits 400a and 400b each are shown including an AND circuit as a coincidence detector for identifying that data "1" is correctly written into and stored in and read from each memory cell, the test circuit 400a and 400b each can have any inner configuration as far as the test circuit can identify whether received data are identical in logic with each other.

Test mode instruction signal TE is generated from a test control circuit 410 provided in the peripheral circuit region 4. Test control circuit 410 determines that the multibit test mode is designated when a write enable signal /WE and a column address strobe signal /CAS are made low prior to the falling of a row address strobe signal /RAS, and a voltage at a particular address pin (pad) is made higher than a normal power supply voltage Vcc.

Figure 27:
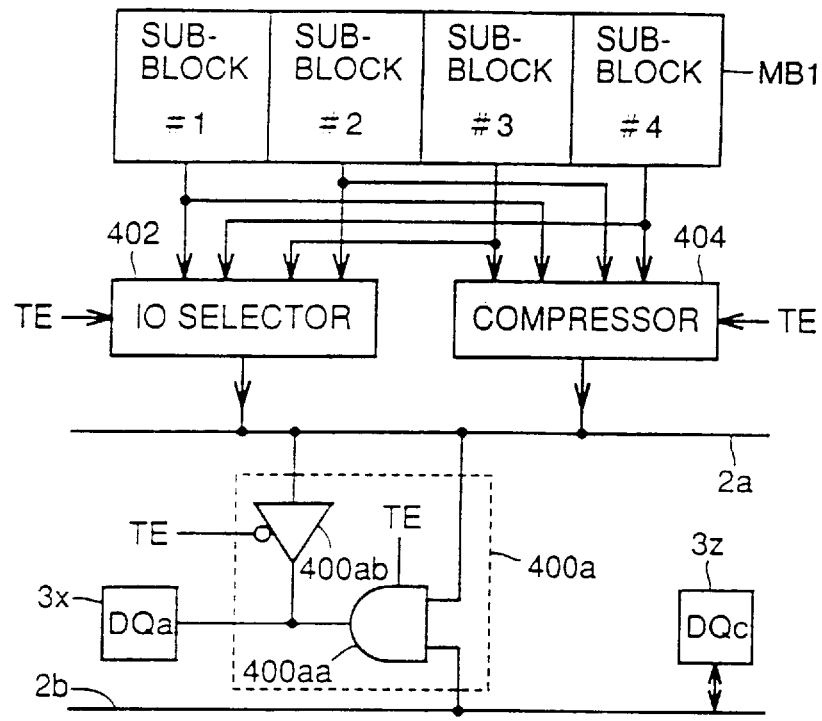
FIG. 27 is a diagram showing a detail of the arrangement of FIG. 26.

FIG. 27 shows a multibit test arrangement for memory block MB1 in more detail. Similar arrangement is provided for memory blocks MB2–MB4. Referring to FIG. 27, memory block MB1 includes a plurality of (4) sub blocks #1–#4 each having a plurality of memory cells arranged in rows and columns. From each of sub blocks #1–#4, a one-bit memory cell data is read out in a normal operation and the multibit test mode of operation. Between memory block MB1 and data bus 2a, an IO selector 402 and compressor 404 are provided. Compressor 404 may form a part of the test circuit 400a. IO selector 402 is enabled by the test mode instruction signal TE being inactive, to select one of data received from sub blocks #1–#4 for outputting onto data bus 2a in data reading mode. Compressor 404 is enabled by test mode instruction signal TE being active to compress data received from sub blocks #1–#4 into a one bit data in the multibit test mode of operation. Compressor 404 is constructed by a coincidence detection circuit, and identifies whether received data are the same in logic with each other and supplies a data (signal) indicating the result of identification onto data bus 2a.

IO selector 402 and compressor 404 each are brought into an output high impedance state when disabled.

Test circuit 400a includes a compressor (coincidence detector) 400aa for receiving and compressing data on data buses 2a and 2b into a one-bit data for supply to the output buffer included in the input/output pad portions 3x when enabled by test mode instruction signal TE being active, and a 3-state buffer 400ab for transferring data on data bus 2a to the output buffer included in the input/output pad portions 3x when enabled by the test mode instruction signal TE being inactive.

Compressor 400aa and 3-state buffer 400ab each are brought into an output high impedance state when disabled.

In a normal mode of operation, the compressor 400aa is disabled, and the 3-state buffer 400ab is enabled to transfer the data on the data bus 2a to data input/output pad portion 3x. Data on the data bus 2b is transferred to a data input/output pad portion 3z.

In memory block MB1, each of sub blocks #1–#4 has a predetermined number of (1) memory cells (cell) selected at a time to be coupled to IO selector 402. IO selector 402 decodes an IO address (not shown) to select a memory cell data for transmission onto data bus 2a. Compressor 404 is disabled by the signal TE at an inactive state.

Thus, the memory cell data selected in memory block MB1 is transferred to data input/output pad portion 3x to be output as data DQa.

Data of a memory cell selected in memory block MB2 is transferred to data input/output pad portion 3z to be output as data DQc.

In the multibit test mode, IO selector 402 is disabled while compressor 404 is enabled. Memory sub blocks #1–#4 each have the predetermined number of memory cells (cell) selected at a time as in the normal mode of operation. Compressor 404 identifies whether data of the memory cells selected in sub blocks #1–#4 are the same in logic with each other, to supply a signal indicating the result of identification onto data bus 2a. A compressor for the memory block MB2 also performs the identification operation on the data of memory cells selected in memory block MB2, to supply a signal indicating the result of identification.

In the test circuit 400a, 3-state buffer 400ab is disabled, and compressor 400aa is enabled. When data on data buses 2a and 2b are the same in logic (H level in the shown embodiment), compressor 400aa supplies a signal (H level, in the embodiment) indicating that all the selected memory cells are non-defective. If data on data buses 2a and 2b are different in logic, the compressor 400aa supplies a signal (L level) indicating that the selected memory cells include a defective memory cell.

In the arrangement of FIG. 27, data input/output pad portion 3x may receive data on data bus 2b in the normal mode of operation.

Data buses 2a and 2b may be constructed to convey data of plural bits such as 2 bits, 4 bits or more bits. In addition, each of sub blocks #1–#4 may have a plurality of bits of memory cells such as 4 bits, or more selected at a time to be coupled to IO selector 402 and to compressor 404. IO selector 402 and compressor 404 may be provided by a plurality of stages.

According to the arrangements of FIGS. 26 and 27, the multibit test can be performed even in a memory device having data buses extending along and not beyond corresponding memory blocks.

[Another Arrangement for Multibit Test]

Figure 28:
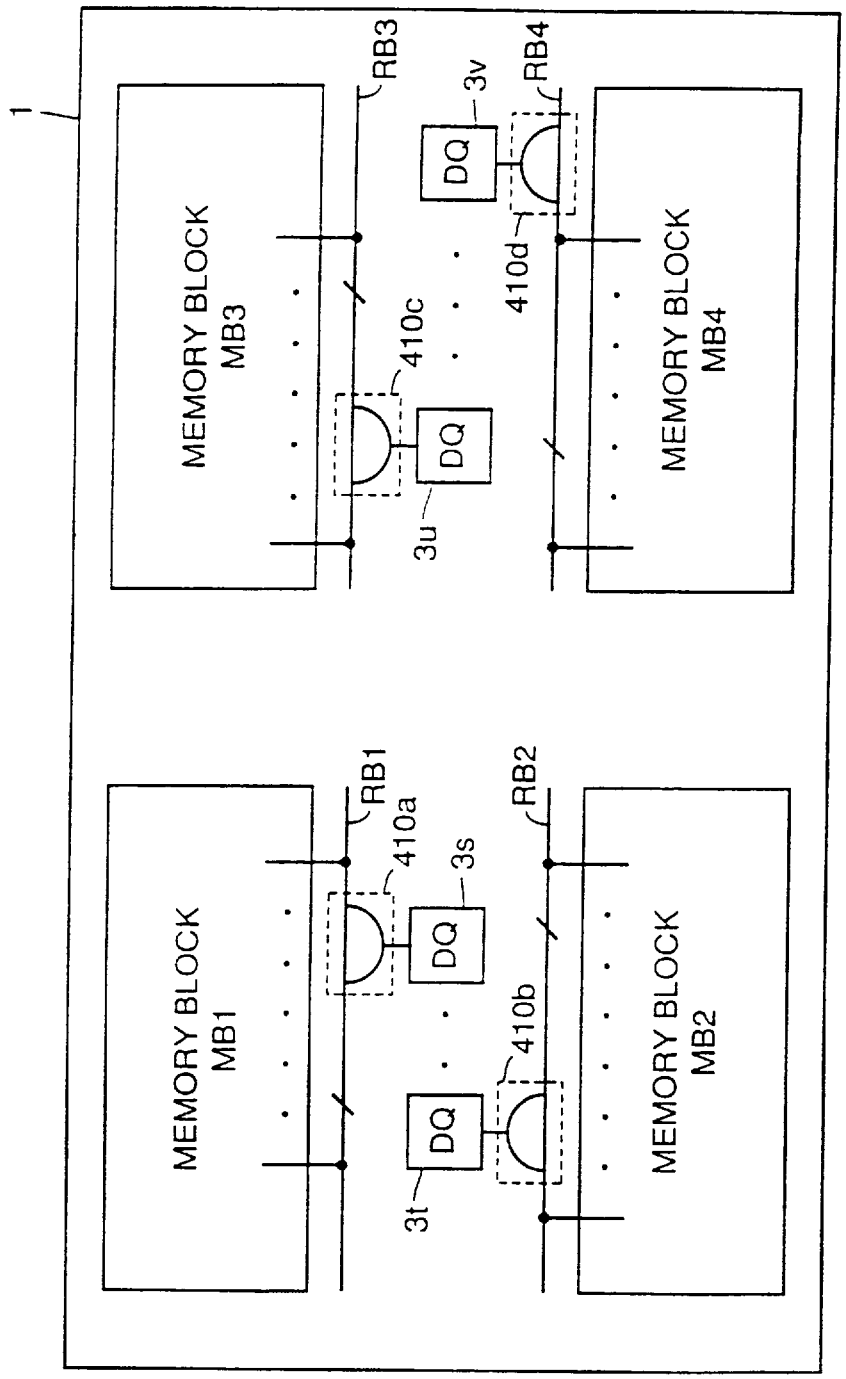
FIG. 28 is a diagram schematically showing another arrangement for implementing the multibit test.

FIG. 28 shows another schematic arrangement for implementing the multibit test. Referring to FIG. 28, memory blocks MB1–MB4 formed on chip 1 have test circuits 410a–410d provided correspondingly. Test circuits 410a, 410b, 410c 410d are shown individually compressing data on corresponding data buses RB1, RB2, RB3 and RB4 which in turn are provided for the respective memory blocks MB1, MB2, MB3 and MB4 and are not extending beyond the corresponding memory blocks MB1–MB4.

In test mode of operation, test circuit 410a compresses data on data bus (read data bus) for application to a data input/output pad portion 3s. Test circuit 410b compresses data on data bus RB2 for application to a data input/output pad portion 3s. Test circuit 410 compresses data on data bus RB3 for application to a data input/output pad portion 3u. Test circuit 401d compresses data on data bus RB4 for application to a data input/output pad portion 3v.

In the normal mode of operation, data input/output pad portion 3s–3v receive non-compressed data bits on data buses RB1–RB4 through test circuits 410a–410d, respectively.

Figure 29:
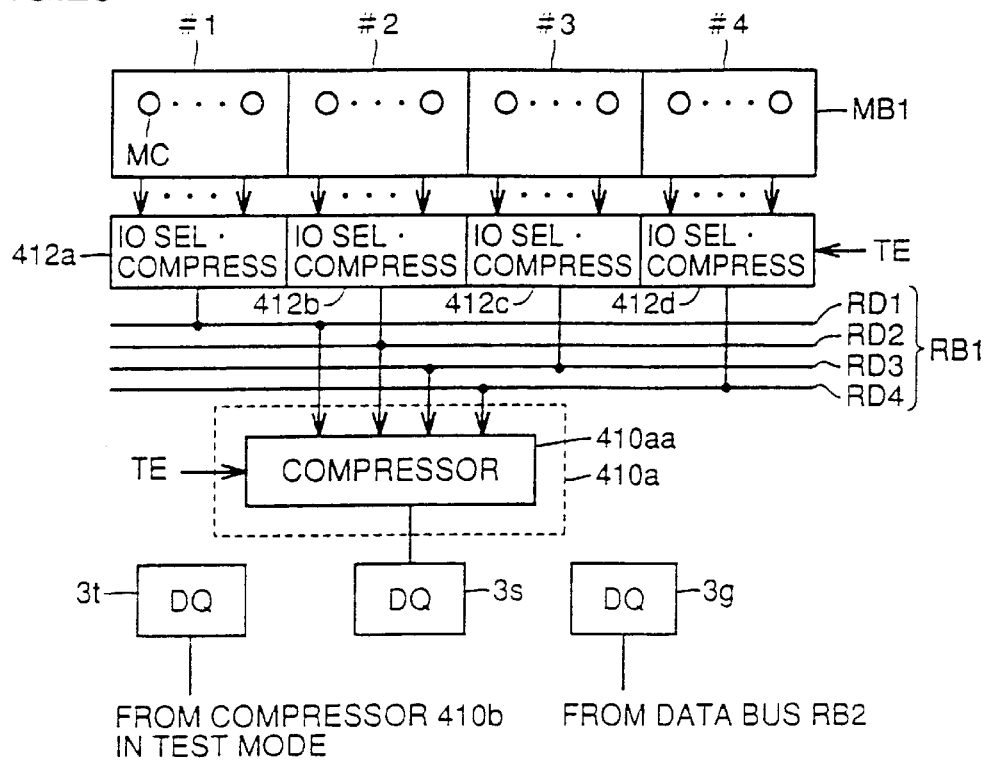
FIGS. 29 and 30 each is a diagram showing a detail of the arrangement of FIG. 28.

FIG. 29 shows an arrangement of test circuit 410a for memory blocks MB1 in more detail. The same arrangement as shown in FIG. 29 is provided for memory blocks MB2–MB4. Referring to FIG. 29, memory block MB1 includes a plurality of (4 in the shown arrangement) sub blocks #1–#4 each having a plurality of memory cells MC selected at a time in both normal and multibit test operation modes. Sub test circuits 412, 412b, 412c and 410d responsive to the multibit test instruction signal TE are provided for respective memory sub blocks #1–#4.

Each of sub test circuits 412a–412d includes an IO selector for selecting one bit out of data of memory cells selected at a time in a corresponding sub block #1–#4 in the normal mode of operation, and a compressor for compressing data of memory cells selected at a time in the corresponding sub block #1–#4 in the multibit test mode of operation. The outputs of sub test circuits 412a–412d are supplied in parallel to data bus lines RD1, RD2, RD3 and RD4, respectively, of data bus RB1.

Test circuit 410a includes a compressor 410aa responsive to the test mode instruction signal TE for compressing data bits on data bus lines RD1–RD4 supplied from sub test circuits 412a–412b for application to data input/output pad portion 3s in the multibit test mode of operation.

In the normal mode of operation, each of IO selectors in sub test circuits 412a–412d is enabled and selects one bit of data of memory cells selected in a corresponding one of sub blocks #1–#4 for application onto a corresponding one of data bus lines RD1–RD4.

Test circuit 410a has the compressor 410aa disabled in response to test mode instruction signal TE and transmits a data bit on a predetermined one of data bus lines RD1–RD4 to the data input/output pad portion 3s. Remaining data bus lines of data bus RB1 are coupled to preallotted data input/output pad portions (not shown). Data input/output pad portions 3q and 3t each receive data from memory block MB2.

In the multibit test mode of operation, sub test circuits 412a–412d each have compressors enabled in response to the test mode instruction signal TE, and compressors compress data received from corresponding sub blocks #1–#4 into one bit data. More specifically, each of compressors is formed of a coincidence detection circuit and identifies whether received data bits are the same in logic with each other and applies a signal indicating the result of identification onto a corresponding data bus line RDi (i=1–4).

In test circuit 410a, compressor 410aa is enabled in response to the test mode instruction signal TE and compresses data bits on data bus lines RD1–RD4 for application to data input/output pad portion 3s. More specifically, when data bits on data bus lines RD1–RD4 are identical in logic with each other, compressor 410aa generates a signal indicating that all the memory cells selected in memory block MB1 are non-defective to data input/output pad portion 3s, and otherwise, compressor 410aa generates a signal indicating that the selected memory cells include at least one defective memory cell.

Data input/output pad portion 3*t* also receives a signal from test circuit (compressor) for memory block MB2.

Sub test circuits 412*a*–412*d* each are identical in structure and operation with the combination of IO selector 402 and compressor 404 shown in FIG. 27. The number of data bus lines of data bus is arbitrary, and the number of memory cells selected at a time in each of sub blocks #1–#4 is also appropriately determined.

Data input/output pad portion 3*g* may be constructed to receive a signal at a precharge level set in a standby state through a driver to be set in the output high impedance state in the multibit test mode of operation.

Figure 30:
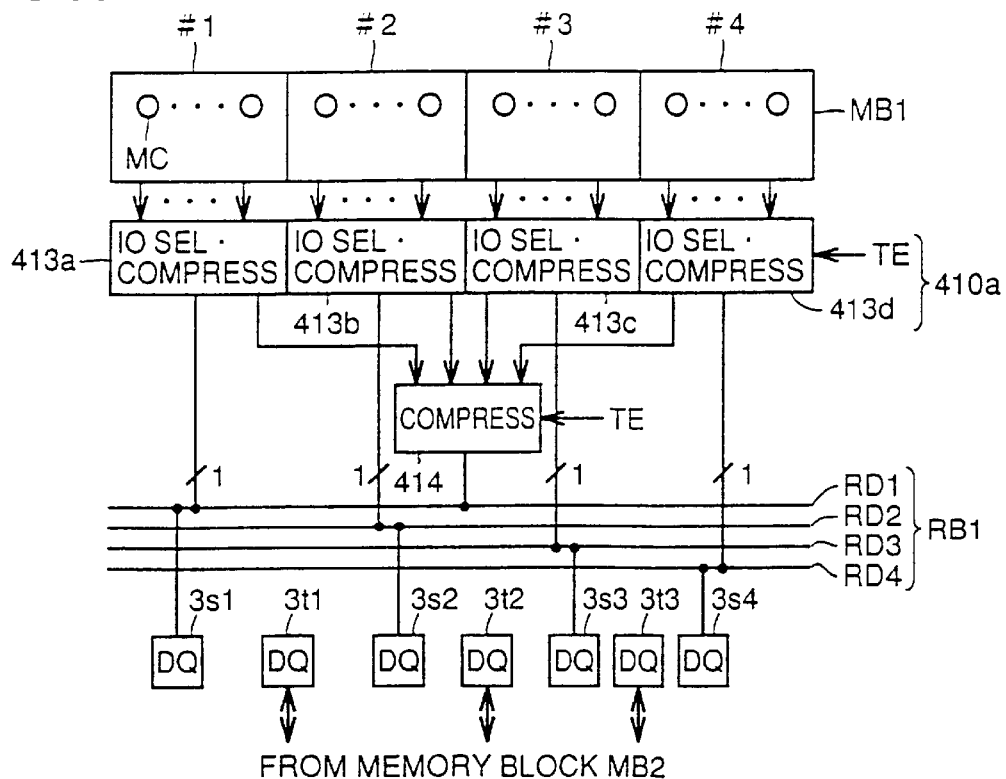

FIG. 30 shows another arrangement of test circuit 410*a* of FIG. 28. Referring to FIG. 30, test circuit 410*a* includes sub test circuits 413*a*–413*d* provided for sub blocks #1–#4 of memory block MB1, and a compressor 414 receiving outputs of sub test circuits 413*a*–413*d* to compress the received data into a one-bit data for transmission onto data bus line RD1. Sub test circuits 413*a*–413*d* each include an IO selector for selecting one bit of the memory cells selected in a corresponding one of sub block #1–#4 for transmission on a corresponding one of data bus lines RD1–RD4 in a normal mode of operation, and a compressor for compressing data of memory cells selected in a corresponding one of sub blocks #1–#4 for transmission to compressor 414 in a multibit test mode. Sub test circuits 413*a*–413*d* are the same in construction and operation with the combination of the IO selector 402 and compressor 404 shown in FIG. 26 except for that the output of compressor is applied to compressor 414.

Compressor 414 compresses the outputs of compressors included in sub test circuits 413*a*–413*d* into a one-bit data for transmission onto data bus line RD1. Data bus lines RD1–RD4 are coupled to data input/output pad portions 3*s*1–3*s*4, respectively, while data input/output pad portions 3*t*1–3*t*4 are coupled to data bus lines for memory block MB2. Data input/output pad portions 3*s*1–3*s*4 and 3*t*1–3*t*4 are arranged alignedly on the center region.

In the arrangement of FIG. 30, the number of memory cells selected in each of sub blocks #1–#4 may be any. If 4 bit memory cells are selected in each sub blocks #1–#4, 16 bit data is compressed to one-bit data, or 16 memory cells are tested at a time. The number of data bus lines of data bus RB (RB1–RB4) is also any. If bus width of data bus RD is one bit, a further IO selector may be provided in parallel to compressor 414.

Provision of test circuit for each memory block allows the multibit test to be performed in the memory device having data buses (data input/output buffers) distributedly arranged corresponding to respective memory blocks.

Figure 31:
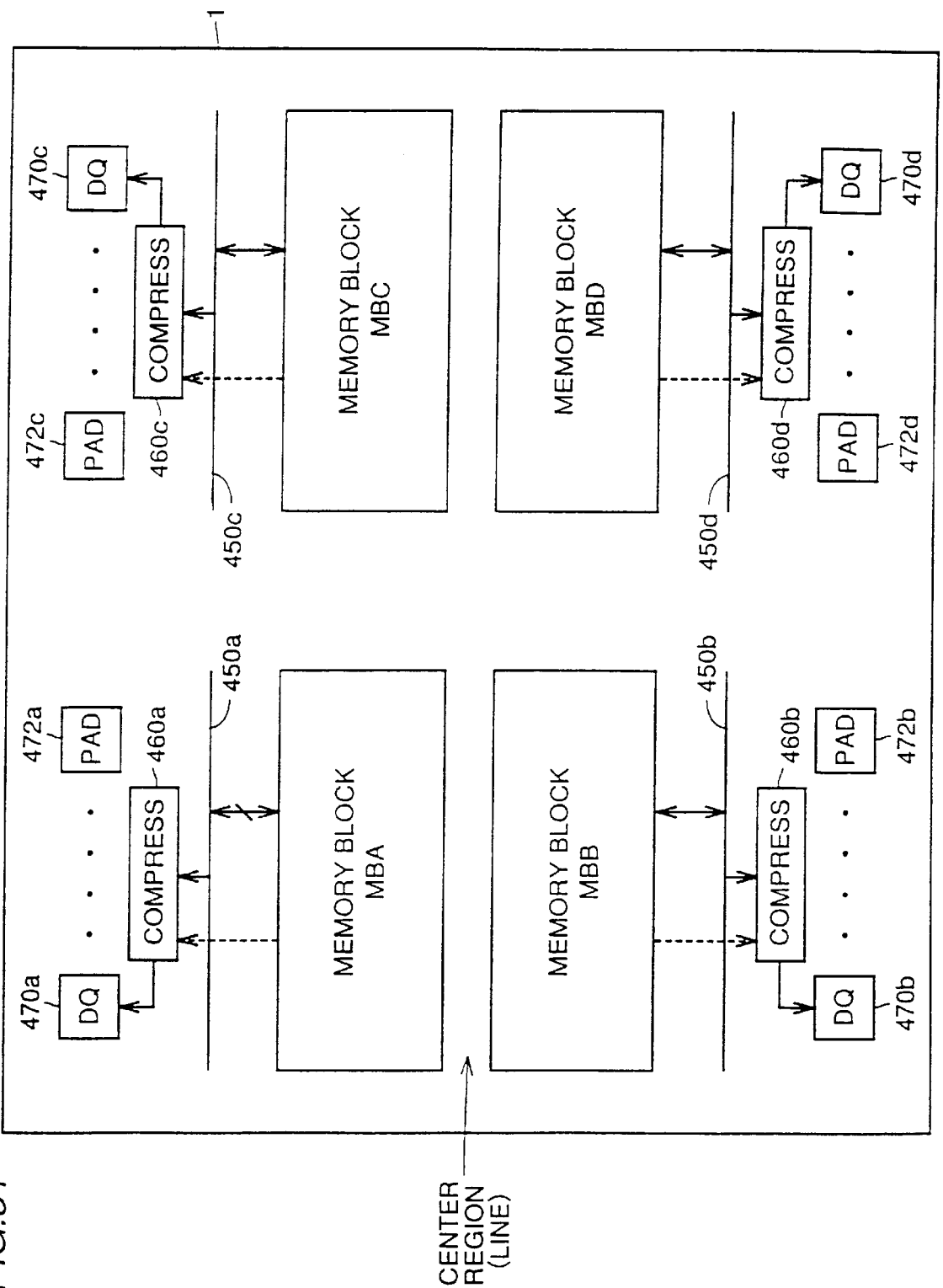
FIG. 31 is a diagram showing a further arrangement for implementing the multibit test.
Figure 33:
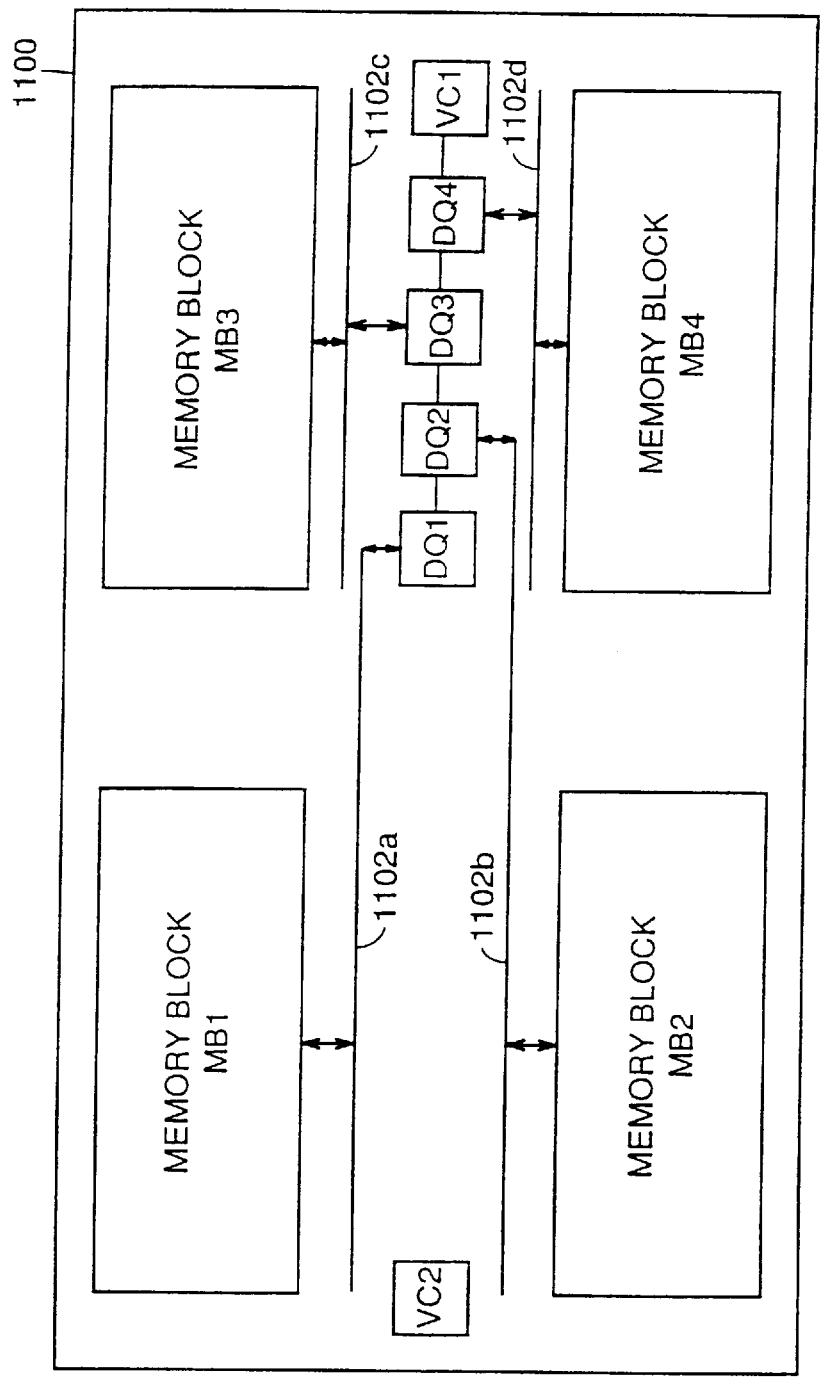
FIG. 33 is a diagram schematically showing the entire structure of a conventional semiconductor memory device.
Figure 34:
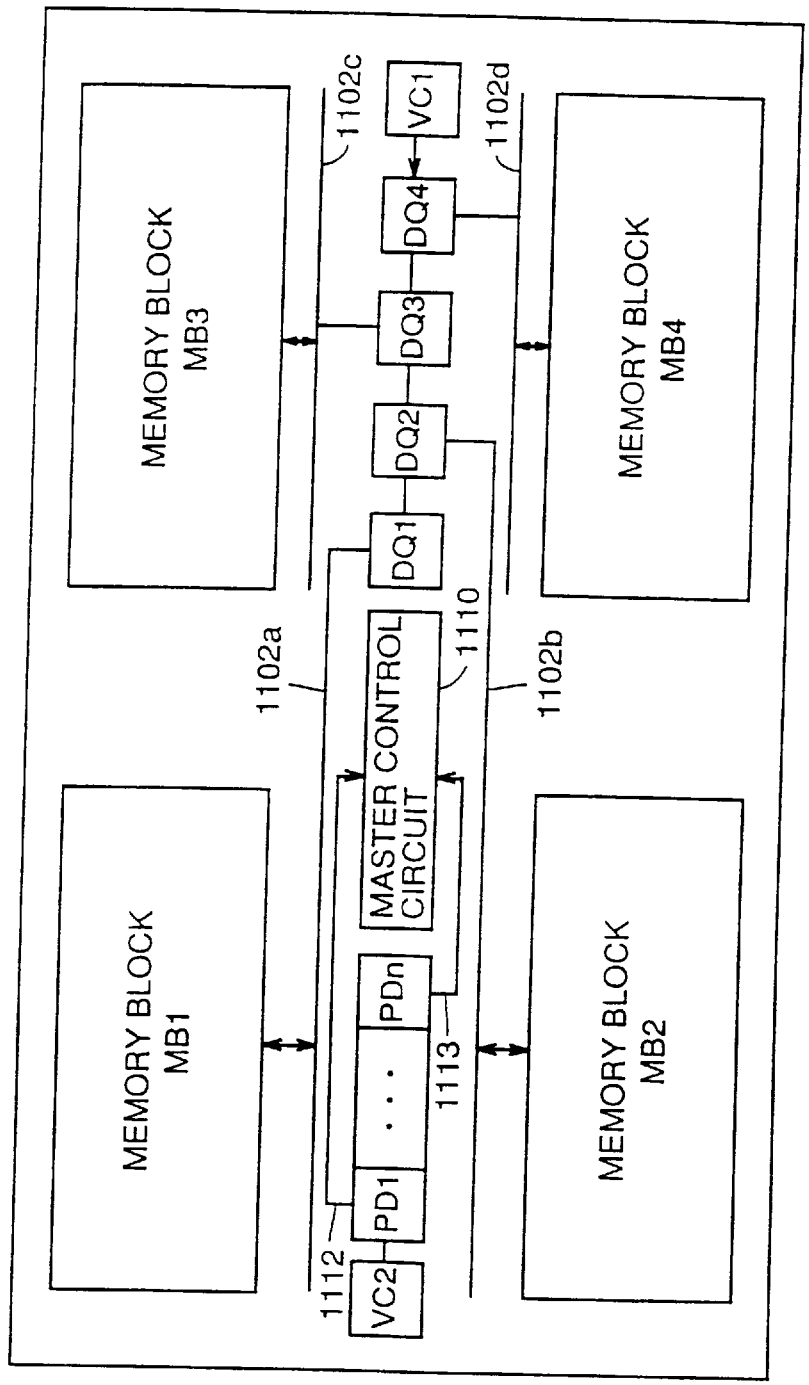
FIG. 34 is a diagram for illustration of an arrangement of peripheral circuitry in the conventional semiconductor memory device.

FIG. 31 shows a further embodiment of implementation of the multibit test. Referring to FIG. 31, memory blocks MBA–MBD are arranged on both sides of a center region (line) of a chip 1. Memory blocks MBA–MBD each have a plurality of memory cells and have a predetermined number of memory cells selected at a time. For respective memory blocks MBA–MBD, data buses 450*a*–450*d* are arranged at sides opposing to sides of memory blocks facing to the center region and extend along only corresponding memory blocks MBA–MBD. Pad portions are arranged corresponding to memory blocks MBA–MBD at an outer periphery of chip 1. Pad portions include data input/output pad portions (DQ) 470*a*–470*d* and peripheral pad portions (PAD) 472*a*–472*d* provided for respective memory blocks MBA–MBD.

Test circuit (compress) 460*a*–460*d* are provided corresponding to respective memory blocks MBA–MBD. Test circuits 460*a*–460*d* each include a compressor as described with reference to FIGS. 26–30. Test circuits (compressors) 460*a*–460*d* each receive and compress data on corresponding data buses 450*a*–450*d* or from corresponding memory blocks MBA–MBD (the paths shown by dotted lines) into a one-bit data for application to corresponding data input/output portions (DQ) 470*a*–470*d* in the multibit test mode. Test circuits 460*a*–460*d* each may include any structure out of those as described with reference to FIGS. 26–30, and the multibit test is performed individually on respective memory blocks MBA–MBD as described above.

In FIG. 31, the center region has no pad portion in the peripheral pad arrangement, and the center region of FIG. 31 can be made narrower than the center region having pad portions arranged thereon. The center region of FIG. 31 may include a peripheral circuit or may not include a peripheral circuit. Thus, the center region of FIG. 31 can be simply referred to as a center line as indicated by the brackets in FIG. 31.

Even in the memory device having the arrangement shown in FIG. 18, or peripheral pad arrangement, the multibit test can be efficiently performed due to the provision of test circuit for each memory block as shown in FIG. 31.

Figure 32A:
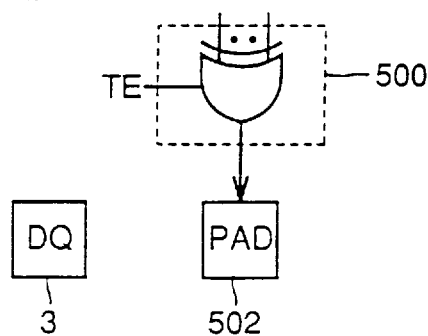
FIG. 32A is a diagram showing a modification of the arrangements of FIGS. 27 and 29.

In the above described embodiment, compressed data, or a signal indicating the result of multibit test for each memory block is applied to a corresponding data input/output pad portion. Alternatively, such signal indicating the result of multibit test or an output of the test circuit (compressor) 500 may be supplied to a non-used peripheral pad (PAD) 502 not used during the multibit test such as an address pad (pin) degenerated in the multibit test as shown in FIG. 32A. Alternatively, the pad 502 may be a pad dedicated to the multibit test. In FIG. 32A, the test circuit 500 is shown including an EXOR circuit responsive to the test mode instruction signal TE. EXOR circuit can serve as a coincidence detector and can be used for the test circuit. EXNOR circuit can be also used for the test circuit as the compressor.

Figure 32B:
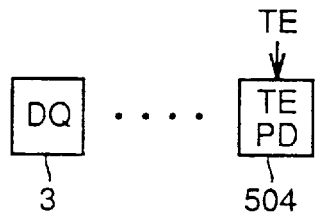
FIG. 32B is a diagram showing an arrangement for generating a multibit test mode instruction signal.

In the embodiments described previously, it is described the required condition designate the multibit test mode by the test control circuit. Alternatively, as shown in FIG. 32B, the test mode instruction signal TE may be externally applied to a test pad (TEPD) 504, if an empty pad (pin) is reserved. Meanwhile, the reference numeral 3 is FIGS. 32A and 32B denotes a data input/output pad or data input/output pad portion.

As described above, according to the present invention, by distributing data input/output pad portions corresponding to memory blocks and arranging an external signal input pad in a region between the data input/output pad portions, power supply pads for the data input/output pad portions can be distributed, and the load of power supply lines can be dispersed, enabling implementation of an input/output buffer which operates stably at a high speed. In this arrangement, by providing a power supply pad exclusively for peripheral circuitry, the peripheral circuitry can be operated stably. Further, by arranging the peripheral circuitry in the center portion of a chip, external clock signal and address signal lines can be shortened, and a set-up time and a hold time can be reduced, enabling implementation of a semiconductor memory device which operates at a high speed. Further, if the peripheral circuitry includes a constant voltage generating circuit, the constant voltage can be supplied to each memory block stably.

With the above structure, an internal data bus has only to extend along a corresponding memory block. The length of the internal data bus can be shortened, and a data signal propagation delay in the data bus can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory array divided into a plurality of memory blocks by a first region disposed along a first direction and a second region disposed along a second direction perpendicular to said first direction, said first region crossing said second region;
   a plurality of external signal receiving pads arranged in a crossing portion, the crossing portion being substantially a portion at which said first region crosses said second region, said plurality of external signal receiving pads receiving external signals, said plurality of memory blocks accessed by said external signals;
   a plurality of data output pads provided corresponding to said plurality of memory blocks respectively, said plurality of data output pads arranged in a region excluding said crossing portion in said first region, each of said plurality of data output pads being arranged adjacent to a corresponding one of said memory blocks; and
   a plurality of data output buffers provided corresponding to said plurality of data output pads respectively, each receiving data from a corresponding one of said memory blocks and outputting said data to a corresponding one of said data output pads.

2. A semiconductor memory device formed on a chip, comprising:
   a plurality of memory blocks arranged in a first direction on either side of a first region perpendicular to said first direction;
   a plurality of data input/output means arranged corresponding to said plurality of memory blocks and adjacent to corresponding memory blocks in a prescribed region along said first direction, each said data input/output means including a buffer for transmitting and receiving data to and from the corresponding memory block and a pad connected to the buffer; and
   a plurality of peripheral buffer means arranged in the vicinity of the first region along said first direction for receiving an external signal for accessing said plurality of memory blocks.

3. The semiconductor memory device according to claim 2, wherein
   said prescribed region is a peripheral region in the first direction adjacent a periphery of said chip.

4. A semiconductor memory device formed on a chip, comprising:
   a plurality of memory blocks arranged in alignment with each other in a first direction on both sides of a center region along said first direction on said chip;
   a plurality of data input/output means arranged corresponding to said plurality of memory blocks and adjacent to corresponding memory blocks in said center region, said data input/output means including a plurality of buffers for transmitting and receiving data to and from the corresponding memory blocks and a plurality of pads connected to the plurality of buffers; and
   a plurality of peripheral buffer means arranged in the vicinity of a center portion in said center region along said first direction for receiving an external signal for accessing said plurality of memory blocks,
   said plurality of data input/output buffer means being arranged in a region excluding the vicinity of said center portion.

5. The semiconductor memory device according to claim 4, wherein
   said plurality of data input/output buffer means are arranged in groups on one side and on another side with respect to a center portion in said center region along said first direction, and
   said semiconductor memory device further comprises
   a plurality of power pads arranged adjacent to each respective data input/output buffer means group on each of said one side and said other side for supplying a power source voltage only to an associated data input/output buffer means group.

6. The semiconductor memory device as recited in claim 5, wherein each of said plurality of power pads connects only a power interconnection line for supplying the power source voltage to an associated data input/output buffer means group.

7. The semiconductor memory device as recited in claim 5, wherein
   said plurality of data input/output buffer means are aligned on each of said one side and said other side of said center region, and
   said plurality of power pads are arranged in said center region so as to sandwich a corresponding data input/output buffer means group therebetween one each of said one side and said other side.

8. The semiconductor memory device as recited in claim 5, further comprising:
   a peripheral circuit arranged in the center portion between said one side and said other side of said center region, for receiving an external signal controlling an access to said plurality of memory blocks and for controlling the access to said plurality of memory blocks in response to the received external signal; and
   a peripheral power pad arranged exclusively for said peripheral circuit in said center portion for receiving externally applied power source voltage and supplying the received power source voltage to said peripheral circuit.

9. The semiconductor memory device as recited in claim 5, wherein each said power pad includes a power supply pad receiving an external power supply voltage for internal transmission, and a ground pad receiving an external ground potential for internal supply.

10. The semiconductor memory device as recited in claim 5, wherein each said power pad is arranged between data input/output buffer means in each said group of data input/output buffer means.

11. The semiconductor memory device as recited in claim 5, wherein data input/output buffer means in each said group of data input/output buffer means are arranged on at least two lines in the first direction, and said power pads in each group of data input/output buffer means includes power supply pads supplying a power supply voltage of said power source voltage arranged in alignment with data input/output buffer means on one line of said at least two lines, and ground pads supplying a ground voltage of said power source voltage arranged in alignment with data input/output buffer means on another line of said at least two lines.

12. The semiconductor memory device as recited in claim 5, wherein data input/output buffer means in each said group of data input/output buffer means are arranged on at least two lines, and said power source voltage comprises one power supply voltage and another power supply voltage and said power pads includes a power supply pad receiving the one power supply voltage for internal transmission and a ground pad receiving the other power supply voltage for internal transmission arranged in each of said at least two lines.

13. The semiconductor memory device as recited in claim 5, wherein said plurality of power pads include power supply pads supplying one power supply voltage and ground pads supplying another power supply voltage, and said plurality of power pads are aligned with said plurality of data input/output buffer means, and at least one data input/output buffer means is inserted between a power supply pad and a ground pad.

14. The semiconductor memory device as recited in claim 8, wherein each of said plurality of power pads receives a power supply voltage of a first voltage level, and said peripheral power pad receives a power supply voltage of a second voltage level different from said first voltage level.

15. The semiconductor memory device as recited in claim 5, wherein said plurality of power pads each connect an interconnection line supplying a power source voltage separate from others.

16. The semiconductor memory device according to claim 15, further comprising:
  a power bus coupled to an external terminal receiving an externally applied power source voltage for internal transmission to the respective power pads and provided extending over said chip and at least one of said plurality of memory blocks.

17. The semiconductor memory device as recited in claim 6, wherein said plurality of data input/output buffer means are further grouped into subgroups of a predetermined number of data input/output buffer means in each of said groups, and each of said power pads connects an interconnection line supplying the power source voltage only to an associated subgroup of data input/output buffer means.

18. The semiconductor memory device according to claim 17, further comprising;
  a power bus coupled to an external terminal receiving an externally applied power source voltage for internal transmission thereof to the respective power pads and provided extending over said chip and at least one of said plurality of memory blocks.

19. The semiconductor memory device formed according to claim 2, wherein
  said plurality of data input/output buffer means are arranged in groups on one side and on another side with respect to said first region and, said semiconductor memory device further includes
    a plurality of power pads arranged adjacent to each respective data input/output buffer means group on each of said one side and said other side for supplying a power source voltage only to an associated data input/output buffer means group.

20. The semiconductor memory device as recited in claim 19, wherein each of said plurality of power pads connects only a power interconnection line for supplying the power source voltage to an associated data input/output buffer means group.

21. The semiconductor memory device as recited in claim 19, wherein
  said plurality of data input/output buffer means are aligned in said prescribed region on each of said one side and said other side of said first region, and
  said plurality of power pads are arranged in said prescribed region so as to sandwich a corresponding data input/output buffer means group therebetween on each of said one side and said other side.

22. The semiconductor memory device as recited in claim 19, further comprising:
  a peripheral circuit for receiving an external signal controlling an access to said plurality of memory blocks and for controlling the access to said plurality of memory blocks in response to the received external signal; and
  a peripheral power pad arranged exclusively for said peripheral circuit in a portion between said one side and said other side in said prescribed region for receiving externally applied power source voltage and supplying the received power source voltage to said peripheral circuit.

23. The semiconductor memory device as recited in claim 19, wherein each of said plurality of power pads includes a power supply pad receiving an external power supply voltage for internal transmission, and a ground pad receiving an external ground potential for internal supply.

24. The semiconductor memory device as recited in claim 19, wherein each of said plurality of power pads is arranged between data input/output buffer means in each of said groups of data input/output buffer means.

25. The semiconductor memory device as recited in claim 19, wherein data input/output buffer means in each of said groups of data input/output buffer means are arranged on at least two lines in the first direction, and said power pads in each group of data input/output buffer means include power supply pads supplying a power supply voltage of said power source voltage arranged in alignment with data input/output buffer means on one line of said at least two lines, and ground pads supplying a ground voltage of said power source voltage arranged in alignment with data input/output buffer means on another line of said at least two lines.

26. The semiconductor memory device as recited in claim 19, wherein data input/output buffer means in each said group of data input/output buffer means are arranged on at least two lines, and said power source voltage comprises one power supply voltage and another power supply voltage and said plurality of power pads include a power supply pad receiving the one power supply voltage for internal transmission and a ground pad receiving the other power supply voltage for internal transmission arranged in each of said at least two lines.

27. The semiconductor memory device as recited in claim 19, wherein said plurality of power pads include power supply pads supplying one power supply voltage and ground pads supplying another power supply voltage, and said plurality of power pads are aligned with said plurality of data input/output buffer means, and at least one data input/output buffer means is inserted between a power supply pad and a ground pad.

28. The semiconductor memory device as recited in claim 22, wherein each of said plurality of power pads receives a power supply voltage of a first voltage level, and said peripheral power pad receives a power supply voltage of a second voltage level different from said first voltage level.

29. The semiconductor memory device as recited in claim 19, wherein said plurality of power pads each connect an interconnection line supplying a power source voltage separate from others.

30. The semiconductor memory device according to claim 29, further comprising:
  a power bus coupled to an external terminal receiving an externally applied power source voltage for internal transmission to the respective power pads and provided extending over said chip and at least one of said plurality of memory blocks.

31. The semiconductor memory device as recited in claim 20, wherein said plurality of data input/output buffer means are further grouped into subgroups of a predetermined number of data input/output buffer means in each of said groups, and each of said power pads connects an interconnection line supplying the power source voltage only to an associated subgroup of data input/output buffer means.

32. The semiconductor memory device according to claim 31, further comprising;

a power bus coupled to an external terminal receiving an externally applied power source voltage for internal transmission thereof to the respective power pads and provided extending over said chip and at least one of said plurality of memory blocks.

* * * * *